United States Patent
Robibero et al.

(10) Patent No.: US 11,078,047 B2
(45) Date of Patent: Aug. 3, 2021

(54) CONCEPTS FOR DETECTING A DETERIORATION STATE OF A LOAD BEARING CAPACITY IN A SUSPENSION MEMBER ARRANGEMENT FOR AN ELEVATOR

(71) Applicant: Inventio AG, Hergiswil (CH)

(72) Inventors: Vincent Robibero, Randolph, NJ (US); Kurt Heinz, Buchs (CH); Urs Lindegger, Ebikon (CH); Philippe Henneau, Zurich (CH)

(73) Assignee: INVENTIO AG, Hergiswil (CH)

( * ) Notice: Subject to any disclaimer, the term of this patent is extended or adjusted under 35 U.S.C. 154(b) by 468 days.

(21) Appl. No.: 15/748,288

(22) PCT Filed: Jul. 28, 2016

(86) PCT No.: PCT/EP2016/067966
§ 371 (c)(1),
(2) Date: Jan. 29, 2018

(87) PCT Pub. No.: WO2017/021263
PCT Pub. Date: Feb. 9, 2017

(65) Prior Publication Data
US 2018/0215585 A1 Aug. 2, 2018

Related U.S. Application Data

(63) Continuation-in-part of application No. 14/814,558, filed on Jul. 31, 2015, now Pat. No. 9,932,203.
(Continued)

(30) Foreign Application Priority Data

Feb. 11, 2016 (EP) ..................................... 16155357
Feb. 11, 2016 (EP) ..................................... 16155358
(Continued)

(51) Int. Cl.
*B66B 7/12* (2006.01)
*D07B 1/14* (2006.01)
(Continued)

(52) U.S. Cl.
CPC ............ *B66B 7/1223* (2013.01); *B66B 7/062* (2013.01); *B66B 7/085* (2013.01); *B66B 7/1215* (2013.01);
(Continued)

(58) Field of Classification Search
CPC ....... B66B 19/007; B66B 7/062; B66B 7/085; B66B 7/1215; B66B 7/1223; D07B 1/145;
(Continued)

(56) References Cited

U.S. PATENT DOCUMENTS

| 4,929,897 A | 5/1990 | Van Der Walt |
| 5,731,528 A | 3/1998 | Yamazaki et al. |

(Continued)

FOREIGN PATENT DOCUMENTS

| CN | 1290647 A | 4/2001 |
| CN | 101259930 A | 9/2008 |

(Continued)

OTHER PUBLICATIONS

Huaming Lei et al. "Health Monitoring for Coated Steel Belts in an Elevator System" Hindawi Publishing Corporation Journal of Sensors, vol. 2012, Article ID 750261, 5 pages.

*Primary Examiner* — Son T Le
*Assistant Examiner* — Adam S Clarke
(74) *Attorney, Agent, or Firm* — William J. Clemens; Shumaker, Loop & Kendrick, LLP

(57) ABSTRACT

Methods and devices detect a deterioration state of a load bearing capacity in an elevator suspension member arrangement having several suspension members, such as belts,
(Continued)

including electrically conductive cords incorporated into an elastomer material. Deterioration is determined by applying alternating electric voltages to the cords included in legs of a circuitry. Phase shifts between the alternating voltages, for example by determining sum voltages and/or differential voltages, provide valuable information about a condition of the belt. A fixation arrangement of the suspension member arrangement is adapted to enable or simplify the proposed measurements. Furthermore, counting a number of performed bending cycles provides further information to be taken into account for determining the current deterioration state of the belts. Overall, deteriorations in a suspension member such as broken cords, shunts between cords, connections between cords and ground potential and/or deterioration due to corrosion of cords may be easily detected.

14 Claims, 26 Drawing Sheets

Related U.S. Application Data

(60) Provisional application No. 62/199,375, filed on Jul. 31, 2015.

(30) Foreign Application Priority Data

Apr. 14, 2016 (EP) ..................................... 16165431
Apr. 28, 2016 (EP) ..................................... 16167403

(51) Int. Cl.
*B66B 7/08* (2006.01)
*B66B 19/00* (2006.01)
*G01R 31/08* (2020.01)
*B66B 7/06* (2006.01)
*G01M 5/00* (2006.01)
*G01N 27/20* (2006.01)

(52) U.S. Cl.
CPC ............ *B66B 19/007* (2013.01); *D07B 1/145* (2013.01); *G01M 5/0033* (2013.01); *G01M 5/0091* (2013.01); *G01N 27/20* (2013.01); *G01R 31/081* (2013.01); *D07B 2501/2007* (2013.01); *D10B 2401/16* (2013.01); *G01R 31/08* (2013.01)

(58) Field of Classification Search
CPC ....... D07B 2501/2007; D10B 2401/16; G01M 5/0033; G01M 5/0091; G01N 27/20; G01R 31/08; G01R 31/081
See application file for complete search history.

(56) References Cited

U.S. PATENT DOCUMENTS

| | | | |
|---|---|---|---|
| 5,926,001 A * | 7/1999 | Eguchi | .................. G01B 7/144 318/647 |
| 6,040,779 A | 3/2000 | Pfaff et al. | |
| 6,422,088 B1 | 7/2002 | Oba et al. | |
| 6,653,943 B2 | 11/2003 | Lamb et al. | |
| 6,828,771 B1 | 12/2004 | Ghassemi | |
| 7,123,030 B2 | 10/2006 | Robar et al. | |
| 8,011,479 B2 | 9/2011 | Stucky et al. | |
| 8,424,653 B2 | 4/2013 | Stucky et al. | |
| 8,686,747 B2 | 4/2014 | Berner et al. | |
| 8,813,918 B2 | 8/2014 | Kocher et al. | |
| 9,932,203 B2 | 4/2018 | Robibero | |
| 2002/0194935 A1 | 12/2002 | Clarke et al. | |
| 2003/0121729 A1 | 7/2003 | Heinz et al. | |
| 2008/0223668 A1 | 9/2008 | Stucky et al. | |
| 2008/0282512 A1 | 11/2008 | Ach | |
| 2011/0253487 A1 | 10/2011 | Kocher et al. | |
| 2011/0284331 A1 | 11/2011 | Stucky et al. | |
| 2013/0207668 A1 | 8/2013 | Fargo et al. | |
| 2015/0129367 A1* | 5/2015 | Tyni | .......................... B66B 3/00 187/393 |
| 2015/0362450 A1* | 12/2015 | Lehtinen | ................. G01N 27/20 187/391 |
| 2016/0002006 A1* | 1/2016 | Sun | ........................... B66B 9/00 187/254 |

FOREIGN PATENT DOCUMENTS

| | | |
|---|---|---|
| CN | 101456509 A | 6/2009 |
| CN | 103068711 A | 4/2013 |
| CN | 103910267 A | 7/2014 |
| DE | 197085818 A1 | 10/1998 |
| EP | 1087219 A2 | 3/2001 |
| EP | 1730066 B1 | 10/2010 |
| EP | 1732837 B1 | 4/2011 |
| EP | 3124425 A1 | 2/2017 |
| EP | 3124986 A1 | 2/2017 |
| JP | S54107038 A | 8/1979 |
| JP | H0891734 A | 4/1996 |
| WO | 2005095250 A1 | 10/2005 |
| WO | 2010007112 A1 | 1/2010 |
| WO | 2011098847 A1 | 8/2011 |
| WO | 2013119203 A1 | 8/2013 |
| WO | 2013135285 A1 | 9/2013 |
| WO | 2014083043 A1 | 6/2014 |
| WO | 2014130028 A1 | 8/2014 |
| WO | 2014130029 A1 | 8/2014 |

* cited by examiner

Figures of concept 1

Figures of concept 3

Figures of concept 4

Figures of concept 5

CONCEPTS FOR DETECTING A DETERIORATION STATE OF A LOAD BEARING CAPACITY IN A SUSPENSION MEMBER ARRANGEMENT FOR AN ELEVATOR

CROSS-REFERENCE TO RELATED APPLICATIONS

The present application relates to various concepts applicable upon detecting a deterioration state of a load bearing capacity in a suspension member arrangement for an elevator. The concepts I to V were disclosed in several prior patent applications comprising U.S. 62/199,375 filed on Jul. 31, 2015 (applicants file number IP2244US), U.S. Ser. No. 14/814,558 filed on Jul. 31, 2015 (applicants file number IP2244US1), EP 16155357 A1 filed on Feb. 11, 2016 (applicants file number IP2289EP), EP 16155358 A1 filed on Feb. 11, 2016 (applicants file number IP2290EP), EP 16165431 filed on Apr. 14, 2016 (applicants file number IP2319EP), and EP 16167403 filed on Apr. 28, 2016 (applicants file number IP2324EP).

The present application claims the priorities of all these prior patent applications. Furthermore, the content of all these prior patent applications shall be incorporated in its entirety in the present application by reference.

FIELD

The various concepts and the approaches described with respect thereto interrelate with each other in that they all relate to detecting a deterioration state of a load bearing capacity in a suspension member arrangement for an elevator. Specifically, concept 1 may be seen as defining basic ideas of an inventive method and device. Concepts 2, 3 and 5 may be seen as defining further developments of such idea. And concept 4 may help in implementing such idea e.g. upon modernizing an elevator.

It shall be noted that ideas explained herein with reference to the further developed methods and devices of each of concepts 2, 3 and 5 may be combined and/or adapted to the basic principles and embodiments described in concept 1, and vice versa. Furthermore, specific features described for the elevator to be modernized or being modernized in accordance with the ideas of concept 4 in order to adapt it to an implementation of an embodiment of the described methods may also be included in the methods and devices of one or more of concepts 2, 3 and 5, and vice versa.

In other words, concept 1 may be seen as building the abstract technological foundation, which may be concretized by the teachings of concept 2 and 3. Further, special applications of the fundamental technological concept may found in combining any or all of concepts 1 to 3 with any or all of concepts 4 and 5. Likewise, special applications starting from concepts 4 and/or 5 may be implemented by combination with any or all of concepts 1 to 3. Accordingly, the combination of any subset of concepts or all concepts is specifically disclosed in this document.

CONCEPT I

Method and Device for Detecting a Deterioration State of a Load Bearing Capacity in a Suspension Member Arrangement for an Elevator

FIELD

The present invention according to concept 1 relates to a method and to a device for detecting a deterioration state of a load bearing capacity in a suspension member arrangement for an elevator.

BACKGROUND

Elevators typically comprise a cabin and, optionally, a counterweight which may be displaced for example within an elevator shaft to different levels in order to transport persons or items for example to various floors within a building. In a common type of elevator, the cabin and/or the counterweight are supported by a suspension member arrangement comprising one or more suspension members. A suspension member may be a member which may carry heavy loads in a tension direction and which may be bent in a direction transverse to the tension direction. For example, a suspension member may be a rope or a belt. Typically, suspension members comprise a plurality of cords. The cords may be made for example with a metal such as steel.

During operation of the elevator, suspension members have to carry high loads and are typically repeatedly bent when running along for example a traction sheave, a deflection sheave or other types of sheaves. Accordingly, substantial stress is applied to the suspension member arrangement during operation.

However, as elevators may typically be used by people for transportation along very significant heights, very high security requirements have to be fulfilled. For example, it has to be safeguarded that the suspension member arrangement can always guarantee safe support of the cabin and/or the counterweight. For such purposes, safety regulations rule that any substantial deterioration of an initial load bearing capacity of a suspension member arrangement can be detected such that for example counter-measures such as replacing a faulty suspension member from the suspension member arrangement may be initiated.

Generally, a load bearing capacity of a suspension member may be specified when designing the suspension member and may then be physically tested upon completion of the fabrication of the suspension member. Physical tests may comprise for example tensile loading of the suspension member and measuring the suspension member's reaction to an application of high tensile forces.

However, during actual operation of the elevator, it may be difficult or even impossible to perform such physical tests. With conventional steel ropes serving as suspension members, visual checking of a rope condition has been possible. However, in modern suspension members, load bearing cords are typically enclosed in a coating or matrix and are therefore not visible from outside. Therefore, alternative approaches for determining a load bearing capacity in a suspension member arrangement or determining parameters related thereto have been developed.

For example, elevator load bearing member wear and failure detection has been described in EP 1 730 066 B1. A method and apparatus for detecting elevator rope degradation using electrical resistance is described in U.S. Pat. No. 7,123,030 B2. Electrical signal application strategies for monitoring a condition of an elevator load bearing member are described in US 2011/0284331 A1 and U.S. Pat. No. 8,424,653 B2. Electrical signal application strategies for monitoring a condition of an elevator load bearing member are described in US 2008/0223668 A1 and U.S. Pat. No. 8,011,479 B2. A simplified resistance based belt type suspension inspection is disclosed in US 2013/0207668 A1. An elevator system belt type suspension having connecting devices attached thereto is described in WO 2011/098847 A1. A method for detection of wear or failure in a load bearing member of an elevator is described in WO 2013/135285 A1. Electrical signal application strategies for monitoring a condition of an elevator load bearing member are described in EP 1 732 837 B 1. "Health Monitoring for Coated Steel Belts in an Elevator System" have been described in a research article of Huaming Lei et al. in the Journal of Sensors, Volume 2012, Article ID 750261, 5 pages, doi: 10.1155/2012/750261.

There may be a need for an alternative method and device for detecting a deterioration state of a load bearing capacity in a suspension member arrangement for an elevator. Particularly, there may be a need for such method and device which enable fulfilling high safety requirements, simple implementation and/or low cost.

SUMMARY

Such needs may be met with the subject-matter of approaches of concept 1 defined hereinafter and the beneficial embodiments defined in the following specification.

A first aspect of the present invention of concept 1 relates to a method for detecting a deterioration state of a load bearing capacity in a suspension member arrangement for an elevator, the suspension member arrangement comprising at least one suspension member having a plurality of electrically conductive cords. These cords may be electrically isolated from each other. The method comprises the following steps: a multi-phase alternating current circuitry including multiple electrically conductive legs is provided. At least one phase of a multi-phase alternating current is applied to at least one of the cords of the suspension member by being electrically connected to one of the legs of the multi-phase alternating current circuitry. At least one other phase of the multi-phase alternating current is applied to another at least one cord of the suspension member and/or to at least one separate resistor, wherein the cord and/or the resistor is electrically connected to at least one other leg of the multi-phase alternating current circuitry. Therein, in the multi-phase alternating current, a peak current in each phase is shifted by a phase angle with respect to a peak current in another phase, such shifting phase angle being e.g. 180°, 120°, 90° or more generally 360°/n (with n being the number of phases). In such arrangement, an electric current being named herein as "indicator current" and being a net sum of all phases of the multi-phase alternating current and/or an electric bypass current through a neutral wire being connected in parallel to the multi-phase alternating current circuitry, is measured. Based on such measured electric indicator current, the deterioration state is finally determined.

Without restricting the scope of the invention of concept 1 in any way, ideas underlying embodiments of the invention of concept 1 may be understood as being based, inter alia, on the following recognitions and observations:

In conventional approaches for detecting a deterioration state of a load bearing capacity in a suspension member arrangement such as those approaches indicated in the above introductory portion, electrical characteristics of cords included in a suspension member have been taken as indicators for changes in the deterioration state. Generally, electrical resistances within the cords have been measured and it has been assumed that an increase of such electrical resistances indicates a deterioration of the load bearing capacity of the suspension member.

However, such electrical resistance measurements, or alternatively impedance measurements, may require substantial efforts in terms of, e.g., measuring devices, measurement analyzing devices, circuitry, etc. For example, electrical resistances have to be included, measured and compared within circuitry comprising cords of a suspension member in order to thereby enable quantitative measurements of the electrical resistance or impedance of the cords.

The inventors of the present invention have found that measuring electrical resistance/conductivity of cords, particularly measuring quantitatively such characteristics, is not necessary in order to obtain sufficient information about a deterioration state of a load bearing capacity in a suspension member to ensure safe operation of an elevator.

As an alternative approach to conventional methods and devices, it is therefore proposed to not necessarily measure any electrical resistance, resistivity or impedance within conductive cords of a suspension member directly but to provide for a method which allows for deriving sufficient information about a deterioration state by measuring one or more electric currents which at least relate to electric currents flowing through cords of the suspension member.

In such alternative approach, electrical resistances, resistivities or impedances do neither have to be known quantitatively on an absolute scale nor in a relative manner. Instead, it may be sufficient to simply measure an electric current, particularly a time-dependent change in such electric current, without having any detailed knowledge about actual resistances, resistivities and/or impedances through the cords of the suspension member.

Briefly summarized and expressed in a simpler wording than in the claims, but without restricting the scope of the claims, an idea underlying the inventive method of concept 1 may be briefly summarized as follows: One or more of the cords of a suspension member may be made part of a multi-phase alternating current circuitry by connecting it preferably in series with at least one of the legs of such multi-phase alternating current circuitry. Accordingly, at least one phase of a multi-phase alternating current is directed through this leg (or these legs) and therefore flows through the respective cord(s). One or more other phases of the same multi-phase alternating current are either directed through other cords of the same or other suspension members of the suspension member arrangement or are directed through one or more separate resistors by connecting these other cords or separate resistors electrically to at least one other leg of the multi-phase alternating current circuitry. Therein, the term "resistor" may be interpreted as representing any type of electrical load including for example load with electrical impedance. In other words, at least one of the phases of the multi-phase alternating current flows through a portion of the suspension member arrangement by being applied to at least one of its cords whereas at least one other phase may also flow through cords of the suspension member arrangement or may be directed through separate resistors. In such multi-phase arrangement, the phases of the multi-phase alternating current flow through the various legs of the multi-phase alternating current circuitry with a specific phase relationship. Generally, physical characteristics of the suspension member directly result in changes in its electrical characteristics, i.e. changes in electro-physical characteristics of e.g. cords in the suspension member may result from e.g. a change in the diameter of the cords, from any shorts or shunts, from breaks, etc. In case physical characteristics of the suspension member and electrical characteristics relating to such physical characteristics change over time, the phase relationship in a multi-phase alternating current will generally change. The change in such phase relationship may be measured relatively easily. In one approach, such phase relationship change may be determined by measuring an electric indicator current resulting as a net sum of all phases of the multi-phase alternating current. Such net sum directly depends on the phase relationship between the various phases such that changes in the net sum electric current allow deriving information about the electrical characteristics and therefore the deterioration state of the load bearing capacity of the suspension member arrangement. Alternatively, to measuring the net sum of all phases of the multi-phase alternating current, an electrical bypass current through a neutral wire being connected in parallel to the multi-phase alternating current circuitry may be measured. Such bypass current through the neutral wire directly depends on the various phase currents flowing through the legs of the multi-phase alternating current circuitry. Therefore, a change in such bypass current may also enable deriving information about the electrical characteristics and therefore the deterioration state of the load bearing capacity in the suspension member arrangement. All these measurements do not require any direct or indirect measuring of resistances within the cords of a suspension member but it may be sufficient to measure an electric indicator current only.

Particularly, according to an embodiment, the deterioration state may be determined based on a deviation of the measured electric indicator current from a reference current value.

For example, an initial value of the measured indicator current may be determined upon installation of the suspension member arrangement in the elevator in a non-deteriorated state and such initial value can be taken as the reference current value. Alternatively, such reference current value may be determined based on other measurements, calculations and/or assumptions. During the operation of the elevator, the same or a corresponding indicator current may be measured with the multi-phase alternating current circuitry described herein. In case such subsequently measured indicator electric current substantially deviates from the reference current value, this may be taken as indicating a substantial deterioration in the load bearing capacity of the suspension member.

Particularly, according to an embodiment, a critical deterioration state may be detected upon the measured electric indicator current deviating from the reference current value by more than a predetermined difference value.

In other words, a specific difference value may be predetermined. For example, physical tests may be made in order to obtain information on how electrical characteristics of cords in a suspension member change upon physical stress and current values may be determined based on such physical tests. From such preceding experiments, the predetermined difference value may be derived such that, in later normal operation of the elevator, the electric indicator current being the indicator for the deterioration state may be repeatedly or continuously measured and a critical deterioration state may be assumed as soon as changes in this measured indicator current exceed the predetermined difference value. Upon detecting such critical deterioration state, counter-measures such as for example replacing the respective suspension member may be initiated.

According to an embodiment, the electric current is measured using a measuring arrangement comprising a measuring device for contactless measuring of an electrical current in a conductor arrangement.

One possible option for contactless measuring of an electrical current is based on induction. Every electrical current in a conductor arrangement creates a magnetic field and changes in the current result in variations in the magnetic field which may then be used for inductively coupling the conductor arrangement in which the electrical current to be measured flows with a conductor arrangement of the measuring device. Contactless measuring of an electrical current enables a very simple measurement. For example, no direct physical connection needs to exist between the measuring device and the conductor arrangement. Instead, the measuring device may be arranged slightly spaced apart from the conductor arrangement in which the electrical current to be measured flows and/or may be electrically isolated therefrom.

In a specific embodiment, the electrical current may be measured using measuring device being a current transformer or a Hall effect current sensor. Both, the current transformer and the Hall effect current sensor may measure the electric current in a conductor arrangement without physical contact. For example, a secondary winding of a current transformer may be arranged adjacent to the, or surrounding the conductor arrangement in which the electrical current to be measured flows such that changes in the electrical current induce an electrical current within the secondary winding. Accordingly, the electrical current in the conductor arrangement may be measured by measuring the current in the secondary winding and thus without having direct electric contact to the conductor arrangement.

According to an embodiment, the measuring device, i.e. the current transformer (CT) or the Hall effect current sensor, is arranged at the multi-phase alternating current circuitry or at the neutral wire connected in parallel to such circuitry. In this context, "arranged" shall mean that the measuring device is arranged close enough to the multi-phase alternating current circuitry or at the neutral wire such that the indicator current flowing through one of these components may be measured without contact by e.g. inductive coupling.

For example, a ring forming the secondary winding of the current transformer may enclose all legs of the multi-phase alternating current circuitry such that the net sum of all phases of the multi-phase alternating current transmitted through this circuitry may be measured. In such arrangement, a single secondary winding arrangement may enclose all legs of the multi-phase alternating current circuitry. Alternatively, the secondary winding arrangement of the current transformer may comprise several separate sub-winding arrangements, each sub-winding arrangement enclosing one of the legs of the multi-phase alternating current circuitry.

Alternatively, a secondary winding of the current transformer may enclose the neutral wire. As a current is induced in this neutral wire upon any changes in the phase relationship between phases of the multi-phase alternating current flowing through the various legs of the multi-phase alternating current circuitry, arranging the current transformer at the neutral wire by for example enclosing the neutral wire with the secondary winding of the CT may enable measuring an electric indicator current which is indicating any changes in the phase relationships in the multi-phase alternating current circuitry.

According to an embodiment, the multi-phase alternating current circuitry is provided in a Wye-configuration. Such Wye-configuration is sometimes also referred to as Y-configuration or star-configuration.

A Wye-configuration for the multi-phase alternating current circuitry may be beneficial as it may provide for common neutral points on a supply side and on a load side of the multi-phase alternating current circuitry such that a neutral wire may be provided by connecting to these neutral points. At such neutral wire, the electric indicator current may be measured particularly easily.

However, it is to be noted that three-phase alternating current circuitry may be configured in either, a Wye-configuration or a delta-configuration (Δ-configuration) and that. Any Wye-configuration may be reconfigured to result in a delta-configuration, and vice versa. It is also to be noted that multi-phase alternating circuits may be arranged with any number of phase circuit legs or branches, where electrical power is applied to each phase circuit branch and where the alternating voltage applied across each phase circuit branch may also have a phase-angle that differs between them at any moment in time.

According to an embodiment, the neutral wire is connected between common points of a supply side of the multi-phase alternating current circuitry and a load side of the multi-phase alternating current circuitry, respectively. In a neutral wire connected to such common points at the supply side and at the load side, an electric current flowing through the neutral wire will vary upon any change of a phase relationship of multiple phases of currents flowing through the various legs of the multi-phase alternating current circuitry. In multi-phase power generation systems, current flowing between the neutral point of the multi-phase power source and the neutral point of the electrical loads of each phase is commonly called the unbalanced load current.

According to an embodiment, each of the phases of the multi-phase alternating current is applied to at least one of the cords of the suspension member.

In other words, preferably none of the phases of the multi-phase alternating current is directed through a separate resistor only, this separate resistor not forming part of the suspension member. Instead, it may be preferable to transfer each of the phases of the multi-phase alternating current at least partially to one of the cords of the one or more suspension members of suspension member arrangement.

Accordingly, in such arrangement, for example temperature variations resulting in varying electrical characteristics of the cords may not significantly alter the phase relationship of the various phases of the multi-phase alternating current through the legs of the multi-phase alternating current circuitry as each cord, and therefore each of the legs, is subject to substantially the same temperature variations such that electrical characteristics will change in a same manner in all legs and will therefore at least partially be compensated.

According to an embodiment, in an initial state before deterioration, electrical resistances within each of the legs of the multi-phase alternating current circuitry are adapted to be substantially equal.

In other words, the multi-phase alternating current circuitry and, particularly, the way in that cords of the suspension member(s) are included in such circuitry may be designed such that substantially equal electrical resistances are included in each of the legs of the multi-phase alternating current circuitry. Due to such equal resistances, initially, a balanced current distribution throughout the legs of the multi-phase alternating current circuitry may be obtained.

In case, for example, electrical resistances provided by an inclusion of one or more conductive cords of the suspension member(s) into one or more of the legs of the multi-phase alternating current circuitry significantly differ between the various legs of the circuitry, additional separate resistors may be included in one or each of the legs in order to specifically adapt a total resistance throughout the one or each of the legs.

Therein, it may be sufficient to choose such additional resistors such that the total resistance throughout each of the legs of the circuitry is substantially equal. It may be emphasized that it is not necessarily required to know absolute values of the resistances of such additional resistors but it may be sufficient to adapt the addition of such resistors such that the phases of the multi-phase alternating current are applied to the cords, or to the legs comprising the cords, respectively, in an evenly distributed manner.

With such an initial state and phases of the multi-phase alternating current being distributed evenly throughout the various legs of the multi-phase alternating current circuitry, an initial configuration may be obtained in which the net sum current of all phases of the multi-phase alternating current as well as a potential electric bypass current through a neutral wire will be substantially zero. Accordingly, when repeatedly measuring one of these indicator currents during subsequent operation of the elevator, any deviation of the indicator current value from such initial zero value may easily indicate a change in the phase relationship between the phases throughout the legs of the circuitry and therefore a change in the deterioration state of the suspension member arrangement.

According to an embodiment, several cords of the suspension member are connected in a parallel arrangement and/or in a series arrangement or a combination of the two. In other words, several cords of a same suspension member, or between cords of different suspension members, may be connected in parallel with each other, may be connected in series to each other or some cords are connected in series to each other and some of such series connection are connected in parallel to each other. Each of the parallel or series arrangements or combinations thereof may have its own advantages, as described in further detail below.

According to a further embodiment, the suspension member arrangement comprises a plurality of suspension members and cords of one suspension member are connected in a parallel arrangement and/or in a series arrangement to cords of another suspension member. Again, both, the parallel arrangement and the series arrangement or a combination thereof may have its own specific advantages as described in further detail below.

According to an embodiment, the phases of the multi-phase alternating current are supplied with an even phase offset from each other. For example, the multi-phase alternating current may comprise two phases offset from each other by 180°. In another example, the multi-phase alternating current may comprise three phases offset from each other by 120°. An even offset between the phases of the multi-phase alternating current may contribute to a balanced current distribution throughout the legs of the multi-phase alternating current circuitry.

According to a second aspect of the present invention of concept 1, a device for detecting a deterioration state of a load bearing capacity in a suspension member arrangement for an elevator is described. The suspension member arrangement may be configured as described above with respect to the first aspect of the invention of concept 1. The device is configured to perform a method according to an embodiment as described above with respect to the first aspect of the invention of concept 1.

According to an embodiment, the device comprises a multi-phase alternating current circuitry, a connector arrangement, a measuring arrangement and a determination arrangement. The multi-phase alternating current circuitry comprises multiple legs. Each leg comprises an alternating current voltage supply such as to apply each of multiple phases of a multi-phase alternating current to one of the legs. The connector arrangement is adapted for electrically connecting the multi-phase alternating current circuitry to the suspension member such that at least one phase of the multi-phase alternating current is applied to at least one of the cords of the suspension member and such that at least one other phase of the multi-phase alternating current is applied to another at least one cord of the same or another suspension member and/or to one or more separate resistors. The measuring arrangement is configured for measuring an electric indicator current being a net sum of all phases of the multi-phase alternating current and/or an electric bypass current through a neutral wire being connected in parallel to the multi-phase alternating current circuitry. The determination arrangement is adapted for determining the deterioration state based on the measured electric indicator current.

According to an embodiment, the measuring arrangement may comprise a measuring device for contactless measuring of an electric current in a conductor arrangement. For example, such measuring device may be a current transformer or a Hall effect current sensor. Particularly, the measuring device may be adapted for measuring the electrical indicator current within the multi-phase alternating current circuitry and/or its neutral wire inductively.

A further aspect of the present invention of concept 1 relates to an elevator comprising a device as described according to an embodiment of the above-described second aspect of the invention of concept 1.

It shall be noted that possible features and advantages of embodiments of the invention are described herein partly with respect to a method for detecting a deterioration state in a load bearing capacity of a suspension member and partly with respect to a device which is adapted for performing or controlling such method in an elevator. One skilled in the art will recognize that the features may be suitably transferred from one embodiment to another, i.e. from the method to the device or vice versa, and features may be modified, adapted, combined and/or replaced, etc. in order to come to further embodiments of the invention.

In the following, advantageous embodiments of the invention of concept 1 will be described with reference to the enclosed drawings of concept 1. However, neither the drawings nor the description shall be interpreted as limiting the invention.

The figures are only schematic representations and are not to scale. Same reference signs refer to same or similar features throughout the figures.

DETAILED DESCRIPTION

Figure 1:
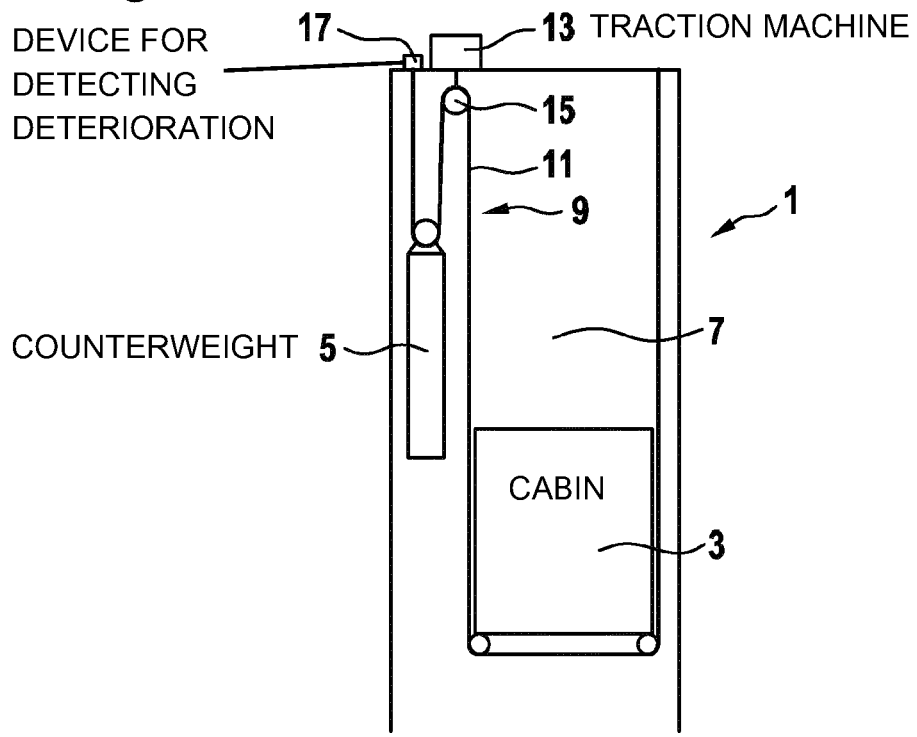
FIG. 1 shows an elevator in which a method and device according to an embodiment of the invention may be applied.

FIG. 1 shows an elevator 1 in which the method and/or device according to embodiments of the present invention may be implemented.

The elevator 1 comprises a cabin 3 and a counterweight 5 which may be displaced vertically within an elevator shaft 7. The cabin 3 and the counterweight 5 are suspended by a suspension member arrangement 9. This suspension member arrangement 9 comprises one or more suspension members 11. Such suspension members 11 may be for example ropes, belts, etc. In the arrangement shown in FIG. 1, end portions of the suspension members 11 are fixed to a supporting structure of the elevator 1 at a top of the elevator shaft 7. The suspension members 11 may be displaced using an elevator traction machine 13 driving a traction sheave 15. For example, at one end portion of the suspension member arrangement 9, a device 17 for detecting a deterioration state of a load bearing capacity in the suspension member arrangement 9 may be provided.

It may be noted that the elevator 1 and particularly its suspension member(s) 11 and its device 17 for detecting the deterioration may be configured and arranged in various other ways than those shown in FIG. 1.

Suspension members 11 to be driven for example by the traction machine 13 may utilize metal cords or ropes to support a suspended load such as the cabin 3 and/or the counterweight that is moved by the machine 13.

Figure 2:
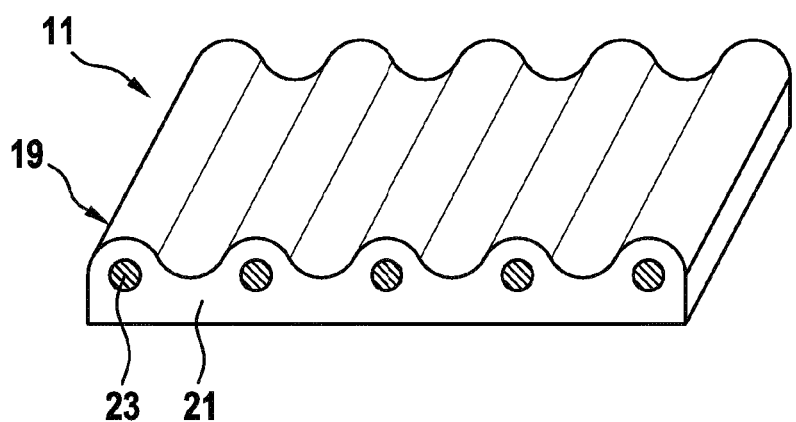
FIG. 2 shows a suspension member.

FIG. 2 shows an example of a suspension member 11 which is embodied with a belt 19. The belt 19 comprises a plurality of cords 23 which are arranged parallel and spaced to each other. The cords 23 are enclosed in a matrix material 21 forming, inter alia, a coating. The cords 23 may typically consist of or comprise metal such as steel. The matrix material 21 may typically consist of or comprises a plastic or elastomeric material. Accordingly, the cords 23 are typically electrically conductive such that an electric current can be fed through the cords without significant losses. Furthermore, the cords are preferably electrically isolated from each other via the interposed matrix material 21 which is electrically insulating such that an electrical current between neighbouring cords cannot be transmitted, i.e. no significant shunt current can flow from one cord to another.

Alternatively, suspension members 11 may have other shapes or configuration. For example, a belt may have several cords included into a body formed of matrix material, the body being non-profiled (i.e. flat) or having other shapes as those shown in FIG. 2. Alternatively, each cord may be enclosed by matrix material forming a kind of coating wherein the coated cords are separate from each other, i.e. not connected to each other via common matrix material. Generally, the suspension members 11 may be provided as coated steel suspension members.

Typically, wires or cords of the suspension member 11 have a specified minimum strength to ensure an integrity of the suspension member arrangement 9 during its use in an application within an elevator 1. In certain suspension applications, such as for lifts or elevators, a factor-of-safety requirement for strength combined with other measures, such as protective coating of the cords 23 for example within the matrix material 21, may sustain an initial strength of a suspension member beyond an effective life of the protective measures employed to retain strength.

Particularly in such cases, where the initial strength of the suspension member 11 is not expected to change during its useful life in an application, a simple electronic method may be employed and may be sufficient to detect an indication that for example initial physical properties of the suspension members have unexpectedly changed and trigger for example a replacement of the suspension member 11.

PRIOR ART APPROACHES

In prior art, methods have been employed to ensure that suspension members do not fall below a specified minimum strength, such methods involving for example visually counting of broken wires of cords or wire rope strands over a length of the suspension members. Alternatively, complex electronic methods that measure small changes in an electrical resistance of for example metal cords and compare such measurements with reference values or a rate of change in resistance have been proposed.

Although such methods may be effective, they may have certain disadvantages. For example, counting broken wires may be a tedious task periodically performed by persons maintaining the suspension members of an elevator and may be flawed by human error. In cases where suspension members have an opaque coating on the metal cords or the metal cords are incorporated into a matrix material, it is generally not possible to visually count broken wires. Where methods employ monitoring a change in electrical resistance or impedance of metal cords, the measurements are generally made across electrical connections to the steel cords and may introduce, by nature of such electrical connections, a significant source of possible errors due to for example very low electrical values of resistances being monitored. Furthermore, over time, such electrical connections may deteriorate due to effects of e.g. oxidation and/or contamination and may increase a potential for errors by the monitoring method. Additionally, such methods typically involve complex circuits necessary for measuring the very small changes in resistance or impedance and comparing them for example to target reference resistance values that may drift over time or due to effects of temperature. Furthermore, some prior art approaches may require extensive correlation to map a change in resistance or impedance of the steel cords with changes in a strength and/or physical deterioration of the steel cord.

New Approach

Accordingly, there may be a need for a less complex and/or more effective monitoring method for detecting a deterioration in suspension members, particularly, in case these suspension members are expected to retain their initial strength over the life of their application.

As described herein, a simple and reliable method may be achieved using a multi-phase current monitoring of e.g. steel cords in a suspension member where only a significant change in initial physical conditions of the cords need to be monitored. Such method may also be useful for monitoring one or more physical properties related to both the strength of the cords and the electrical conductivity of the cords, such as the cords cross sectional area, and/or with correlated data, if available.

In other words, an aim of embodiments of this invention may be to provide a novel and improved method for monitoring physical characteristics of e.g. electrically conductive steel cords in a suspension member in order to thereby detect a deterioration state of a load bearing capacity of the suspension member. Based on such monitoring, a suspension member may be replaced or retired when an allowable deterioration is exceeded. In such monitoring or detecting procedure, electronic measurements are performed that are related to electro-physical characteristics of cords comprised in a suspension member arrangement.

Ideas underlying embodiments of the invention may provide for various advantages or characteristics. For example, such ideas do not necessarily require correlation of physical changes in the cords with electronic measurements to establish target values to retire a suspension member. Furthermore, no elaborate signals are necessarily required to be transmitted and monitored at physical connections to the cords. Retirement criteria for the suspension members may be based on a change in an initial electronic measurement for example of a net sum of a multi-phase current applied to the cord circuit arrangement of the suspension member. All initial electrical conditions established with the power applied to the cords, and related electrical loads in both circuits may be taken into account. Measurements of a net sum of the multi-phase alternating current in the multi-phase alternating current circuitry comprising cords of the suspension members in at least one of its legs may be sensed for example without direct electrical connection, for example by using a current transformer that is located with a monitoring electronics and/or a processor. The method may take benefit of characteristics of the multi-phase alternating current circuitry comprised therein, such multi-phase alternating current circuitry enabling compensation of changes in temperature for example. Furthermore, a correlation between electro-physical characteristics of cords of the suspension members and the electronic measurement applied in the detection method according to embodiments of the present invention may also be used to discern gradual or incremental physical changes in the cords of the suspension members to trigger action for preparation and eventual retirement of the suspension members.

Following hereto, possible details and features of the method and the device according to embodiments of the present invention will be given.

Multi-Phase Alternating Current Circuitry

The multi-phase alternating current circuitry includes multiple electrically conductive legs. The circuitry comprises a source side with voltage sources and a load side with resistances and/or impedances. As used herein, "alternating current" shall mean a non-constant current, i.e. a current strength or amperage varies over time. Particularly, the current may vary periodically and, more particularly, may periodically reverse its direction. Furthermore, "multi" shall mean "at least two". I.e. the circuitry may comprise 2, 3, 4 or more electrically conductive legs. A "leg" may comprise an electrically conductive line or conductor connecting the source side of the circuitry with the load side thereof. Furthermore, a leg may comprise one or more electrical devices, particularly resistances or impedances, included in series with the line or conductor.

The multi-phase alternating current circuitry may be adapted such that multiple phases of a multi-phase alternating current may be directed through each of the legs of the multi-phase alternating current circuitry. For such purpose, the circuitry generally comprises multiple voltage sources, one voltage source being comprised in each of the legs and being adapted to apply an alternating voltage to an electrically conductive line within the respective leg. Furthermore, the circuitry generally comprises electrical resistances which may be generated by the resistivity of the electrically conductive line itself and/or by resistors comprised in the respective leg.

Figure 3:
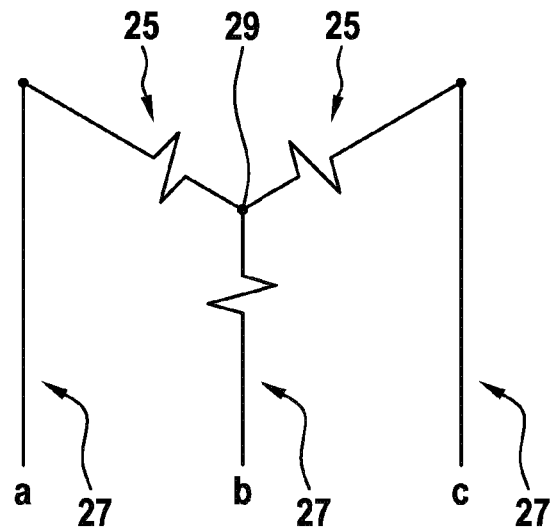
FIG. 3 shows a Wye-configuration of a circuitry.
Figure 4:
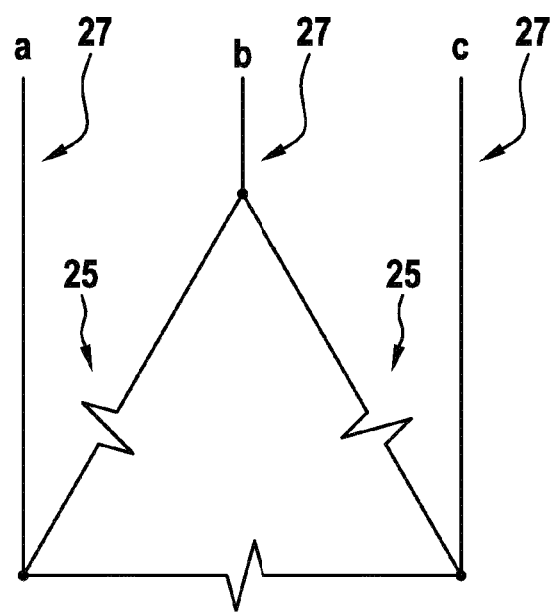
FIG. 4 shows a Delta-configuration of a circuitry.

FIG. 3 shows schematically a Wye-configuration of a portion of a multi-phase alternating current circuitry. FIG. 4 shows a Delta-configuration. The configurations include electrical components 25. Such components 25 may be various electrical elements, depending for example on whether the circuit configuration shall be a source or a load. For example, in a source, the components 25 may be voltage sources. In a load, the components 25 may be electrical resistors. In the Wye-configuration, multiple electrical components 25 are connected such that one side of each of the electrical components 25 of the Wye-configuration is connected to a common point 29 whereas an opposite side of the electrical component 25 is connected to one of the lines a, b, c forming legs 27 of the circuitry. In the Delta-configuration, the electrical components 25 are connected serially in a ring-like manner and each of the lines a, b, c forming the legs 27 of the circuitry is connected in between of two neighbouring electrical components 25.

It shall be noted that, while embodiments of the invention are described herein with reference to an example having three phases, i.e. being implemented with a three-phase alternating current circuitry, other numbers of phases such as for example two phases, four phases or more phases may be applied when implementing embodiments of the invention.

Figure 5:
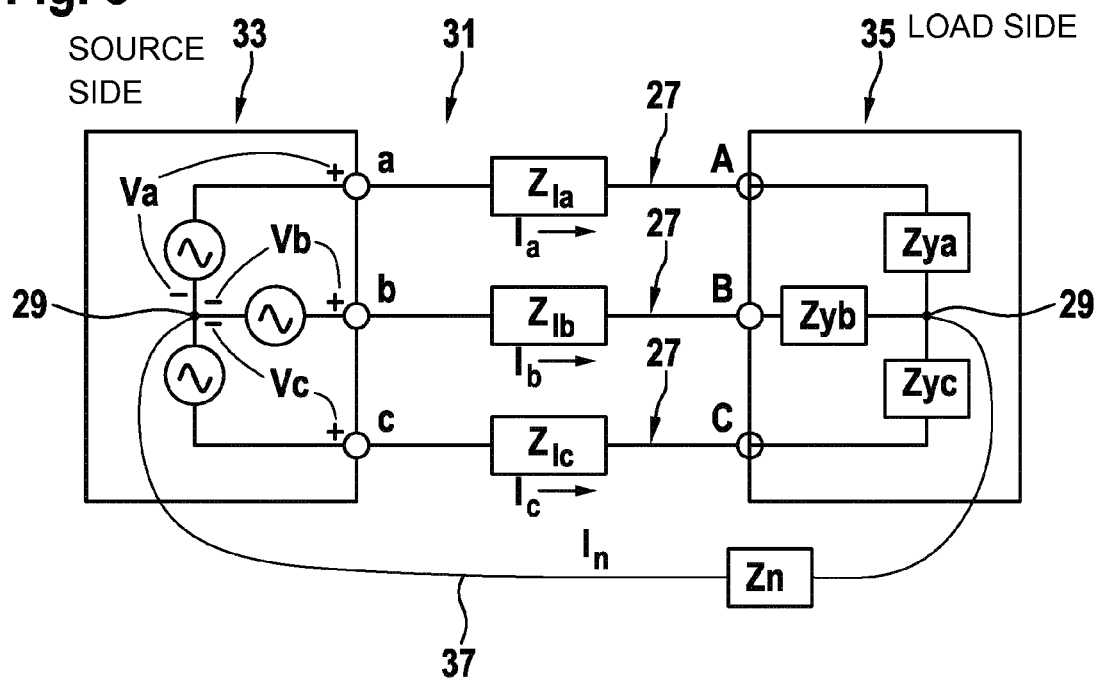
FIG. 5 shows an example of a multi-phase alternating current circuitry.

FIG. 5 shows an example of a multi-phase alternating current circuitry 31 comprising three electrically conductive legs 27 wherein both, a source side 33 and a load side 35 are configured in a Wye-configuration. Alternating voltage sources Va, Vb, Vc are provided in a Wye-configuration at the source side 33. Resistors Zya, Zyb, Zyc are provided in a Wye-configuration at the load side 35. Both Wye-configurations have a neutral point 29 at which the voltage sources Va, Vb, Vc or the resistors Zya, Zyb, Zyc, respectively, are all interconnected. The alternating voltage sources Va, Vb, Vc are connected via the lines a, b, c forming the legs 27 to associated ones of the resistors Zya, Zyb, Zyc. Accordingly, current phases $I_a$, $I_b$, $I_c$ of a multi-phase alternating current may be applied to each line a, b, c of the legs 27.

Furthermore, in the exemplary multi-phase alternating current circuitry 31 of FIG. 5, a neutral wire 37 is connected to each of the neutral points 29 at the Wye-configuration at the source side 33 and the Wye-configuration at the load side 35. In other words, the neutral wire 37 is connected between the common points 29 of the supply side and the load side of the multi-phase alternating current circuitry, respectively. The neutral wire 37 comprises a resistance Zn. In the neutral wire, a bypass current $I_n$ may flow.

Multi-Phase Alternating Current

A multi-phase alternating current comprises at least two phases wherein in each phase the current alternates over time. There is a phase-shift between the phases such that for example a peak current strength in one phase is shifted by $2\pi/n$ ($n=2, 3, 4, \ldots$) with respect to a peak current strength of another phase. The currents may alternate for example in a sinusoidal manner. However, also other alternation patterns, such as digital, stepwise, or others, may be applied.

Figure 6:
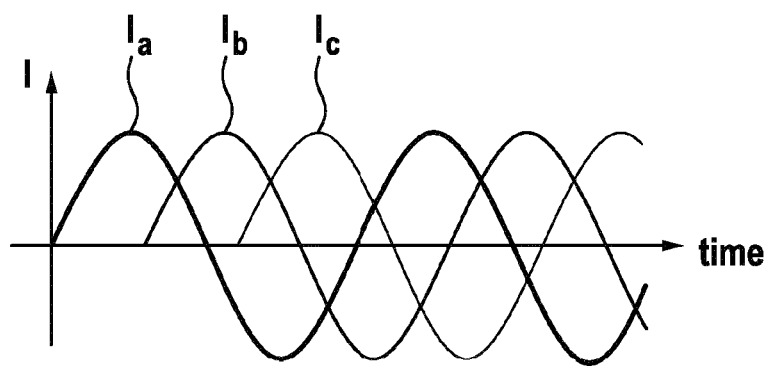
FIG. 6 visualizes phases of a multi-phase alternating current.

In other words and in the example of three phases, in electrical circuit design, three-phase electric circuits generally have three conductors for example formed by lines a, b, c carrying voltage waveforms that are $2\pi/3$ radians (i.e. 120° or ⅓ of a cycle) offset in time as shown in FIG. 6.

Measuring the Indicator Current

Where the three conductors carrying the voltage waveforms are "balanced", a net sum of phase currents throughout all legs 27 of the multi-phase alternating current circuitry 31, i.e. a vector sum of $I_a$, $I_b$, $I_c$ is 0 (i.e. $I_a+I_b+I=0$, wherein $I_a, I_b, I_c$ shall be vector currents and thus include information about their phases). In a balanced three-phase circuit, all three sources Va, Vb, Vc are generally represented by a set of balanced three-phase variables and all loads Zya, Zyb, Zyc as well as lines a, b, c within the legs 27 of the circuitry have equal impedances. Furthermore, in such balanced circuit, not only the net sum of the phase currents is 0, but also an electric bypass current $I_n$ through the neutral wire 37 being connected in parallel to the legs 27 is 0 (i.e. $I_n=0$).

Following Kirchhoff's voltage law, when there is an imbalance in the conductor loads of the three-phase circuit, any resulting imbalance of phase currents in the legs 27 of the circuitry 31 will be resolved as a current $I_n$ in the neutral wire 37 and/or as a net sum phase current throughout all phases a, b, c of the multi-phase alternating current being no more equal to 0.

Such deviation of the bypass current $I_n$ through the neutral wire 37 or of the net sum of all other phase currents $I_a$, $I_b$, $I_c$ may be interpreted and named herein as "electric indicator current". As soon as this indicator current deviates from a reference current value by more than a predetermined difference value, this may be taken as signal indicating that critical deterioration has occurred within at least one of the suspension members and checking and, if necessary, replacing the suspension member may be initiated for example. The reference current value may be, for example a current value of the bypass current $I_n$ or a net sum of the phase currents $I_a$, $I_b$, $I_c$ measured with a non-deteriorated suspension member arrangement such as for example directly after fabrication or installation of a suspension member arrangement.

The indicator current may be measured in various ways. For example, a vector net sum of all currents $I_a$, $I_b$, $I_c$ throughout all of the legs 27 of the multi-phase alternating current circuitry 31 may be measured together, i.e. with a common measuring circuitry. Alternatively, each of the phase currents $I_a$, $I_b$, $I_c$ in the lines a, b, c forming the legs 27 may be measured separately and a net sum of these separately measured phase currents may then be determined subsequently, for example in a summing device. Alternatively, the indicator current may be derived from the bypass current $I_n$ flowing through the neutral wire 37 upon any imbalance within the multi-phase alternating current circuitry 31.

For example, with reference to the circuitry 31 shown in FIG. 5, voltages Va, Vb, Vc are applied to lines a, b, c forming the legs 37 and are held constant, i.e. equal to each other, and 2 π/3 radians shifted apart. At least one of the lines a, b, c may comprise at least one of the cords comprised in a suspension member of the suspension member arrangement of the elevator. For a net sum $(I_a+I_b+I_c)$ and/or a bypass current $I_n$ in the neutral wire 37 to be equal to 0 under initial conditions, such as when the suspension member is newly installed, voltage drops across each of the lines a, b, c plus voltage drops across each of the loads Zya, Zyb, Zyc in each of the legs 27 must be equal.

In practical terms, the voltage drops across for example steel cords in a suspension member will not necessarily be initially equal due to for example various small differences and tolerances created by for example manufacturing tolerances of the steel cords in the suspension member. In this case, the loads Zya, Zyb and Zyc may be adjusted to compensate for such differences until a desired initial current condition for $I_n=0$, i.e. no current flow in the neutral wire, is obtained. Alternatively the multi phase source voltages Va, Vb, Vc 33 may be independently adjusted to likewise establish a desired initial current condition for $I_n$. Intuitively for those skilled in the art, an alternative to adjusting the loads Zya, Zyb, Zyc and/or the multi phase source voltages Va, Vb, Vc for an initial zero $I_n$ current would be to capture a non-zero value of $I_n$ as the initial reference current value.

Suspension members that contain multiple metal cords are generally capable of having the cords acting as electrical conductors or lines. The suspension member may also be construed with metal cords that are isolated electrically from each other by a physical separation, such as with electrically non-conductive materials like an elastomeric coating. Where the metal cords in suspension members are electrically isolated from each other, they may be connected for example in a Wye-configuration or a Delta-configuration and be part of various legs of a multi-phase alternating current circuitry. Each of the cords may then become an electrical conductor in the circuitry.

For example, in the Wye-configuration of FIG. 5, three isolated cords in a suspension member are represented by $Z_{1a}$, $Z_{1b}$, $Z_{1c}$. In an initially balanced state, the sums of resistances $Z_{1x}+Zyx$ (x=a, b, c) in each of the lines a, b, c formed by the cords are substantially equal. However, upon deterioration of one of the cords, the resistance $Z_{1x}$ created thereby in one of the lines changes and the entire multi-phase alternating current circuitry 31 comes into imbalance. Such imbalance may then be determined by measuring the indicator current $I_n$ or $(I_a+I_b+I_c)$. If this indicator current exceeds a certain predetermined value, this may be taken as indication that at least one of the cords comprised in a suspension member is significantly deteriorated and the suspension member may have to be checked and/or replaced.

Instead of forming all lines a, b, c or, more generally, all legs 27 of a multi-phase alternating current circuitry 31 by including one of the cords of a suspension member, for example only one or a few of those lines may include cords of the suspension member. For example, as described further below with respect to various examples, all cords of a suspension member or of plural suspension members may be connected in series or in parallel and may be included into only one of the legs 27 whereas the other legs 27 do not comprise any cords but are formed only with the loads Zyx. These loads Zyx may be fixed or dynamic. For example, dynamic loads may be implemented for setting up initial conditions for $I_n$ and/or compensating any temperature effects modifying electrical characteristics in the loads Zyx, the lines a, b, c, the cords comprised in the multi-phase circuitry and/or other components of the multi-phase circuitry.

It may be noted that setting up initial conditions for $I_n$ and/or compensating for the effects of temperature or other phenomena may also be accomplished by dynamically adjusting the loads Zya, Zyb, Zyc and/or the multi phase source voltages Va, Vb, Vc.

Contactless Measurement of the Indicator Current

In one preferred embodiment, the indicator current is measured in a contactless manner. For such contactless measuring, a measuring arrangement comprising a measuring device for contactless measuring of an electrical current in a conductor arrangement may be used. Preferably, a current transformer (CT) may be used for such contactless measuring. Alternatively, a Hall effect current sensor may be used.

For example, when an electric current passes through a line, this current creates both a voltage drop across such line and a magnetic field. The magnetic field can be used to sense a magnitude and direction of the current in the conducting line. Both, a voltage drop and the magnetic field are created by electro-physical characteristics of the line. Accordingly, if one or all of the lines forming legs of a multi-phase alternating current circuitry comprise at least one of the cords of a suspension member, the voltage drop there through and the magnetic field created thereby upon phase current application allows deriving information about physical properties of the cord. These characteristics are, at least in part, generally dependent upon the same physical properties of the cord that also determine the strength of the cord, such as for example the cord diameter. The magnetic field around a conductor is generally directly proportional to the current flowing in it.

Accordingly, any wireless measuring device which may measure changes in the magnetic field generated by changes in currents flowing through a conductor may be used for contactless measuring the current flow through the conductor.

A current transformer is an example for one of such measuring devices. A current transformer typically comprises windings or coils which serve as secondary windings. These windings may be mounted on a core made e.g. from ferrite or iron. The windings may be used to couple by induction with the magnetic field generated by the current flowing through one or more of the lines of the multi-phase alternating current circuitry which, in such case, act as primary winding(s). An output at the secondary winding(s) is generally proportional to the current through the primary winding(s). An operation of such CT is in principle substantially identical to that of any step-up transformer or step-down transformer. A number of secondary windings and their geometry may be adapted to the current(s) to be measured, particularly to a magnitude, a frequency, phase relationships, etc. of such currents. Furthermore, the number of secondary windings may be adapted in order to obtain a desired output which may be easily measured and analysed. Generally, the number Ns of secondary windings determines a transformation ratio which directly depends on a ratio Ns/Np of the number Ns of secondary windings to a number Np of primary windings.

The CT may be provided with various geometries, circuitries, etc. and may be provided with a same or similar design like conventional transformers such as step-up transformers, step-down transformers, Rogowski transformers, etc. The windings of the CT may be arranged in an open loop or in a closed loop.

Measuring currents wirelessly, particularly measuring currents using a CT, may provide for a number of advantages, especially when applied to measurements of an indicator current in embodiments of the method described herein.

For example, such measuring methods allow for voltage isolation between the circuitry in which the current to be measured flows and a circuitry of the measuring device. Such voltage isolation may be particularly beneficial in case installation or monitoring personal shall measure indicator currents within a suspension member arrangement of an elevator as such personal can then be suitably protected against any direct contact if relatively high voltages are applied to the suspension member arrangement.

Furthermore, no direct ohmic contacts between the measurement circuit and the circuitry in which the current to be measured flows have to be established. This may save work efforts and material costs. Furthermore, such ohmic contact may otherwise frequently cause long-term problems such as corrosion, contact losses, etc.

Additional advantages may be typically low cost of contactless measuring devices, such as a CT, and their high reliability. Furthermore, no external power supplies are required for such measuring devices. Additionally, such measuring devices are particularly beneficial in noisy environments as a current output is provided which may then be easily converted into a voltage output.

Particularly when applied to embodiments of the method described herein, using contactless measurement devices such as a CT may enable simple, safe, reliable and/or cost effective measuring of the indicator current as e.g. no direct physical and/or electrical access to suspension members, particularly to the cords comprised in the suspension member is necessary.

Figure 7:
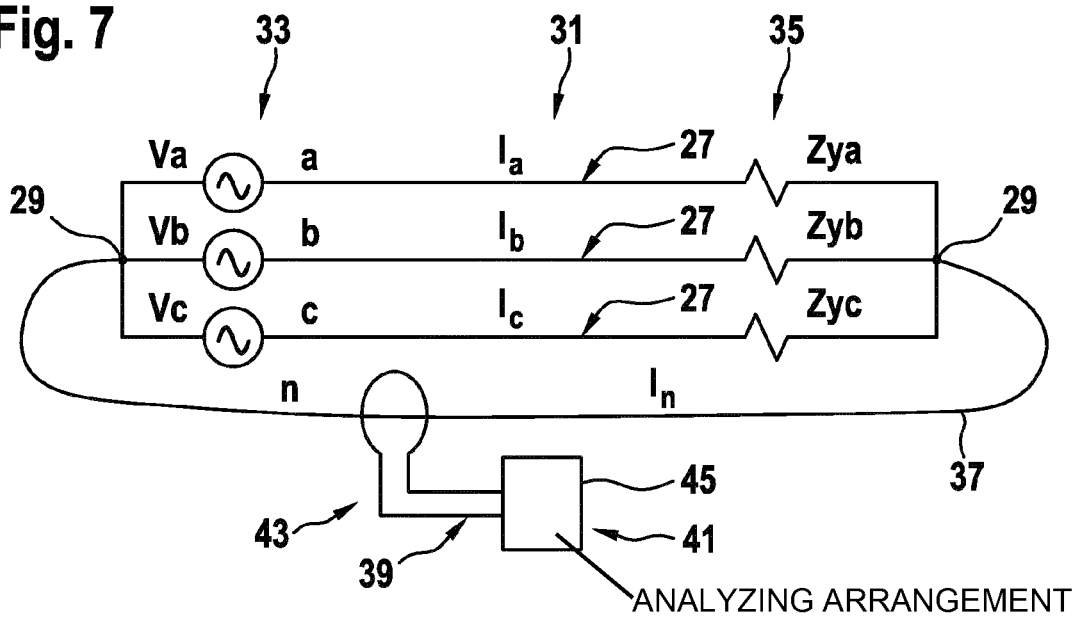
FIG. 7 shows a first example of an arrangement for measuring an indicator current in a multi-phase alternating current circuitry without physical contacts in the circuit to make the indicator current measurement.
Figure 8:
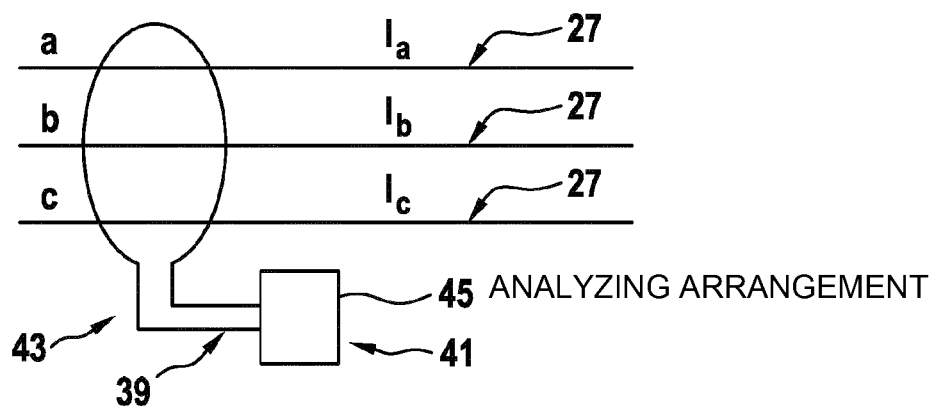
FIG. 8 shows a second example of an arrangement for measuring an indicator current in a multi-phase alternating current circuitry without physical contacts in the circuit to make the indicator current measurement.
Figure 9:
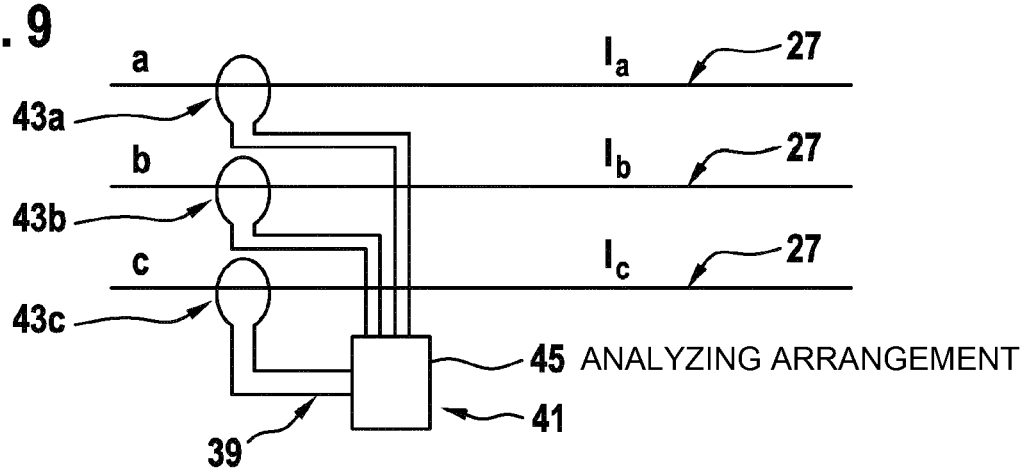
FIG. 9 shows a third example of an arrangement for measuring an indicator current in a multi-phase alternating current circuitry without physical contacts in the circuit to make the indicator current measurement.

FIGS. 7, 8, 9 show alternatives of measuring arrangements for measuring an indicator current in a multi-phase alternating current circuitry 31 for application in the method according to embodiments of the present invention.

FIG. 7 shows a multi-phase alternating current circuitry 31 similar to that one of FIG. 5. Voltage sources Va, Vb, Vc are provided on a source side 33 and loads Zya, Zyb, Zyc are provided on a load side 35. Both, the source side 33 and the load side 35 are provided in a Wye-configuration. Phases $I_a$, $I_b$, $I_c$ flow though each of the legs 27 of the circuitry 31. A neutral wire 37 is connected to neutral points 29 of the Wye-configurations such as to be parallel to the legs 27 of the circuitry 31.

A measurement device 39 for contactless measuring is provided external to the circuitry 31 and is arranged adjacent to the neutral wire 37. In the present example, the measurement device 39 is a current transformer 41 having a secondary winding arrangement 43 and an analysing arrangement 45. The secondary winding arrangement 43 encloses the neutral wire 37 thereby enabling inductively measuring any changes in a bypass current $I_n$ flowing through the neutral wire 37. As the neutral wire 37 may be separate to any suspension member, it may be simple to inductively measure the bypass current $I_n$. As this bypass current $I_n$ correlates to the net sum of all phase currents through the multi-phase alternating current circuitry 31, any changes and imbalances therein may be easily detected by monitoring the bypass current. With the multi-phase supply voltages and loads in the multi-phase alternating current circuitry 31 held constant, a source of any changes or imbalances would come from changes in electro-physical characteristics of the suspension member cords included in the circuitry 31, including shorts, breaks and/or reductions in cord diameter. A current in the neutral wire 37 may be dissipated e.g. by adding a load in the neutral wire 37 or by including a power supply.

FIGS. 8 and 9 each show a portion of alternative measuring arrangements. Therein, only the legs 27 of the multi-phase alternating current circuitry 31 are depicted.

In the example of FIG. 8, a large secondary winding arrangement 43 encloses all of the lines a, b, c included in the legs 27 together. Thereby, the CT 41 is enabled to simply measure a net sum current ($I_a+I_b+I_c$) through the multi-phase alternating current circuitry 31.

For example, in case all lines a, b, c forming the legs 27 include one or more cords of a suspension member, a single secondary winding arrangement 43 may be clamped around the suspension member such that a sum of the phase currents flowing through each of its cords may be measured altogether.

In the example of FIG. 9, several small secondary winding arrangements 43a, 43b, 43c each enclose separately one of the lines a, b, c included in the legs 27. Thereby, the CT 41 is enabled to measure each of the phase current $I_a$, $I_b$, $I_c$ separately. From such separate measurements, the analysing arrangement 45 may derive a net sum ($I_a+I_b+I_c$) of all currents.

For example, in case some lines a, b, c forming the legs 27 include one or more cords of a suspension member whereas some other lines a, b, c forming the legs 27 do not include one or more cords of a suspension member, some of the secondary winding arrangements 43a, 43b, 43c may be clamped around the suspension member such that the phase currents flowing through its cords may be measured whereas some others of the secondary winding arrangements 43a, 43b, 43c may not be clamped around the suspension member but around separate lines including for example separate resistors, these lines forming other legs 27 of the multi-phase alternating current circuitry 31. The analysing arrangement 45 may then calculate the net sum ($I_a+I_b+I_c$) of currents through all legs 27.

The analysing arrangement 45 may comprise a monitoring unit with monitoring electronics and a processor that may evaluate the net sum multi-phase current through the circuitry 31 and/or the bypass current through the neutral wire 37.

It shall be noted that, while measuring the indicator current wirelessly e.g. with a CT, other types of current measurements may be applied in alternative approaches. For example, a resistor may be included into e.g. the neutral wire and a voltage drop at such resistor may be determined in order to derive a value of the indicator current therefrom.

Wiring and Measurement Arrangements

FIGS. 10 to 13 show various alternatives of how to include cords 23 of suspension members 11 into a multi-phase alternating current circuitry 31 in order to enable methods in accordance with embodiments of the present invention.

Generally, cords 23 of one or more suspension member 11 may be connected to each other and to lines a, b, c of a multi-phase alternating current circuitry 31 in various ways of serial and/or parallel interconnection.

For example, if the number of cords 23 in a suspension member arrangement is identical to a number of legs 27 in the multi-phase alternating current circuitry 31, each one of the cords 23 may be included in one of the legs 27. In such configuration, altering electro-physical characteristics in one of the cords 23 may result in an imbalance in the multi-phase alternating current through the circuitry 31 such that a change in the indicator current may be measured. A deviation in the indicator current from a reference value may therefore indicate that at least one of the cords 11 is deteriorated.

Where the suspension member(s) comprise more cords 11 than there are legs 27 in the circuitry 31, i.e. than there are phases in the multi-phase alternating current, various wiring arrangements between the cords 23 and legs 27 of the circuitry 31 may be made.

For example, when there are four cords 23 present and the multi-phase alternating current circuitry 31 comprises three legs 27, two of the cords 23 may be wired in series or in parallel to create one conductor from the two and may then be connected to one of the legs 27. An impedance difference between each of the combined two cords 23 to that of the single conductor cords 23 in such an arrangement may be of no consequence to the monitoring method because measuring the indicator current and using it as a reference current value may take into account any such effects of cord combinations.

One skilled in the art may envision that any combination of 3, 4, 5, 6 or more cords configured into multi-phase circuit arrangements may be possible in the monitoring method proposed herein such that power supplies and loads are all connected e.g. on one end of a suspension member 11 with connections made to the cords 23 on the opposite end of the suspension member 11 to bridge and return the power from the supply to the loads. Such configurations are shown in FIGS. 10 and 11.

Figure 10:
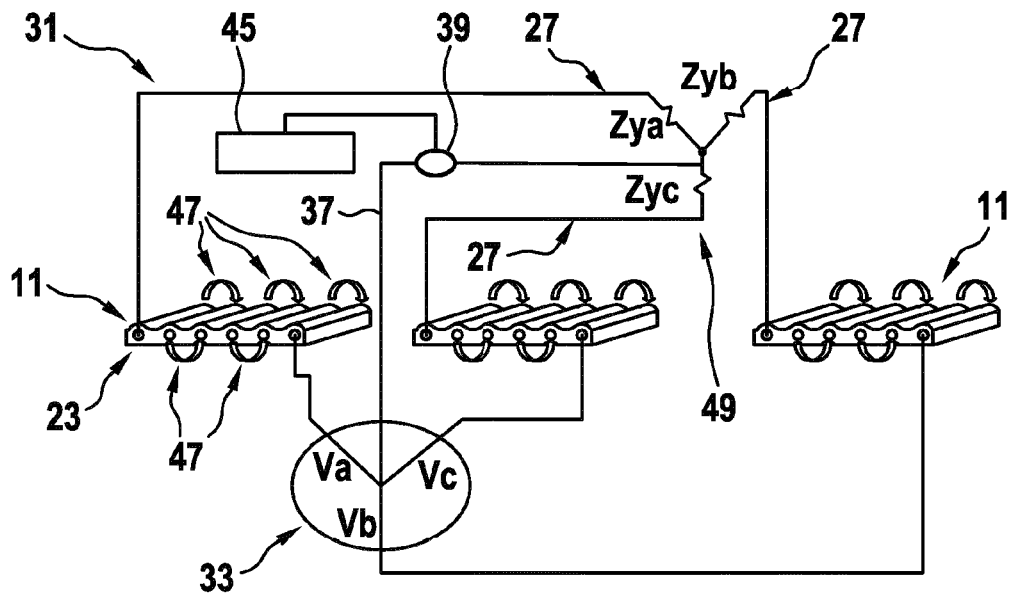
FIG. 10 shows a first example of a wiring and measuring arrangement for implementing the method or device according to embodiments of the present invention.

In the configuration of FIG. 10, a plurality of cords 23 in each of the suspension members 11 are connected in series and each suspension member 11 is included in one leg 27 of a three-phase alternating current circuitry 31. The cords 23 of one suspension member 11 are connected in series using bridge members 47 alternately arranged at opposite ends of the suspension member 11. Furthermore, optional resistive loads 49 Zya, Zyb, Zyc may be included in the Wye-configuration of the circuitry 31. Alternating voltages Va, Vb, Vc may be applied to each of the legs 27 on a supply side 33. A measuring device 39 and its analysing arrangement 45 may be used to measure an indicator current in a neutral wire 37.

Figure 11:
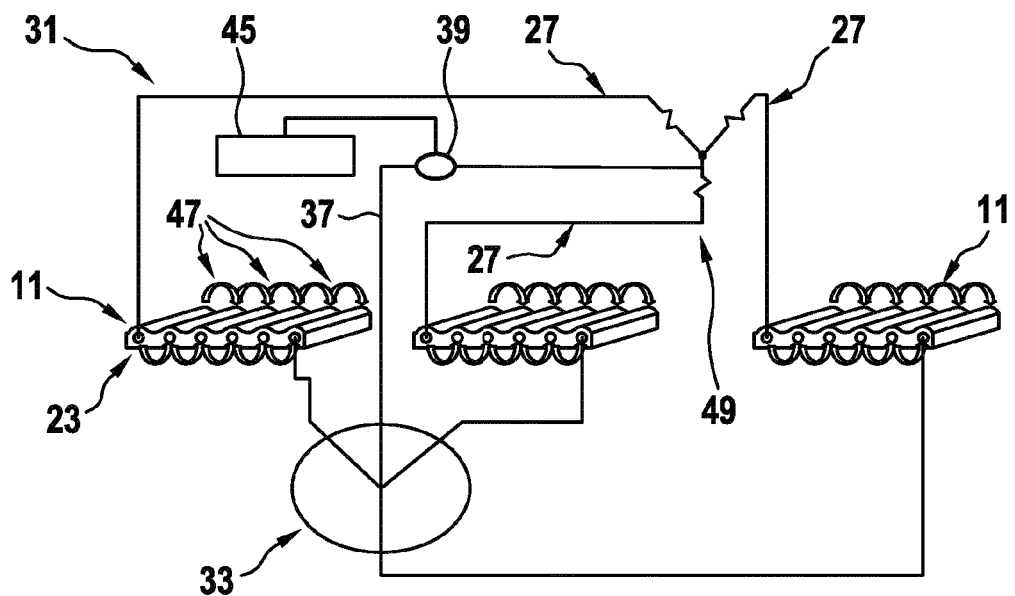
FIG. 11 shows a second example of a wiring and measuring arrangement for implementing the method or device according to embodiments of the present invention.

In the configuration of FIG. 11, a plurality of cords 23 in each of suspension members 11 are connected in parallel and each suspension member 11 is included in one leg 27 of a three-phase alternating current circuitry 31. In this case, bridge members 47 connect all cords 23 in a suspension member 11 in parallel.

Likewise, all cords 23 of multiple suspension members 11 may be connected into a single series circuit such that this series circuit is one leg 27 of the multi-phase alternating current circuitry 31 and other legs 27 constitute remaining legs 27 of the multi-phase alternating current circuitry 31 are comprised of one or more separate resistors R1, R2 forming resistive loads. Such configurations are shown in FIGS. 12 and 13.

Figure 12:
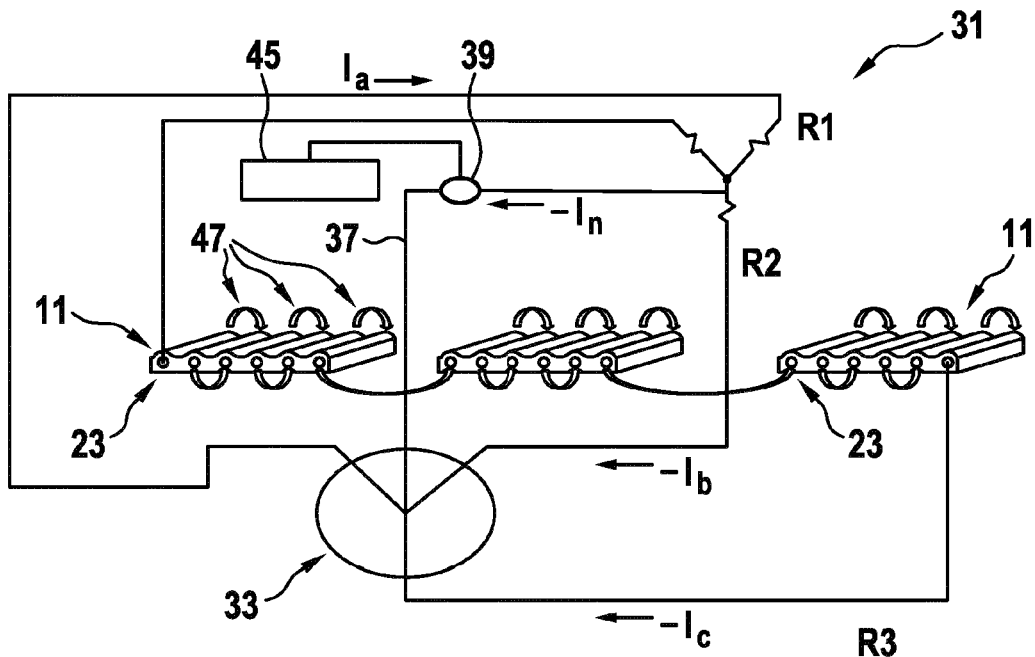
FIG. 12 shows a third example of a wiring and measuring arrangement for implementing the method or device according to embodiments of the present invention.

In the configuration of FIG. 12, a plurality of cords 23 in all suspension members 11 are connected in series using bridge elements 47 alternately arranged at opposite sides of the suspension members 23 and, altogether, are included in one leg 27 of a three-phase alternating current circuitry 31. Separate resistors R1, R2 are comprised in the remaining legs 27. A virtual resistance R3 is formed as a total resistance by all of the cords 23 in series. A measuring device 47 may be used for measuring the indicator current $I_n$ which may be for example a resulting bypass current within the neutral wire 37.

Figure 13:
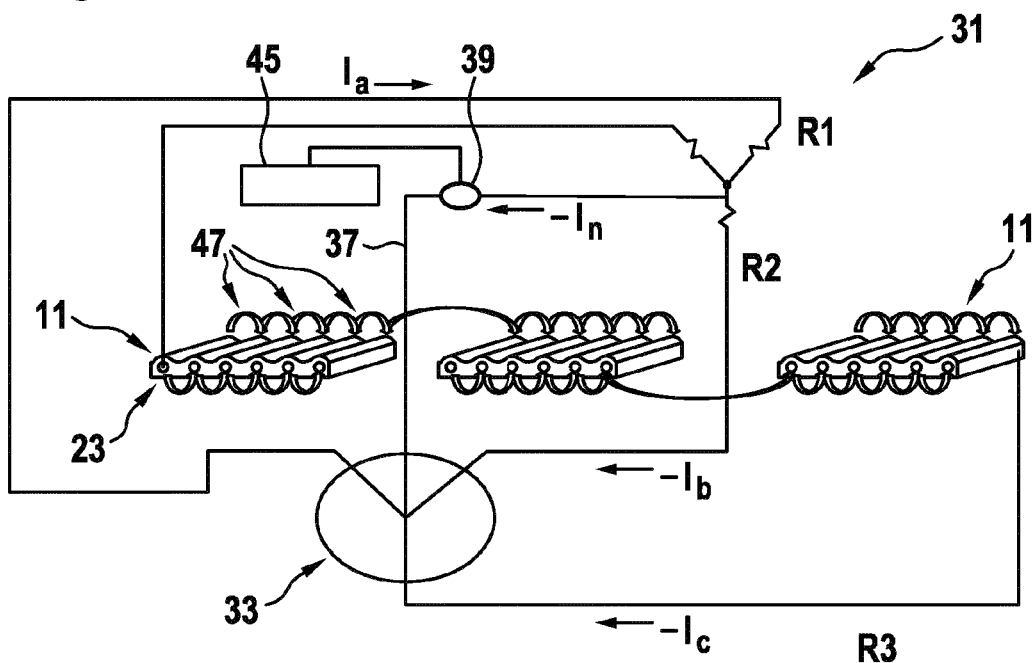
FIG. 13 shows a fourth example of a wiring and measuring arrangement for implementing the method or device according to embodiments of the present invention.

In the configuration of FIG. 13, a plurality of cords 23 in all suspension members 11 are connected in parallel using bridge members 47 within each suspension member 11 and the plurality of suspension members 11 is connected in series with each other in order to constitute one leg 27 of the three-phase alternating current circuitry 31. Separate resistors R1, R2 are comprised in the remaining legs 27. A resistance R3 is formed as a total resistance by all of the suspension members 11 in series.

Depending on how the cords 23 and suspension members 11 are interconnected and included into the multi-phase alternating current circuitry 31, different information may be derived from a measured indicator current $I_n$. For example, depending on how the various cords 23 are comprised in the circuitry 37, a change in the indicator current may indicate that electro-physical characteristics in one of the cords 23, in one of the suspension members 11 or in an entirety including all of the suspension members 11 occurred. Accordingly, in reaction to such measured change in the indicator current, counter-measures such as checking and/or exchanging one or all of the suspension members 11 of a suspension member arrangement 9 in an elevator 1 may be initiated.

Exemplary Calculation of Expected Indicator Current Change

In the following, an exemplary result of a calculation of an expected change of an indicator current $I_n$ to be measured according to embodiments of the method described herein will be presented. It is to be noted that the assumptions, calculations and results shall be exemplary only and shall not restrict the scope of the invention in any way.

With reference to the embodiment shown in FIG. 12 having all cords 23 and all suspension members 11 connected in series, it may be calculated that, for the specific suspension member arrangement 9, changes of the indicator current resulting from substantial deterioration of a load bearing capacity may be expected due to a reduction in the cross sectional area of the cords, and can be easily measured with relatively simple measuring devices 39. Furthermore, such changes in the indicator current due to critical deterioration states may be easily distinguished from changes in the indicator current which are only due to e.g. temperature effects.

A specific calculation of a predetermined difference value by which the indicator current may change before any critical modification in the load bearing capacity of a suspension member arrangement has to be assumed, may have to take into account a wide variety of parameters such as, inter alia, a length, a diameter and/or material characteristics of the cords, a manner in which the cords are interconnected and/or connected to legs of the multi-phase alternating current circuitry in parallel and/or in series, etc.

Summary Remarks

Without restricting the invention as defined in the claims in any way, aspects of embodiments of the invention may be summarized in an alternative wording to that used in the claims as follows:

1.) Some prior art approaches require electrical measurement of resistances or impedances to detect a change in a cross sectional area and strength of the cords.

Embodiments of the method described herein do not require any measurement of resistance or impedance. Only a change in a net sum of a current flow in a multi-phase (i.e.

polyphase) circuit, which is a vector sum of currents in conductors supplied by a multi-phase power source, is required. Load resistances 35 and/or multi phase source voltages 33 may be selected and incorporated for the purpose of multi-phase circuit design and may be adjusted or dynamic for other functional purposes such as load balancing, but resistance is generally not monitored or measured for the purpose of comparison with changes in resistance in the steel cords or for relating resistance (or impedance) of the cords to a change in the physical properties (e.g. a cross sectional area) of the steel cords in the suspension.

As advantages, for example a change in physical characteristics of the steel cords is proportional to a change in the net sum of the phase current and therefore can be derived from the change in the net sum of the phase current. No measurement of resistances is required to measure a change in the net sum phase currents. The steel cords can be arranged in any manner as "phase conductors" and loads in the multi-phase circuits. The measurements can be made "continuous" for monitoring a change in the electro-physical characteristics of the steel cords. Furthermore, the measurements do not require a use of a "test signal" in the cords for detecting a change in the electrical or physical characteristics of the steel cords.

As for further possible advantages, manual and/or dynamically adjusted load resistors 35 and/or source voltages 33 may provide for the method described herein a means to adapt to and be effective in detecting a deterioration in suspension members with varied characteristics, for example, suspension length and/or the number of cords per suspension member, or to any type of suspension with conductive cords.

2.) The net sum current flow of the multi-phase circuit is most easily obtained by measuring a change in an unbalanced load current between the common point of the supply-side and the load side of the multi-phase circuit, commonly called the neutral wire, for example in a Wye-configured arrangement, but can of course be obtained by measuring the current through each phase (phase current) and summing them together. Although a three phase WYE-configuration may be a preferred embodiment, any multi-phase configuration can be used where peak current in each phase is shifted by a phase angle between them.

As advantages, for example multi-phase circuits allow for a least number of connections to power the steel cords and all suspension members in an elevator, and to monitor the net sum phase current. As few as two connections to the cords are required to power the cords and none are required to be connected to the cords when a current transformer is used to monitor the net sum of the phase currents. The loss of continuity of current flow in any phase will cause a change in the net sum phase current.

3.) Different methods and devices can be used for transformation of the net sum of the multi-phase current flow into a signal that is proportional to, or triggers that there is a change in the cross sectional area and strength of the steel cords comprised in the multi-phase circuits. For example, there are various types of current transformers that can be designed and arranged to provide secondary voltage and current that is proportional to the primary current developed in the multi-phase circuits comprising the steel cord conductors being monitored.

Examples of current transformers include the Rogowski transformer and the step up, step down, or one to one isolation transformer, where in the net sum of the current flow of the steel conductors flows in the primary of the transformer and the secondary of the transformer produces a current proportional to the primary current and is supervised as a signal for the purpose of monitoring of the physical condition of the steel cords.

Another embodiment for measuring the net sum of the current flow is to use a Hall effect generator (sensor) in combination with a magnetic core that surrounds the neutral wire and an amplifier that provides a proportional output voltage signal.

There may be other embodiments for measuring the net sum of the phase currents that are known, or can be developed by those skilled in the art who read this invention.

As possible advantages, no physical connection to the steel cords is required by the monitoring device. Furthermore, electrical isolation may be provided, application of CTs is ideal in "noisy" environments and is low cost and highly reliable. Furthermore, advantage may be taken of transformer behavior, such as magnetic saturation, to create signals in low complexity monitoring circuits. Furthermore, flexibility for arranging the circuits in primary and secondary of the transformer may be obtained.

4.) The steel cords of the suspension members can be arranged to create "conductors" that carry power in parallel, series, or a combination of the two in the multi-phase circuits.

As possible advantages, ability to optimize the physical arrangement of electrical connections to conductor cords for suspension members with varied characteristics, for example, suspension length and/or the number of cords per suspension member, or to any type of suspension with conductive cords, while minimizing the number of unique electrical connections: 1) between cord conductors, 2) between cord conductors and multi-phase power, 3) between cord conductors and a common neutral point when used, and between cords of all suspension members.

As further possible advantages, the monitoring of the net sum of phase current in all the cord conductors can be resolved as proportional to the physical properties of the cords (change in cross sectional area). The cords act only as power circuit conductors in the multi-phase circuits when a CT is used for monitoring the net sum of the phase currents.

Furthermore, specifically in embodiments where all phases of the multi-phase alternating current are fed through at least one of the cords of the suspension members, there may be no need or at least a relaxed need for any temperature compensation since equal changes in temperature in each of the cords generally result in equal changes in electro-physical characteristics of these cords such that all current phases are affected in similar ways and the net sum current or bypass current through the neutral wire, i.e. the indicator current, remains unaffected by such temperature changes.

LIST OF REFERENCE SIGNS 1 elevator
2 cabin
5 counter-weight
7 elevator shaft
9 suspension member arrangement
11 suspension member
13 traction machine
15 traction sheave
17 device for detecting deterioration
19 belt
21 matrix material
23 cords
25 electrical component
27 leg 29 common point
31 multi-phase alternating current circuitry
33 source side
35 load side
37 neutral wire
39 measuring device
41 current transformer
43 secondary winding arrangement
45 analysing arrangement
47 bridge member
49 resistive load
a, b, c lines of legs
Ya, Yb, Yc alternative voltages
$I_a$, $I_b$, $I_c$ alternating currents
Zya, Zyb, Zyc resistances in legs
$I_n$ bypass current
Zn resistance in neutral wire Approaches defining features of the concept 1 may be defined as follows:

1. A method for detecting a deterioration state of a load bearing capacity in a suspension member arrangement (9) for an elevator (1), the suspension member arrangement comprising at least one suspension member (11) having a plurality of electrically conductive cords (23), the method comprising:
providing a multi-phase alternating current circuitry (31) including multiple electrically conductive legs (27);
applying at least one phase of a multi-phase alternating current to at least one of the cords (23) of the suspension member (11) by being electrically connected to one of the legs (27) of the multi-phase alternating current circuitry (31);
applying at least one other phase of the multi-phase alternating current to at least one of another at least one cord (23) of the suspension member (11) and at least one separate resistor (49) being electrically connected to at least one other leg (27) of the multi-phase alternating current circuitry (31), wherein a peak current in each phase is shifted by a phase angle with respect to a peak current in another phase;
\measuring an electric indicator current ($I_n$) being at least one of a net sum of all phases of the multi-phase alternating current and an electric bypass current through a neutral wire (37) being connected in parallel to the multi-phase alternating current circuitry (31);
determining the deterioration state based on the measured indicator electric current.

2. The method according to approach 1, wherein the deterioration state is determined based on a deviation of the measured indicator current from a reference current value.

3. The method according to approach 2, wherein a critical deterioration state is detected upon the measured indicator current deviating from the reference current value by more than a predetermined difference value.

4. The method according to one of the preceding approaches, wherein the indicator current is measured using a measuring arrangement comprising a measuring device (39) for contactless measuring of an electrical current in a conductor arrangement.

5. The method according to one of the preceding approaches, wherein the indicator current is measured using a measuring device (39) being one of a current transformer (41) and a Hall effect current sensor.

6. The method according to approach 5, wherein the measuring device (39) is arranged at one of the multi-phase alternating current circuitry (31) and the neutral wire (37).

7. The method according to one of the preceding approaches, wherein the multi-phase alternating current circuitry (31) is provided in a Wye-configuration.

8. The method according to one of the preceding approaches, wherein the neutral wire (37) is connected between common points of a supply side (33) of the multi-phase alternating current circuitry (31) and a load side (35) of the multi-phase alternating current circuitry (31), respectively.

9. The method according to one of the preceding approaches, wherein each of the phases of the multi-phase alternating current is applied to at least one of the cords (23) of the suspension member (11).

10. The method according to one of the preceding approaches, wherein, in an initial state before deterioration, electrical resistances within each of the legs (27) of the multi-phase alternating current circuitry are adapted to be substantially equal.

11. The method according to one of the preceding approaches, wherein several cords (23) of the suspension member (31) are connected in at least one of a parallel arrangement and a series arrangement.

12. The method according to one of the preceding approaches, wherein the suspension member arrangement (9) comprises a plurality of suspension members (11) and wherein cords (23) of one suspension member (11) are connect in in at least one of a parallel arrangement and a series arrangement to cords of another suspension member (11).

13. The method according to one of the preceding approaches, wherein the phases of the multi-phase alternating current are supplied with an even phase offset from each other.

14. A device for detecting a deterioration state of a load bearing capacity in a suspension member arrangement (9) for an elevator (1), the suspension member arrangement (9) comprising at least one suspension member (11) having a plurality of electrically conductive cords (23), wherein the device is configured to perform a method according to one of the preceding approaches.

15. The device according to approach 14, comprising:
a multi-phase alternating current circuitry (31) comprising multiple legs (27), each leg comprising an AC voltage supply (Va, Vb, Vc) such as to apply each of multiple phases of a multi-phase alternating current to one of the legs (27);
a connector arrangement for electrically connecting the multi-phase alternating current circuitry (31) to the suspension member (11) such that at least one phase of the multi-phase alternating current is applied to at least one of the cords (23) of the suspension member (11) and such that at least one other phase of the multi-phase alternating current is applied to at least one of another at least one cord (23) of the suspension member (9) and at least one separate resistor (49);
a measuring arrangement configured for measuring an electric indicator current being at least one of a net sum of all phases of the multi-phase alternating current and an electric bypass current through a neutral wire (37) being connected in parallel to the multi-phase alternating current circuitry (31);
a determination arrangement for determining the deterioration state based on the measured electric indicator current.

16. The device according to one of approaches 14 and 15, wherein the measuring arrangement comprises a measuring device (39) for contactless measuring of an electrical current in a conductor arrangement.

17. An elevator comprising a device according to one of approaches 14 to 16.

CONCEPT II

Method for Detecting a Deterioration State in a Suspension Member Arrangement for an Elevator Based on AC Voltage Measurements

FIELD

The present invention according to concept 2 relates to a method for detecting a deterioration state in a suspension member arrangement for an elevator.

BACKGROUND

Elevators typically comprise a cabin and, optionally, a counterweight which may be displaced for example within an elevator shaft or hoistway to different levels in order to transport persons or items for example to various floors within a building. In a common type of elevator, the cabin and/or the counterweight are supported by a suspension member arrangement comprising one or more suspension members. A suspension member may be a member which may carry heavy loads in a tension direction and which may be bent in a direction transverse to the tension direction. For example, a suspension member may be a rope or a belt. Typically, suspension members comprise a plurality of load carrying cords. The cords may be made for example with an electrically conductive material, particularly a metal such as steel.

During operation of the elevator, suspension members have to carry high loads and are typically repeatedly bent when running along for example a traction sheave, a pulley and/or other types of sheaves. Accordingly, substantial physical stress is applied to the suspension member arrangement during operation which may lead to deteriorations in the suspension members' physical characteristics such as e.g. their load bearing capability.

However, as elevators may typically be used by people for transportation along significant heights, safety requirements have to be fulfilled. For example, it has to be safeguarded that the suspension member arrangement can always guarantee safe support of the cabin and/or the counterweight. For such purposes, safety regulations rule for example that any substantial deterioration of an initial load bearing capacity of a suspension member arrangement can be detected such that for example counter-measures such as replacing a substantially deteriorated or faulty suspension member from the suspension member arrangement may be initiated.

Generally, a load bearing capacity of a suspension member may be specified when designing the suspension member and may then be physically tested upon completion of a fabrication of the suspension member. Physical tests may comprise for example tensile loading of the suspension member and measuring the suspension member's reaction to an application of high tensile forces.

However, during actual operation of the elevator, it may be difficult or even impossible to perform such physical tests. With conventional steel ropes serving as suspension members, visual checking of a rope condition has been possible. However, in modern suspension members, load bearing cords are typically enclosed in a coating or matrix and are therefore not visible from outside. Therefore, alternative approaches for determining a load bearing capacity in a suspension member arrangement or determining parameters related thereto have been developed.

For example, elevator load bearing member wear and failure detection has been described in EP 1 730 066 B1. A method and apparatus for detecting elevator rope degradation using electrical resistance is described in U.S. Pat. No. 7,123,030 B2. Electrical signal application strategies for monitoring a condition of an elevator load bearing member are described in US 2011/0284331 A1 and U.S. Pat. No. 8,424,653 B2. Electrical signal application strategies for monitoring a condition of an elevator load bearing member are described in US 2008/0223668 A1 and U.S. Pat. No. 8,011,479 B2. A simplified resistance based belt type suspension inspection is disclosed in US 2013/0207668 A1. An elevator system belt type suspension having connecting devices attached thereto is described in WO 2011/098847 A1. A method for detection of wear or failure in a load bearing member of an elevator is described in WO 2013/135285 A1. Electrical signal application strategies for monitoring a condition of an elevator load bearing member are described in EP 1 732 837 B1. "Health Monitoring for Coated Steel Belts in an Elevator System" have been described in a research article of Huaming Lei et al. in the Journal of Sensors, Volume 2012, Article ID 750261, 5 pages, doi: 10.1155/2012/750261. Most of these prior art approaches are generally based on measuring electrical resistance characteristics upon applying an electrical direct current (DC).

There may be a need for an alternative method for detecting a deterioration state in a suspension member arrangement for an elevator. Particularly, there may be a need for such method which enables fulfilling high safety requirements, simple implementation and/or low cost.

SUMMARY

Such needs may be met with the subject-matter and approaches of concept 2 defined hereinafter. Beneficial embodiments and approaches of concept are 2 defined hereinafter and in the following specification.

An aspect of the present invention of concept 2 relates to a method for detecting a deterioration state in a suspension member arrangement for an elevator. Therein, the suspension member arrangement comprises at least one suspension member having a first and a second group of electrically conductive cords. The method comprises at least the following steps, preferably in the indicated order:

A first alternating voltage $U_1$ is applied to a first end of the first group of cords of the suspension member and a second alternating voltage $U_2$ is applied to a first end of the second group of cords of the suspension member. Therein the first and second alternating voltages have same waveforms and a phase difference of substantially 180°.

Then, (i) a summed voltage $(U_3+U_4)$ correlating to a sum of a third voltage $(U_3)$ between the second end of the first group of cords and a common electrical potential and a fourth voltage $(U_4)$ between the second end of the second group of cords and the common electrical potential and/or (ii) a differential voltage $(U_3-U_4)$ correlating to a difference between the third voltage $(U_3)$ and the fourth voltage $(U_4)$ are determined.

Finally, the deterioration state of the suspension member arrangement is determined based on at least one of the summed voltage and the differential voltage.

Without restricting the scope of the invention of concept 2 in any way, ideas underlying embodiments of the invention of concept 2 may be understood as being based, inter alia, on the following recognitions and observations:

In conventional approaches for detecting a deterioration state of a load bearing capacity in a suspension member arrangement such as those approaches indicated in the above introductory portion, electrical characteristics of cords included in a suspension member have been taken as indicators for changes in the deterioration state. Generally, electrical resistances within the cords have been measured and it has been assumed that an increase of such electrical resistances indicates a deterioration of the load bearing capacity of the suspension member.

However, such electrical resistance measurements, or alternatively impedance measurements, may require substantial efforts in terms of, e.g., measuring devices, measurement analysing devices, circuitry, etc. For example, electrical resistances have to be included, measured and compared within circuitry comprising cords of a suspension member in order to thereby enable quantitative measurements of the electrical resistance or impedance of the cords.

The inventors of the present invention have found that measuring electrical resistance/conductivity of cords, particularly measuring quantitatively such characteristics, is not necessary in order to obtain sufficient information about a deterioration state of a load bearing capacity in a suspension member to ensure safe operation of an elevator.

As an alternative approach to conventional methods and devices, it is therefore proposed to not necessarily measure any electrical resistance, resistivity or impedance within conductive cords of a suspension member directly but to provide for a method and a device which allow for deriving sufficient information about a deterioration state by measuring one or more electric voltages which at least relate to a correlation of electric voltages occurring at ends of two groups of cords of the suspension member when alternating voltages are applied to opposite ends of these two groups of cords.

In such alternative approach, electrical resistances, resistivities or impedances do neither have to be known quantitatively on an absolute scale nor in a relative manner. Instead, it may be sufficient to simply measure electric voltages, particularly sums of electrical voltages and/or differences of electrical voltages, without having any detailed knowledge about actual resistances, resistivities and/or impedances through the cords of the suspension member.

DETAILED DESCRIPTION

Briefly summarized and expressed in a simpler wording than in the claims, but without restricting the scope of the claims, an idea underlying the inventive method may be briefly summarized as follows:

The cords comprised in a suspension member may be divided into two groups of cords. Preferably, both groups comprise the same number of cords. Further preferably, a first group may comprise all even numbered cords and a second group may comprise all odd numbered cords, such that each cord of one of the groups is arranged between two neighbouring cords of the other group of cords (of course except for the two cords arranged at the outer borders of the suspension member).

Then, alternating voltages $U_1$, $U_2$ are applied to a respective first end of each of the groups of cords using an alternating voltage generator arrangement. The alternating voltages $U_1$, $U_2$ comprise an alternating voltage (AC) component in which a voltage periodically varies between a minimum value $U_{min}$ and a maximum value $U_{max}$. Furthermore, the alternating voltages $U_1$, $U_2$ may comprise a direct voltage (DC) component $U_{DC}$. The alternating voltage generator arrangement may comprise two separate alternating voltage generators $G_1$, $G_2$ which are synchronized in a specific manner with each other. Alternatively, the alternating voltage generator arrangement may comprise a single alternating voltage generator G comprising a direct output and an inverted output in order to provide the required two alternating voltages $U_1$, $U_2$. Therein, it may be important that the waveforms of both alternating voltages $U_1$, $U_2$ are substantially the same, i.e. deviate from each other by less than an acceptable tolerance, such tolerance being for example less than 5% or preferably less than 2%. Furthermore, the alternating voltage generator arrangement shall generate the two alternating voltages $U_1$, $U_2$ with a phase shift of substantially 180°, particularly with a phase shift of 180°±an acceptable tolerance of e.g. less than 5%, preferably less than 2%.

Then, at least one voltage measurement is performed using at least one voltage measurement arrangement. Specifically, a voltage named herein "summed voltage" $U_+$ and/or a voltage named herein "differential voltage" $U_-$ is determined. Both, the "summed voltage" $U_+$ and the "differential voltage" $U_-$ may be measured at least with their alternating voltage components $U_{+,AC}$, $U_{-,AC}$ but preferably with both, their alternating voltage components $U_{+,AC}$, $U_{-,AC}$ and their direct voltage component $U_{+,DC}$, $U_{-,DC}$. In the alternating voltage components $U_{+,AC}$, $U_{-,AC}$, both an amplitude and phase may be determined. As will be described further below, valuable information about the deterioration state of the suspension member may be derived particularly from the phase information included in the measurement of at least one of the alternating voltage components $U_{+,AC}$, $U_{-,AC}$.

Therein, the summed voltage $U_+$ correlates in a predetermined manner to a sum $(U_3+U_4)$ of a third voltage $(U_3)$ and a fourth voltage $(U_4)$ whereas the differential voltage $U_-$ correlates in a predetermined manner to a difference $(U_3-U_4)$ between the third voltage $(U_3)$ and the fourth voltage $(U_4)$. The third voltage $(U_3)$ occurs between the second end of the first group of cords and a common electrical potential such as e.g. a ground potential. The fourth voltage $(U_4)$ occurs between the second end of the second group of cords and the common electrical potential such as e.g. the ground potential.

The summed voltage $U_+$ and the differential voltage $U_-$ may be directly the sum $(U_3+U_4)$ and the difference $(U_3-U_4)$, respectively. Alternatively, the summed voltage $U_+$ may proportionally correlate to such sum $(U_3+U_4)$, i.e. may be a multiple of such sum such as e.g. $(U_3+U_4)/2$. Analogously, the differential voltage $U_-$ may proportionally correlate to the difference $(U_3- U_4)$, i.e. may be a multiple of such difference. As a further alternative, the voltage measurement arrangement may measure voltages $(U_1)$, $(U_2)$ occurring at opposite first ends of both groups of cords and may determine a sum $(U_1+U_2)$ and/or difference $(U_1- U_2)$ or a multiple of such sum/difference which, due to the fact that $(U_1)$, $(U_2)$ occur in the common circuitry with $(U_3)$, $(U_4)$, correlate in an unambiguous manner to the sum $(U_3+U_4)$ and to the difference $(U_3- U_4)$, respectively.

Information about the deterioration state of the suspension member may be derived from at least one of
(i) a phase determination in the alternating voltage components $U_{+,AC}$, $U_{-,AC}$ of the summed voltage $U_+$ and/or the differential voltage $U_-$, (ii) an amplitude determination in the alternating voltage components $U_{+,AC}$, $U_{-,AC}$, of the summed voltage $U_+$ and/or the differential voltage $U_-$, and (iii) a value determination in the direct voltage components $U_{+,DC}$, $U_{-,DC}$, of the summed voltage $U_+$ and/or the differential voltage $U_-$.

In a normal state in which no deteriorations occur in the cords of the suspension member, both the third and fourth voltage $U_3$, $U_4$ should directly follow the applied alternating voltages $U_1$, $U_2$, i.e. with a same phase but with a reduced amplitude, and should therefore be both same in amplitude but with a phase shift of 180° such that the summed voltage $U_+$ should be a constant direct voltage (DC) (i.e. $U_{+,AC}=0$) and the differential voltage $U_-$ should be an alternating voltage (AC) (i.e. $U_{-,AC} \neq 0$) having double the amplitude than each of the third and fourth voltages $U_3$, $U_4$.

However, when any deterioration occurs in the cords of the suspension member, such as one or more local breakages of cords, significant corrosion of cords, defects in an electrically isolating cover enclosing and electrically separating neighbouring cords (such defects potentially resulting in shorts between neighbouring cords and/or electrical connections to ground of some cords), etc., the summed voltage $U_+$ and/or the differential voltage $U_-$ generally significantly change. Such changes may be detected and may then be interpreted as indicating specific types and/or degrees of deteriorations in the suspension member.

For example, an increase of an electrical resistance due to e.g. corrosion or even a breakage in one of the cords will significantly change a respective one of the third and fourth voltages $U_3$, $U_4$ occurring at the second end of the respective group of cords including the deteriorated cord. Accordingly, due to such voltage change, for example no purely direct voltage (DC) is measured anymore for the summed voltage $U_+$.

Other deteriorations of the suspension member and/or its cords generally result in other deviations of the summed voltage $U_+$ and/or the differential voltage $U_-$ from their initial "normal" behaviour, as will be described in more detail further below.

Accordingly, upon applying phase-shifted first and second voltages of same waveforms to first ends of two groups of cords, valuable information about a current deterioration state in the suspension member of the suspension member arrangement may be derived by measuring third and fourth voltages $U_3$, $U_4$ at or between the second ends of both groups of cords (or measuring any multiple thereof or any voltages correlating thereto) and correlating them as the sum (e.g. $U_3+U_4$) and/or the difference (e.g. $U_3-U_4$).

As will be described further below, additional information about a specific type, degree and/or location of an occurring deterioration may be derived when measurements of both the summed voltage $U_+$ and the differential voltage $U_-$ are taken into account.

A possible advantage obtainable with the approach described herein is that, in contrast to most prior art approaches, no electrical direct current (DC) is applied to the cords of a belt but, instead, alternating currents (AC) are applied. Applying such alternating currents may significantly reduce a risk of any electro-corrosion at the cords.

Embodiments of the invention of the method according to concept 2 will be described further below with reference to the enclosed drawings as discussed with reference to the invention of the related device according to concept 3. Neither the drawings nor the description shall be interpreted as limiting the invention.

Approaches defining features of the concept 2 may be defined as follows:

1. A method for detecting a deterioration state in a suspension member arrangement (9) for an elevator (1), the suspension member arrangement (9) comprising at least one suspension member (11) having a first and a second group (24a, 24b) of electrically conductive cords (23); the method comprising:
   applying a first alternating voltage $U_1$ to a first end (25a) of the first group of cords of the suspension member;
   applying a second alternating voltage $U_2$ to a first end (25b) of the second group of cords of the suspension member;
   wherein the first and second alternating voltages have same waveforms and a phase difference of 180°;
   determining at least one of
   (i) a summed voltage $U_+$ correlating to a sum ($U_3+U_4$) of a third voltage $U_3$ between a second end (27a) of the first group of cords and a common electrical potential and a fourth voltage $U_4$ between a second end (27b) of the second group of cords and the common electrical potential;
   (ii) a differential voltage $U_-$ correlating to a difference ($U_3-U_4$) between the third voltage $U_3$ and the fourth voltage $U_4$;
   determining the deterioration state based on at least one of the summed voltage $U_+$ and the differential voltage $U_-$.

2. The method according to approach 1, wherein the second end of the first group of cords and the second end of the second group of cords are electrically connected via a connecting electrical resistance ($R_5$).

3. The method according to one of the preceding approaches, wherein the deterioration state is determined based on both the summed voltage U+ and the differential voltage U−.

4. The method according to approach 3, wherein any deviation from a state in which the summed voltage $U_+$ comprises no alternating voltage component $U_{+,AC}$ and the differential voltage $U_-$ comprises a alternating voltage component $U_{-,AC}$ is interpreted as indicating a deterioration in the suspension member arrangement.

5. The method according to one of the preceding approaches 3 and 4, wherein a state in which the summed voltage $U_+$ comprises an alternating voltage component and the differential voltage $U_-$ comprises no alternating voltage component is interpreted as indicating that at least one of the cords comprised in one of the group of cords is interrupted and none of the cords comprised in the other group of cords is interrupted.

6. The method according to one of the preceding approaches 3 to 5, wherein a state in which the summed voltage $U_+$ comprises no alternating voltage component and the differential voltage $U_-$ comprises no alternating voltage component is interpreted as indicating at least one of the following deterioration states:
   at least one of the cords comprised in one of the group of cords is interrupted and at least one of the cords comprised in the other group of cords is interrupted; and
   the voltage supplies of the first alternating voltage $U_1$ and of the second alternating voltage $U_2$ are both interrupted.

7. The method according to one of the preceding approaches 3 to 6, wherein a state in which the summed voltage comprises an alternating voltage component and the differential voltage comprises an alternating voltage component is interpreted as indicating an electrical connection to ground of at least one of the cords in the suspension member.

8. The method according to one of the preceding approaches 3 to 7, wherein a state in which the summed voltage comprises no alternating voltage component but a direct voltage component and the differential voltage comprises no alternating voltage component is interpreted as indicating that one of the cords comprised in one of the groups of cords is short circuited with a cord comprised in the other group of cords in a symmetrical manner.

9. The method according to one of the preceding approaches 3 to 8, wherein a state in which the summed voltage comprises an alternating voltage component and a direct voltage component and the differential voltage comprises no alternating voltage component is interpreted as indicating that one of the cords comprised in one of the groups of cords is short circuited with a cord comprised in the other group of cords in an asymmetrical manner.

10. The method according to one of the preceding approaches 7 to 9, wherein the suspension member arrangement is moved along pulleys of the elevator during determining the summed voltage and the differential voltage.

11. The method according to approach 10, wherein a position where at least one of a connection to ground of one of the cords and a short circuit between cords of both groups of cords is present is determined based on a point in time when a respective state is determined.

12. The method according to one of the preceding approaches, wherein information about the deterioration state is derived based on an analysis of a phase in an alternating voltage component $U_{+,AC}$, $U_{-,AC}$, of at least one of the summed voltage $U_+$ and the differential voltage $U_-$.

13. The method according to one of the preceding approaches, wherein initial values of the summed voltage and the differential voltage are determined and stored in an initial state of the elevator and wherein subsequent values of the summed voltage and the differential voltage are determined in a subsequent state of the elevator and wherein the deterioration state of the suspension member is determined during the subsequent state based on a comparison of the initial values of the summed voltage and the differential voltage with the subsequent values of the summed voltage and the differential voltage, respectively.

14. The method according to one of the preceding approaches, wherein, additionally, initial values of the applied first and second alternating voltages $U_1$, $U_2$ are determined and stored in an initial state of the elevator and wherein subsequent values of the applied first and second alternating voltages $U_1$, $U_2$ are determined in a subsequent state of the elevator and wherein the deterioration state of the suspension member is determined during the subsequent state taking into account a comparison of the initial values of the applied first and second alternating voltages $U_1$, $U_2$ with the subsequent values of the applied first and second alternating voltages $U_1$, $U_2$, respectively.

15. The method according to one of the preceding approaches, wherein the suspension member arrangement comprises multiple suspension members, wherein the first and second alternating voltages $U_1$, $U_2$, are applied and the summed voltage $U_+$ and the differential voltage $U_-$ are determined at the various suspension members in a timely offset sequence.

CONCEPT III

Device for Detecting a Deterioration State in a Suspension Member Arrangement for an Elevator Based on AC Voltage Measurements

FIELD

The present invention according to concept 3 relates to a device for detecting a deterioration state in a suspension member arrangement for an elevator. The device may be adapted for performing the method according to the above described concept 2.

BACKGROUND

A technical background relating to the concept 3 and some references to prior art approaches are similar to those described in the introductory portions of the descriptions of concept 2.

There may be a need for an alternative device for detecting a deterioration state in a suspension member arrangement for an elevator. Particularly, there may be a need for such device which enables fulfilling high safety requirements, simple implementation and/or low cost.

SUMMARY

Such needs may be met with the subject-matter and approaches of concept 3 defined hereinafter. Beneficial embodiments and approaches of concept 3 are defined hereinafter and in the following specification.

An aspect of the present invention of concept 3 relates to a device for detecting a deterioration state in a suspension member arrangement for an elevator. Therein, the suspension member arrangement comprises at least one suspension member having a first and a second group of electrically conductive cords. The device comprises at least an alternating voltage generator arrangement, at least one voltage measurement arrangement and the determination unit. The alternating voltage generator arrangement is adapted for applying a first alternating voltage $U_1$ to a first end of the first group of cords of the suspension member and for applying a second alternating voltage $U_2$ to a first end of the second group of cords of the suspension member. Therein, the alternating voltage generator arrangement is configured to generating the first and second alternating voltages with same waveforms and a phase difference of substantially 180°. Furthermore, the device comprises a first voltage measurement arrangement and/or a second measurement arrangement. Therein, the first voltage measurement arrangement is adapted for determining a summed voltage $(U_3+U_4)$ correlating to a sum of a third voltage $(U_3)$ between the second end of the first group of cords and a common electrical potential and a fourth voltage $(U_4)$ between the second end of the second group of cords and the common electrical potential. The second voltage measurement arrangement is adapted for determining a differential voltage $(U_3-U_4)$ correlating to a difference between the third voltage $(U_3)$ and the fourth voltage $(U_4)$. The determination unit is adapted for determining the deterioration state of the suspension member arrangement based on at least one of the summed voltage and the differential voltage. Without restricting the scope of the invention in any way, ideas underlying embodiments of the invention may be understood as being based, inter alia, on the recognitions and observations as described above with respect to the invention of concept 2.

It shall be noted that possible features and advantages of embodiments of the invention are described herein partly with respect to a method for detecting a deterioration state in a suspension member arrangement and partly with respect to a device which is adapted for performing or controlling such method in an elevator. One skilled in the art will recognize that the features may be suitably transferred from one embodiment to another, i.e. from the method to the device or vice versa, and features may be modified, adapted, combined and/or replaced, etc. in order to come to further embodiments of the invention.

In the following, advantageous embodiments of the invention of concepts 2 and 3 will be described with reference to the enclosed drawings of concept 3. However, neither the drawings nor the description shall be interpreted as limiting the invention.

DESCRIPTION OF THE DRAWINGS

Figure 14:
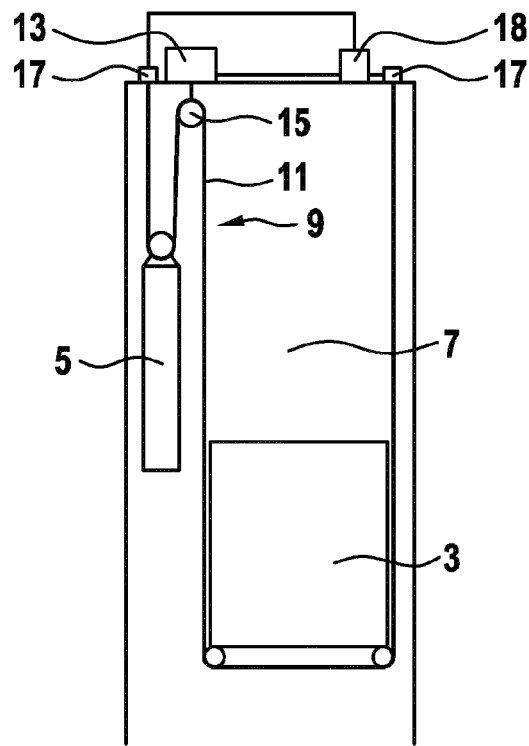

FIG. 14 shows an elevator in which a method according to an embodiment of the invention may be applied.

Figure 15:
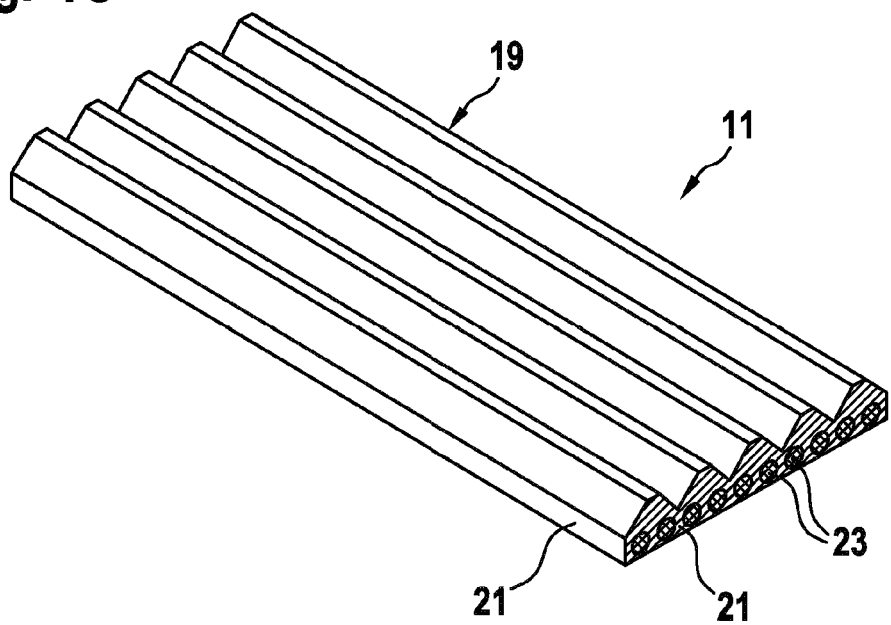

FIG. 15 shows a suspension member.

Figure 16:
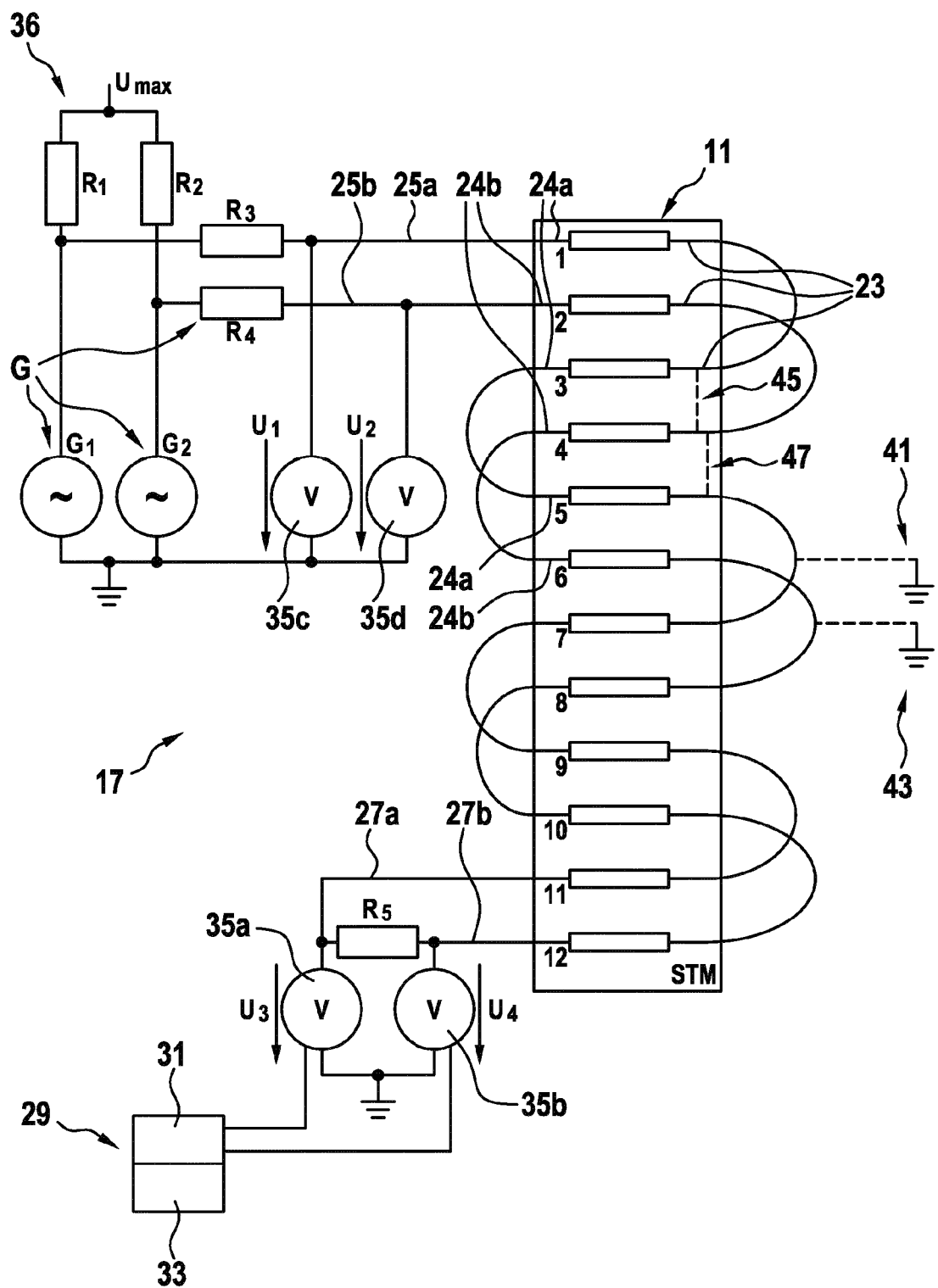

FIG. 16 shows a measurement arrangement for detecting the deterioration state in the suspension member arrangement according to an embodiment of the present invention.

Figure 17:
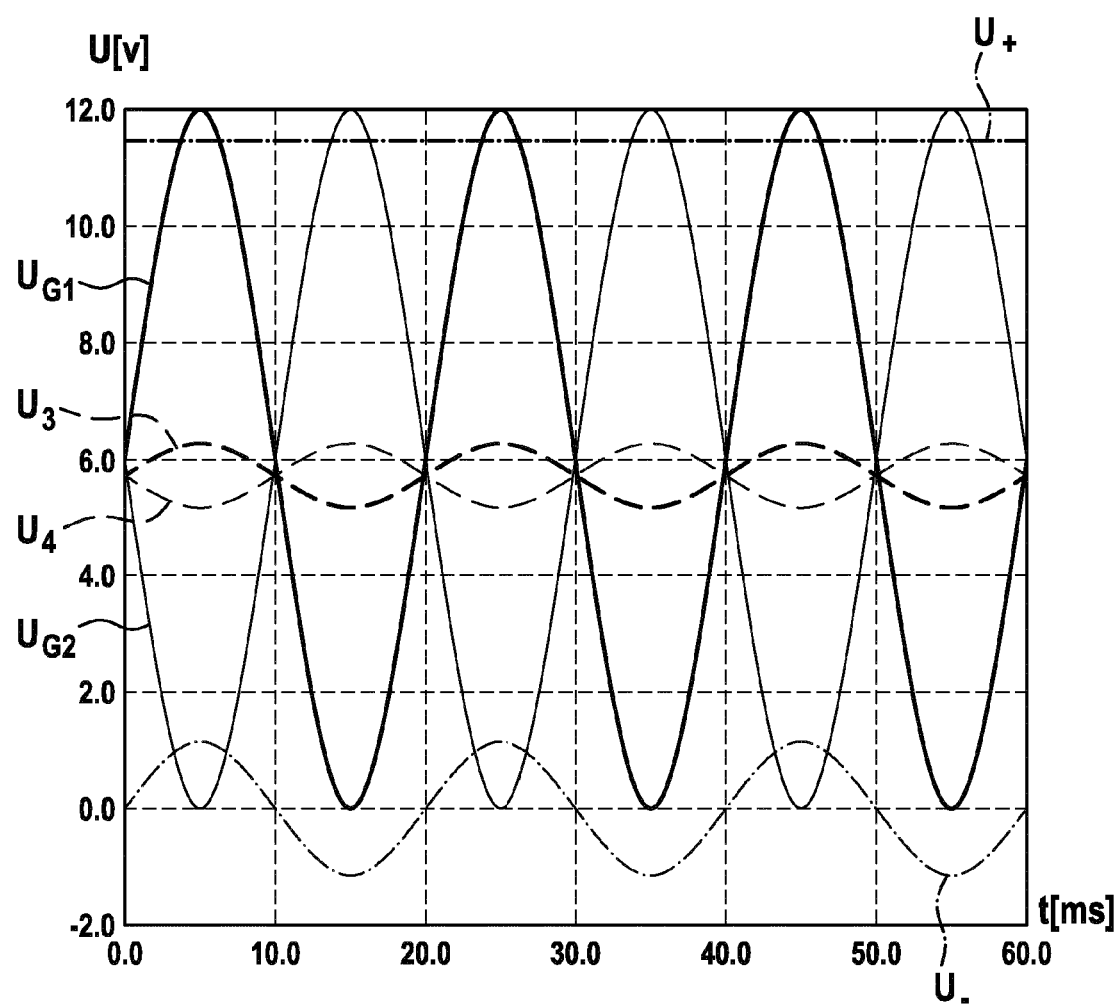

FIG. 17 shows time-dependent first and second voltages $U_1$, $U_2$ generated and applied at the first end of a suspension member and a resulting third and fourth voltages $U_3$, $U_4$ at a second end of the suspension member in a case where no significant deterioration is present at the suspension member.

Figure 18:
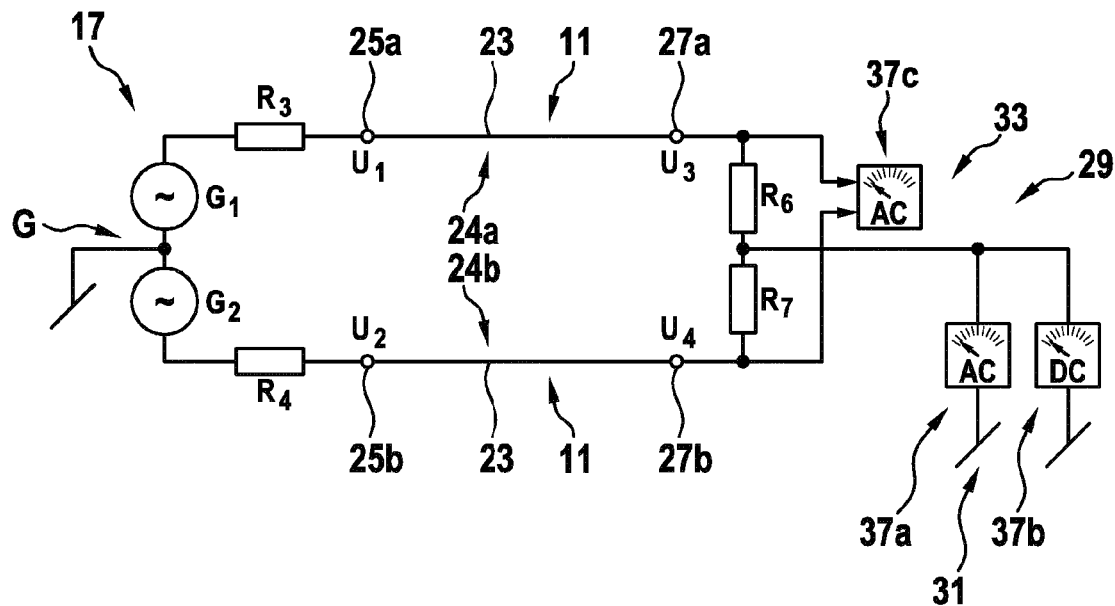

FIG. 18 shows a measurement arrangement for detecting the deterioration state in the suspension member arrangement according to an alternative embodiment of the present invention.

Figure 19:
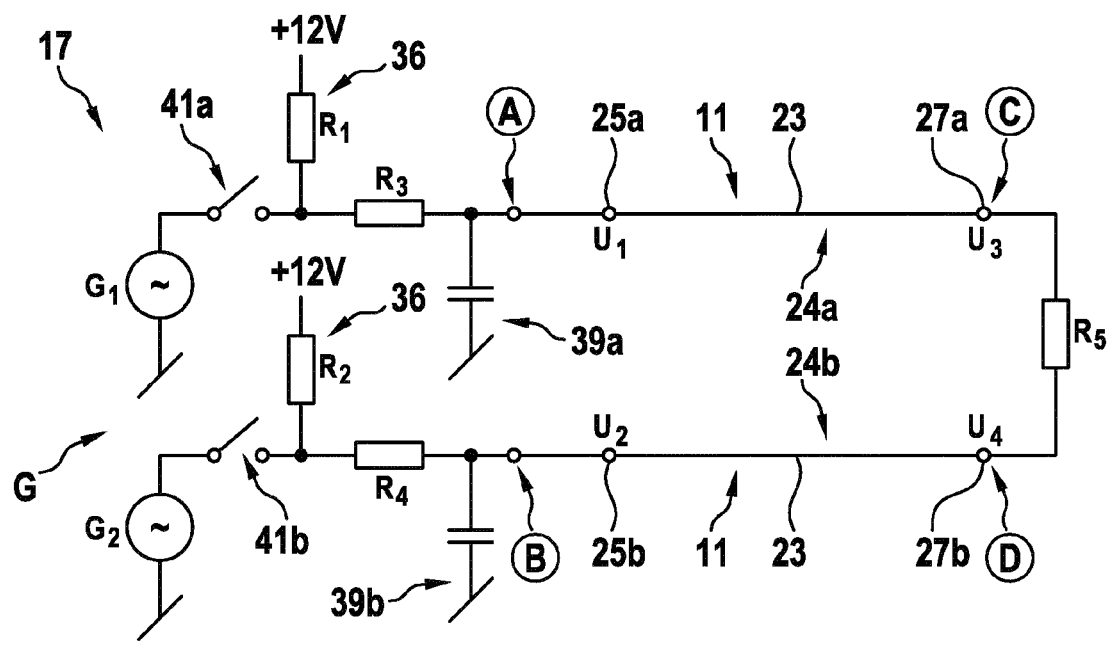

FIG. 19 shows a measurement arrangement for detecting the deterioration state in the suspension member arrangement according to a further alternative embodiment of the present invention.

Figure 20:
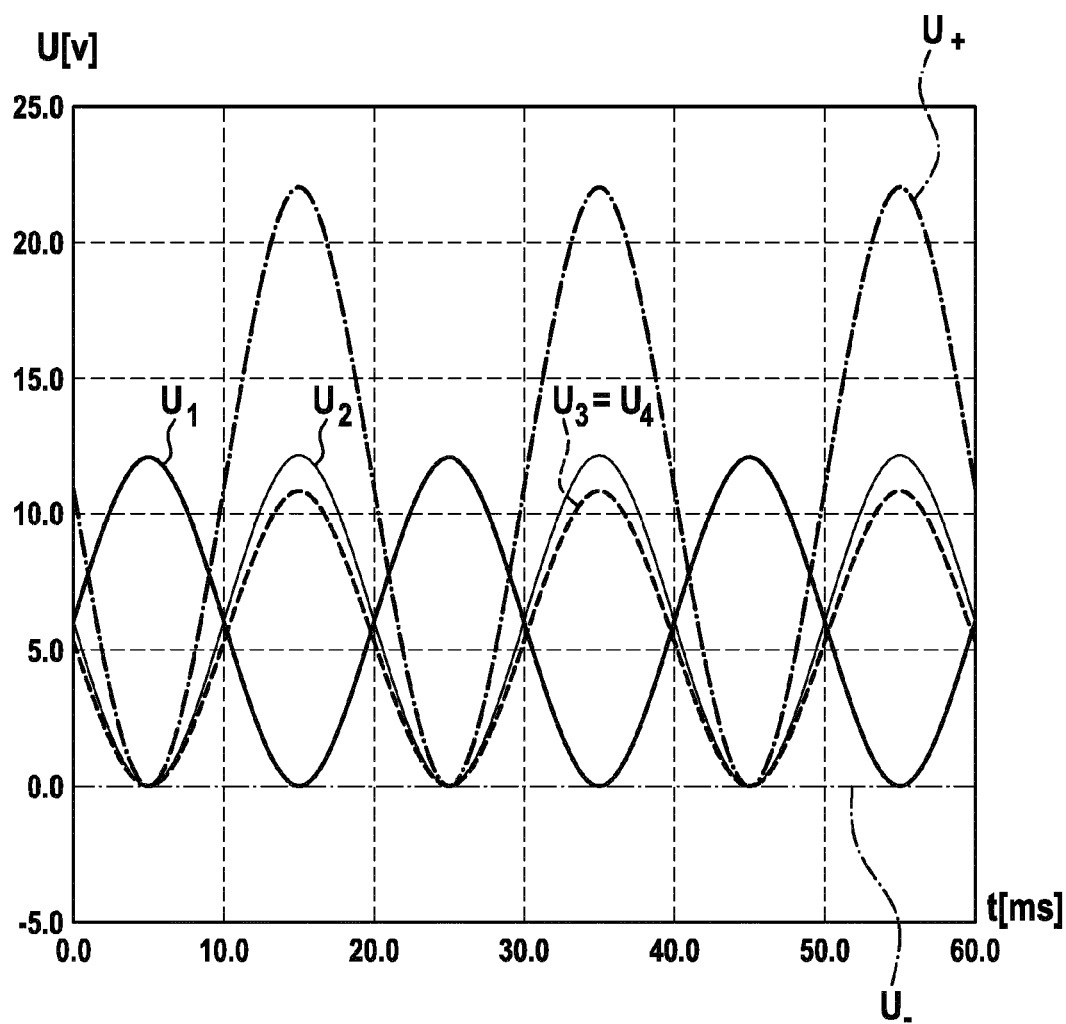

FIG. 20 shows time-dependent first and second voltages $U_1$, $U_2$ generated and applied at the first end of a suspension member and a resulting third and fourth voltages $U_3$, $U_4$ at the second end of the suspension member in a case where a cord in only one of the group of cords is broken.

Figure 21:
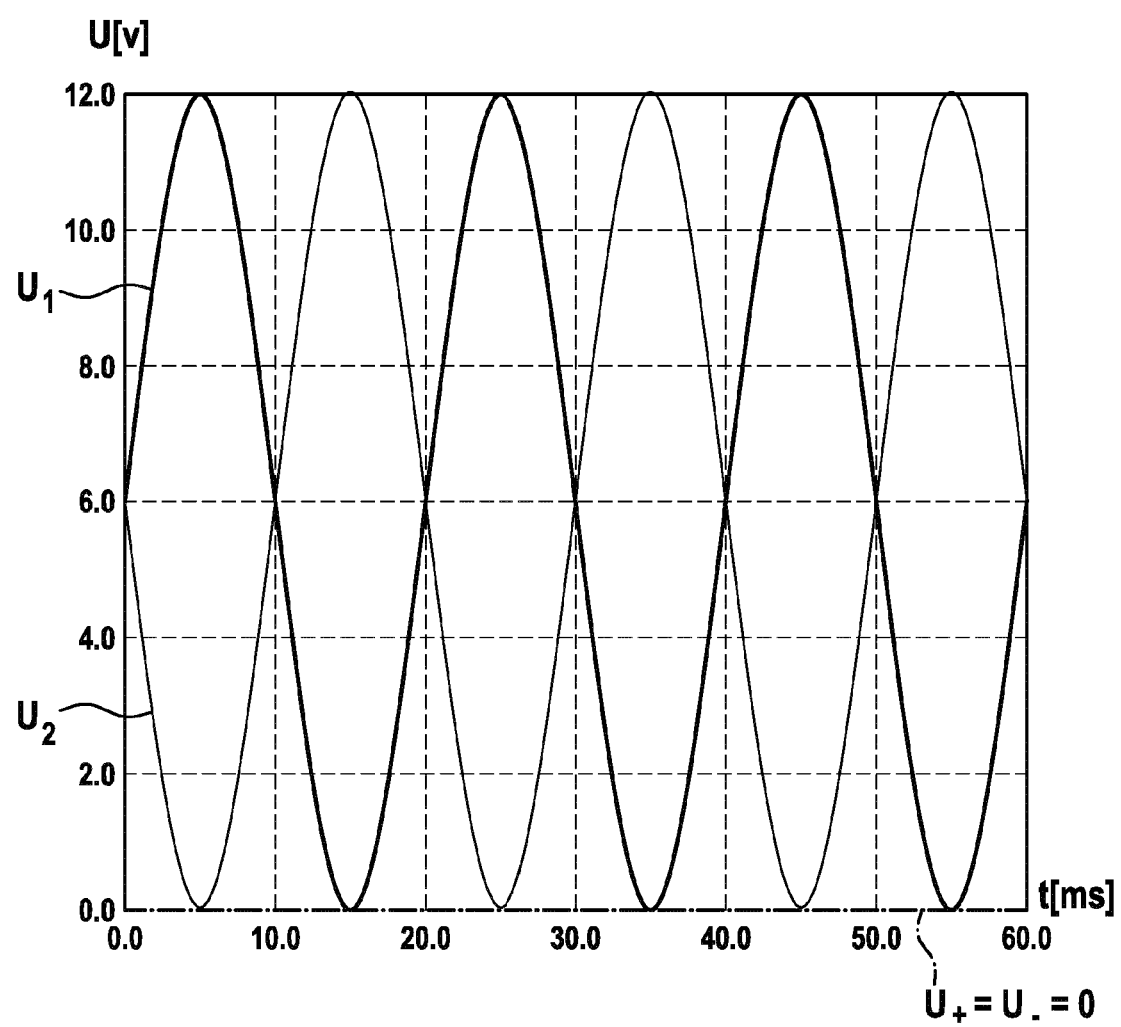

FIG. 21 shows the time-dependent voltages $U_1$, $U_2$, $U_3$, $U_4$ in a case where an electrical connection between the suspension member and an alternating voltage generator arrangement and/or measurement arrangements is interrupted or in a case where cords in both groups of cords are broken.

Figure 22:
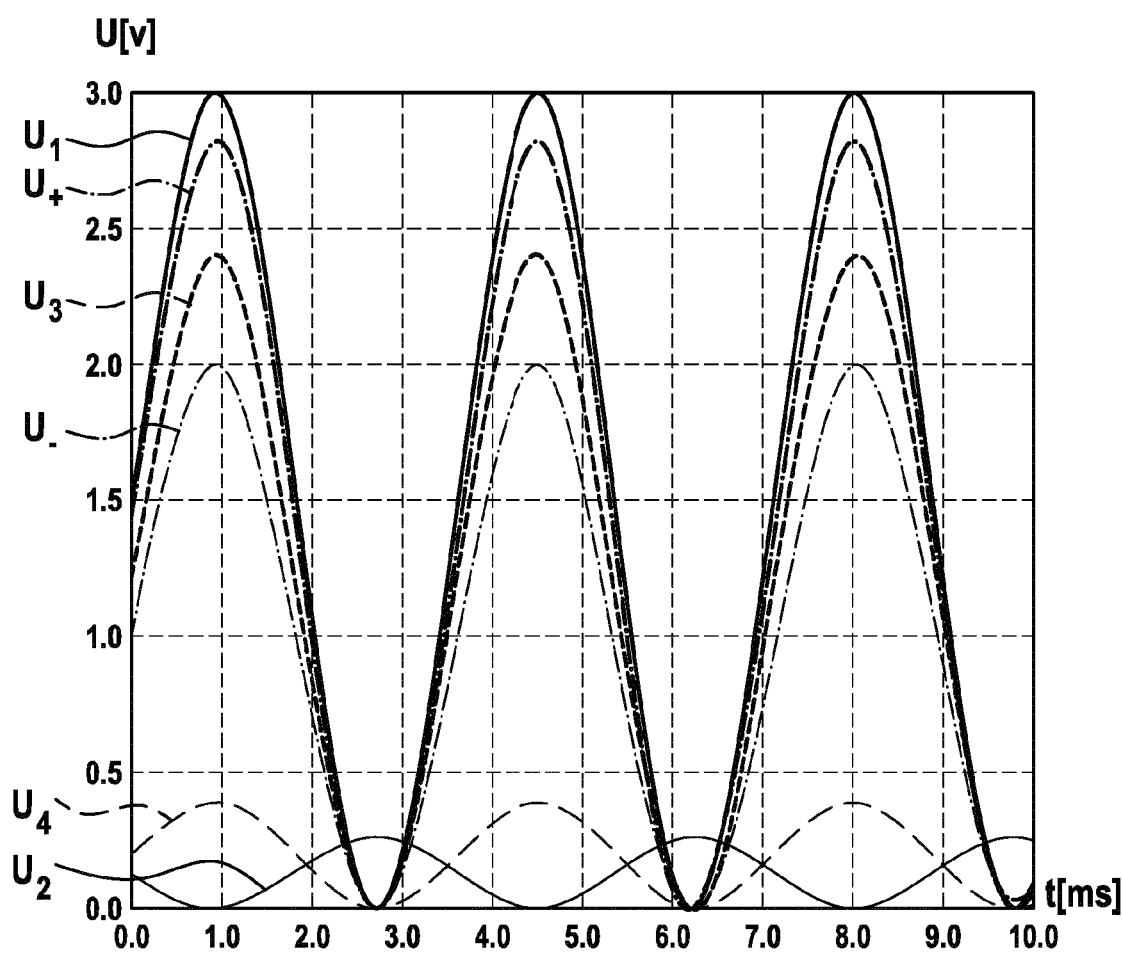

FIG. 22 shows time-dependent voltages $U_1$, $U_2$, $U_3$, $U_4$ in a case where one or more of the cords comprised in one of the groups of cords is electrically connected to ground.

Figure 23:
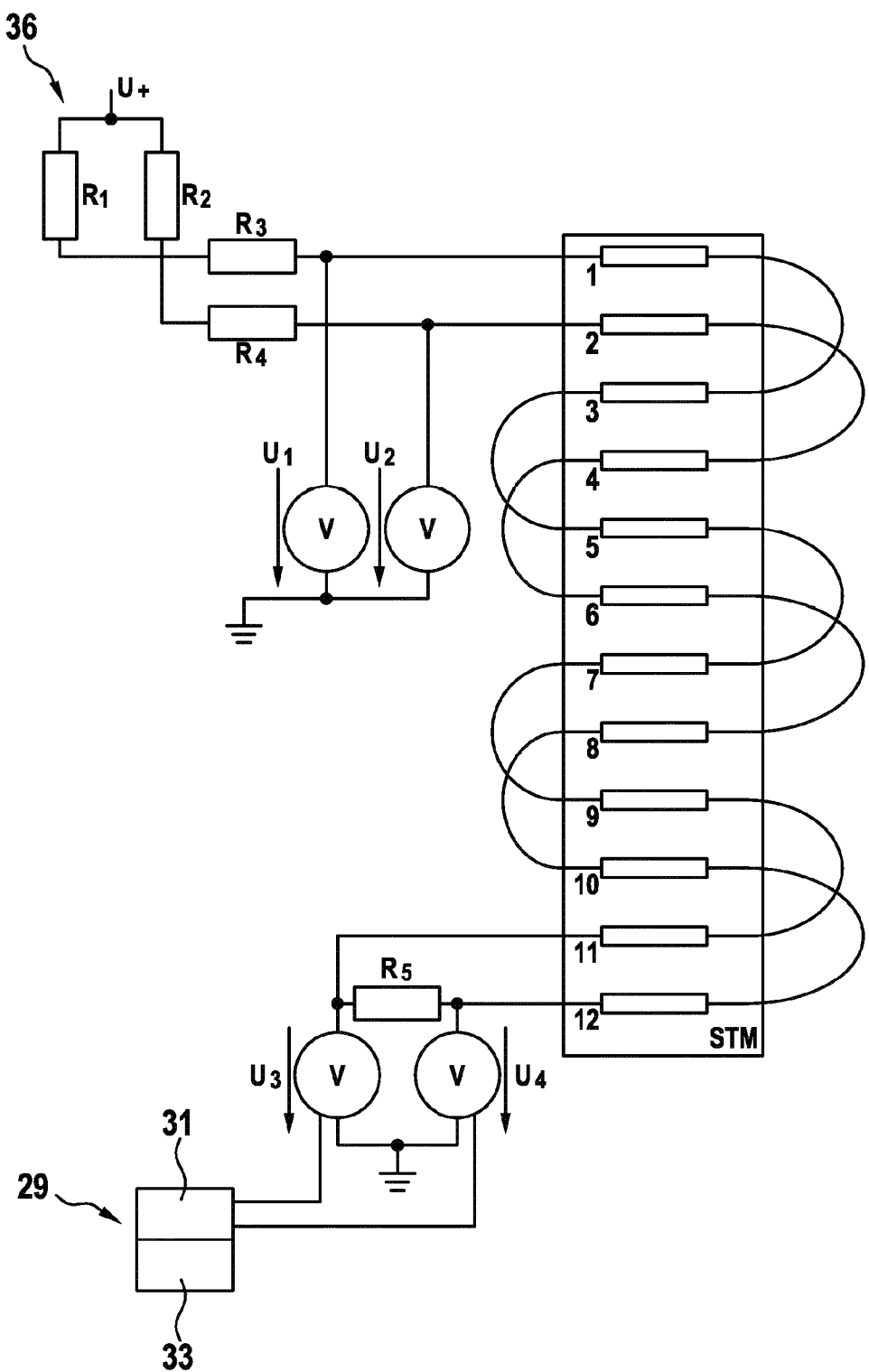

FIG. 23 depicts a measurement arrangement of FIG. 16 in an idle mode.

Figure 24:
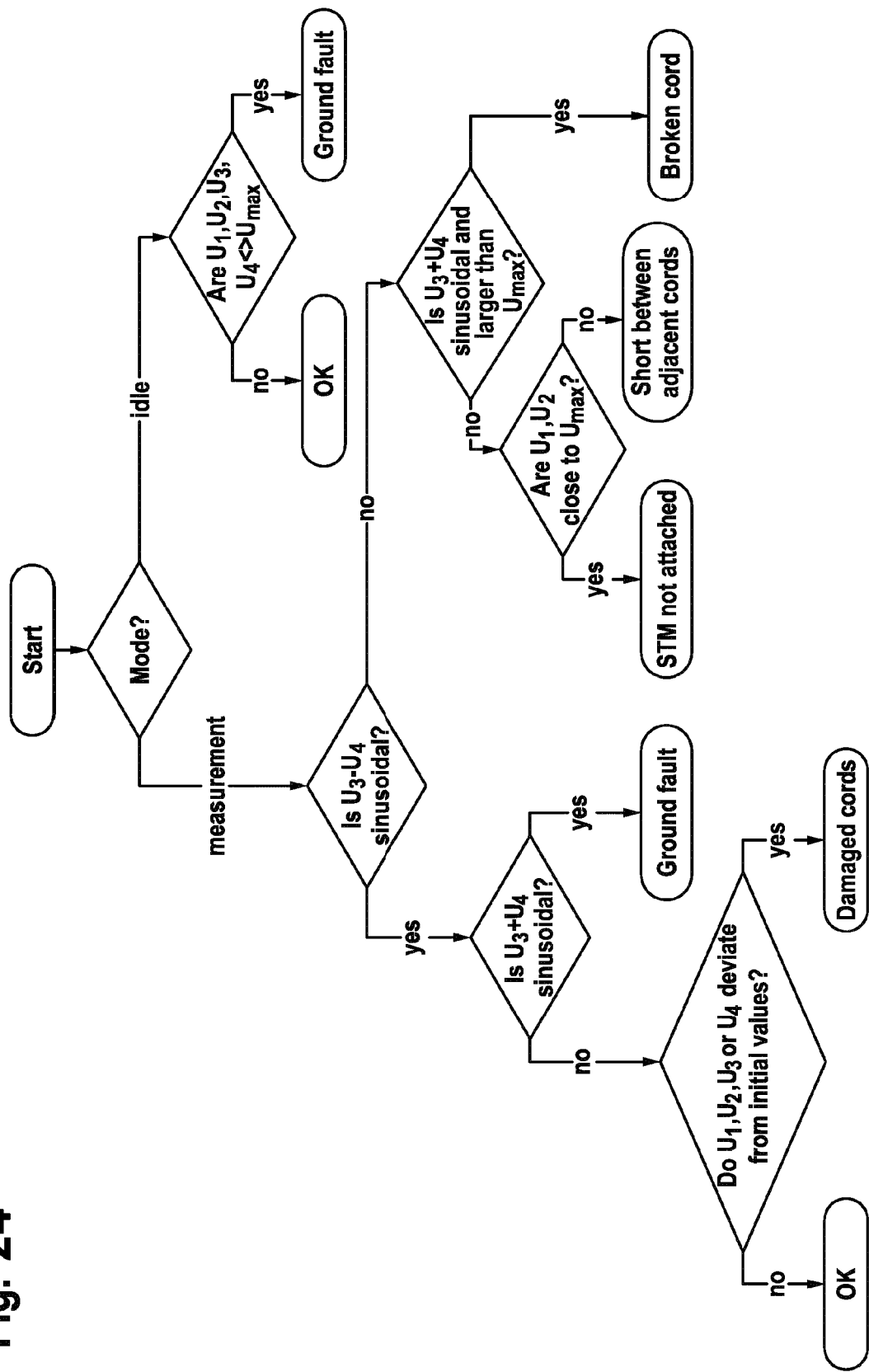

FIG. 24 shows the flowchart visualising varieties voltage measurement results and their correlation to varieties possible cases of suspension member deterioration.

Figure 25:
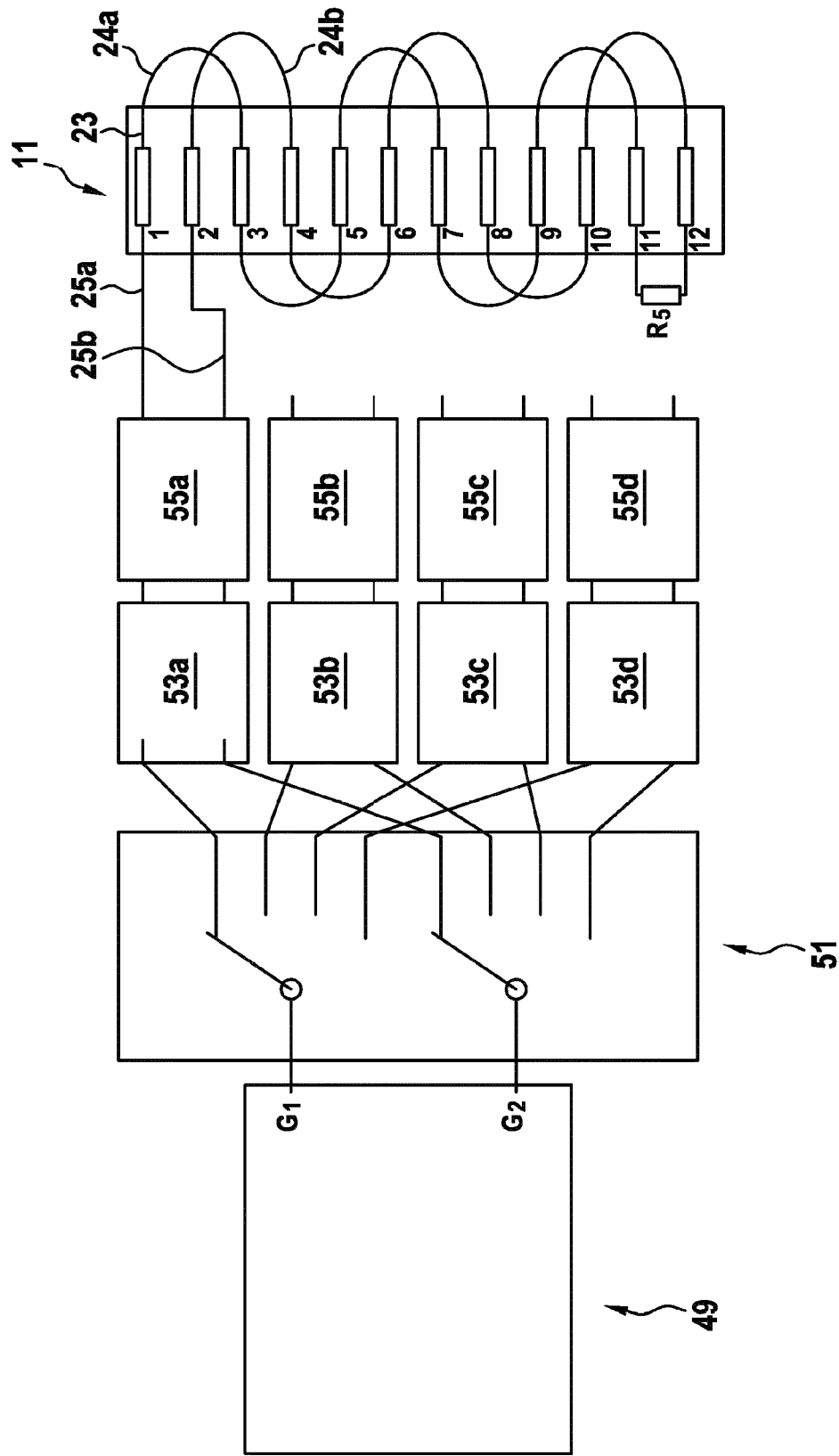

FIG. 25 shows a device for detecting the deterioration state in a suspension member arrangement comprising multiple suspension members according to an embodiment of the present invention.

Figure 26:
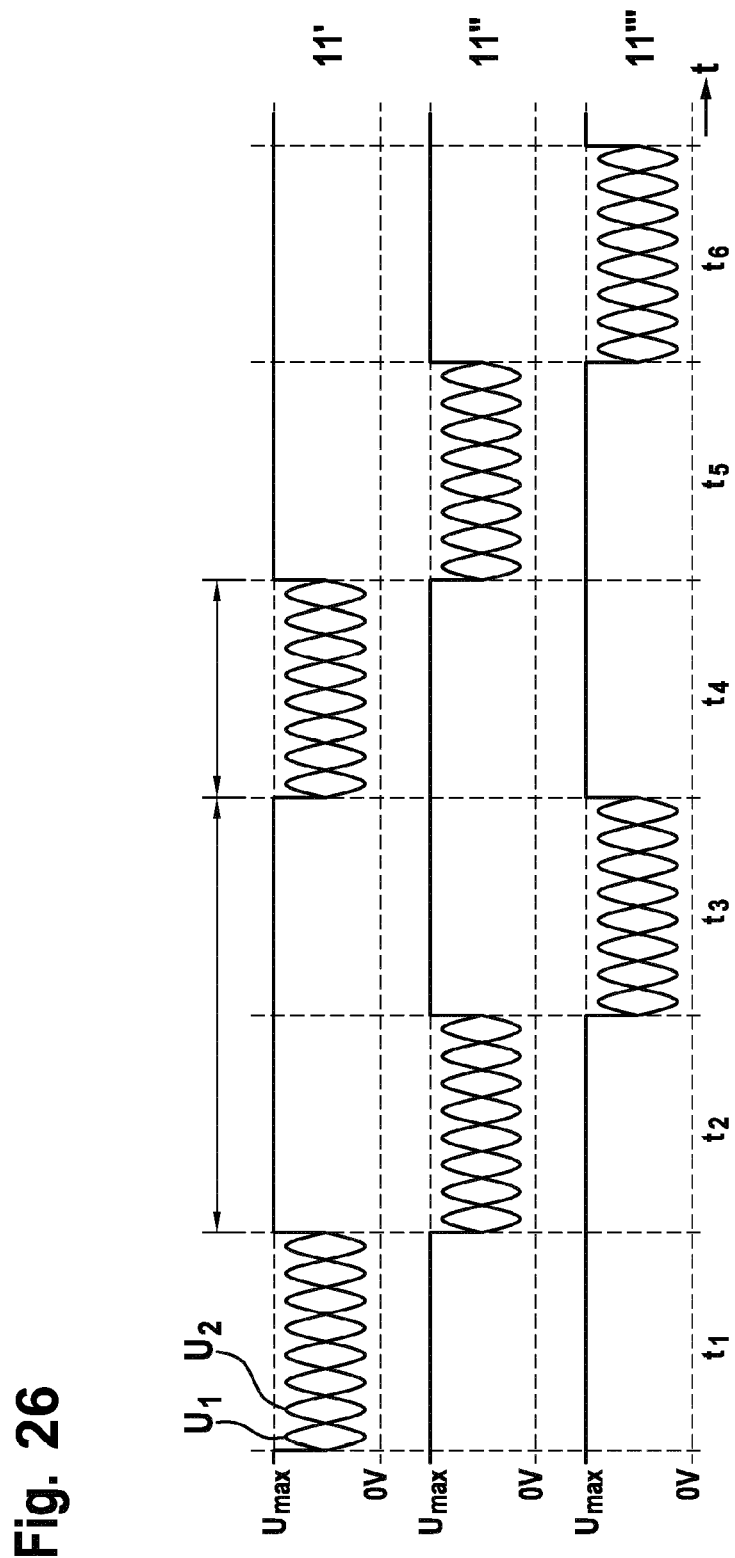

FIG. 26 shows a time dependence in the method for determining deterioration states in the suspension member arrangement comprising multiple suspension members according to an embodiment of the present invention.

Figure 27:
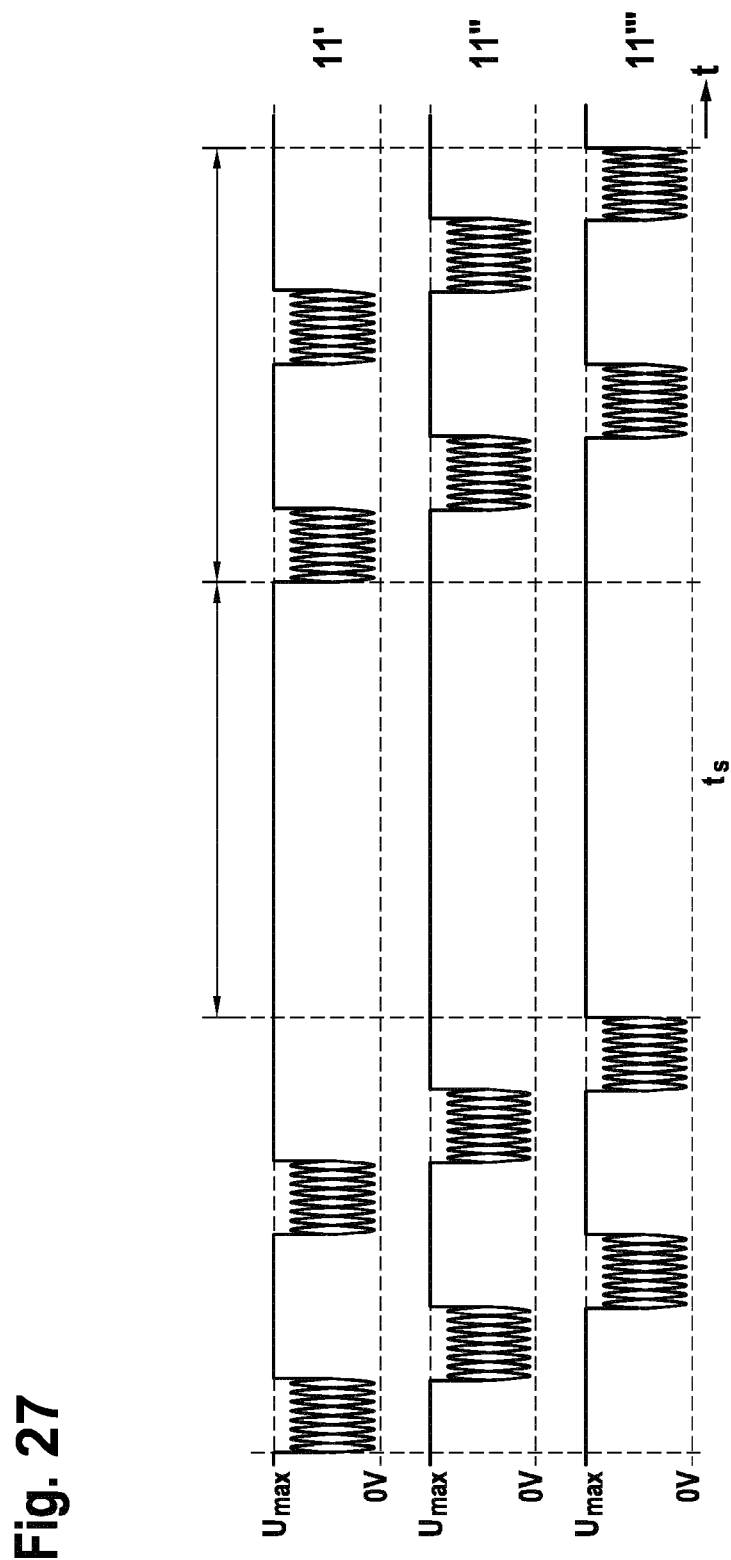

FIG. 27 shows a time dependence in the method for determining deterioration states in the suspension member arrangement comprising multiple suspension members according to an alternative embodiment of the present invention.

The figures are only schematic representations and are not to scale. Same reference signs refer to same or similar features throughout the figures.

DETAILED DESCRIPTION

FIG. 14 shows an elevator 1 in which a device according to an embodiment of the present invention may be implemented.

The elevator 1 comprises a cabin 3 and a counterweight 5 which may be displaced vertically within an elevator shaft 7. The cabin 3 and the counterweight 5 are suspended by a suspension member arrangement 9. This suspension member arrangement 9 comprises one or more suspension members 11. Such suspension members 11 may be for example ropes, belts, etc. In the arrangement shown in FIG. 14, end portions of the suspension members 11 are fixed to a supporting structure of the elevator 1 at a top of the elevator shaft 7. The suspension members 11 may be displaced using an elevator traction machine 13 driving a traction sheave 15. An operation of the elevator traction machine 13 may be controlled by a control device 18. For example at opposite end portions of the suspension member arrangement 9 components of a device 17 for detecting a deterioration state in the suspension member arrangement 9 may be provided.

It may be noted that the elevator 1 and particularly its suspension member(s) 11 and its device 17 for detecting the deterioration may be configured and arranged in various other ways than those shown in FIG. 14.

The suspension members 11 to be driven for example by the traction machine 13 may utilize metal cords or ropes to support a suspended load such as the cabin 3 and/or the counterweight 5 that is moved by the traction machine 13.

FIG. 15 shows an example of a suspension member 11 which is embodied with a belt 19. The belt 19 comprises a plurality of cords 23 which are arranged parallel to and spaced from each other. The cords 23 are enclosed in a matrix material 21 forming, inter alia, a coating. Such coating may mechanically couple neighbouring cords 23. The coating may have a textured or profiled surface including longitudinal guiding grooves. The cords 23 may typically consist of or comprise wires made from a metal such as steel. The matrix material 21 may consist of or comprises a plastic or elastomeric material. Accordingly, the cords 23 are typically electrically conductive such that an electric voltage may be applied to and/or an electric current may be fed through the cords without significant losses. Furthermore, the cords 23 are preferably electrically isolated from each other via the interposed electrically insulating matrix material 21 such that, as long as an integrity of the coating is not deteriorated, an electrical current or voltage between neighbouring cords cannot be transmitted, i.e. no significant shunt current can flow from one cord 23 to another.

Alternatively, suspension members 11 may have other shapes or configurations. For example, a belt may have several cords included into a body formed of matrix material, the body being non-profiled (i.e. flat) or having other shapes as those shown in FIG. 15. Alternatively, each cord may be enclosed by matrix material forming a kind of coating wherein the coated cords are separate from each other, i.e. not connected to each other via common matrix material. Generally, the suspension members 11 may be provided as coated steel suspension members.

Typically, wires or cords of the suspension member 11 have a specified minimum strength to ensure an integrity of the suspension member arrangement 9 during its use in an application within an elevator 1. In certain suspension applications, such as for lifts or elevators, a factor-of-safety requirement for strength combined with other measures, such as protective coating of the cords 23 for example within the matrix material 21, may sustain an initial strength of a suspension member beyond an effective life of the protective measures employed to retain strength.

Particularly in such cases, where the initial strength of the suspension member 11 is not expected to change during its useful life in an application, a simple electronic method may be employed and may be sufficient to detect an indication that for example initial physical properties of the suspension members have unexpectedly changed and trigger for example a replacement of the suspension member 11 or other counter-measures.

Prior Art Approaches

In prior art, methods have been employed to ensure that suspension members do not fall below a specified minimum strength, such methods involving for example visually counting of broken wires of cords or wire rope strands over a length of the suspension members. Alternatively, complex electronic methods that measure small changes in an electrical resistance of for example metal cords and compare such measurements with reference values or a rate of change in resistance have been proposed.

Although such methods may be effective, they may have certain disadvantages. For example, counting broken wires may be a tedious task to be periodically performed by persons maintaining the suspension members of an elevator and may be flawed by human error. In cases where suspension members have an opaque coating on the metal cords or the metal cords are incorporated into a matrix material, it is generally not possible to visually count broken wires. Where methods employ monitoring a change in electrical resistance or impedance of metal cords, the measurements are generally made across electrical connections to the steel cords and may introduce, by nature of such electrical connections, a significant source of possible errors due to for example very low values of electrical resistances being monitored. Furthermore, over time, such electrical connections may deteriorate due to effects of e.g. oxidation and/or contamination and may increase a potential for errors by the monitoring method. Additionally, such methods typically involve complex circuits necessary for measuring the very small changes in resistance or impedance and comparing them for example to target reference resistance values that may drift over time or due to effects of temperature. Furthermore, some prior art approaches may require extensive correlation to map a change in resistance or impedance of the steel cords with changes in a strength and/or physical deterioration of the steel cord.

New Approach

Accordingly, there may be a need for a less complex and/or more effective monitoring method for detecting a deterioration in suspension members in an elevator, particularly, in case these suspension members are expected to retain their initial strength over the life of their application.

As described herein, a simple and reliable method may be achieved using a two-phase current monitoring of e.g. steel cords in a suspension member, particularly where only a significant change in initial physical conditions of the cords need to be monitored.

FIG. 16 shows an exemplary embodiment of a device 17 for detecting a deterioration state in a suspension member arrangement 9 for an elevator 1. Therein, the suspension member arrangement 9 may comprise one or more suspension members 11 such as for example belts as shown in FIG. 15 including a plurality of electrically conducting cords 23. In FIG. 16, the cords 23 are only indicated schematically as twelve elongate cords 23 being arranged parallel to each other.

The multiplicity of cords 23 may be divided into two groups 24a, 24b of cords. For example, a first group 24a of cords may comprise all odd numbered cords 23 whereas a second group 24b of cords may comprise all even numbered cords 23.

The device 17 comprises an alternating voltage generator arrangement G which is adapted for applying a first alternating voltage $U_1$ to a first end 25a of the first group 24a of cords 23 and for applying a second alternating voltage $U_2$ to a first end 25b of the second group 24b of cords 23.

In the embodiment shown in FIG. 16, the alternating voltage generator arrangement G comprises a first alternating voltage generator $G_1$ and a second alternating voltage generator $G_2$. The two alternating voltage generators $G_1$, $G_2$ may be separate devices and may operate in principle independently from each other. However, the two alternating voltage generators $G_1$, $G_2$ should be synchronized such as to operate with a stationary phase relationship with respect to each other.

The alternating voltage generators $G_1$, $G_2$ are electrically connected, on their one side, to an electrical ground potential, whereas, on their other side, they are electrically connected to the first ends 25a, 25b of the first and second groups 24a, 24b of cords 23, respectively. The alternating voltage generators $G_1$, $G_2$ generate first and second generated voltages $U_{G1}$, $U_{G2}$, respectively.

An internal electrical resistance of each of the alternating voltage generators $G_1$, $G_2$ is represented in FIG. 16 by $R_3$, $R_4$. Due to such internal resistances $R_3$, $R_4$, the actual first and second voltages $U_1$, $U_2$ applied to the cords 23 may generally be lower than the generated voltages $U_{G1}$, $U_{G2}$ generated by the alternating voltage generators $G_1$, $G_2$ themselves.

The alternating voltage generator arrangement G with its alternating voltage generators $G_1$, $G_2$ is configured to generating the first and second alternating voltages $U_1$, $U_2$ with same waveforms and with a fixed phase difference of essentially 180°. Therein, the waveforms should differ from each other at most by an acceptable tolerance of for example less than 5% and the phase difference should differ from 180° at most by an acceptable tolerance of for example less than 10°, preferably less than 5° or less than 2°.

In examples and embodiments described herein below, it will be assumed that the alternating voltage generator arrangement G has a specific exemplary implementation in which it generates first and second generated voltages $U_{G1}$, $U_{G2}$ having an amplitude of 6 V and oscillating around a DC voltage of 6 V. In other words, the first and second generated voltages $U_{G1}$, $U_{G2}$ oscillate between $U_{min}=0$ V and $U_{max}=12$ V. Therein, the waveform is sinusoidal. An oscillation frequency is selected to be 280 Hz. The internal resistances $R_3$, $R_4$ are selected to be 450 Ohm.

However, it shall be noted that the alternating voltage generator arrangement G may be implemented in various other manners. For example, the first and second generated voltages $U_{G1}$, $U_{G2}$ may be generated with other waveforms such as rectangular waveforms or triangular waveforms. Furthermore, the amplitude and/or frequency of the first and second alternating generated voltages $U_{G1}$, $U_{G2}$ may be selected in various other manners. For example, the generated voltages $U_{G1}$, $U_{G2}$ may oscillate between other minimum and maximum voltages $U_{min}$, $U_{max}$. Specifically, the alternating voltages do not necessarily have to oscillate around a fixed non-zero DC voltage but may also oscillate around 0 V, i.e. oscillate between a negative voltage $-U_{max}$ and a positive voltage $+U_{max}$. Such implementation may be advantageous with respect to electro-corrosion characteristics.

Furthermore, the internal resistances $R_3$, $R_4$ may be selected in various manners and may be specifically adapted to a specific application, for example depending on electrical resistances generated by the cords 23 to which the first and second alternating voltages $U_1$, $U_2$ shall be applied.

Furthermore, instead of providing the alternating voltage generator arrangement G with two separate alternating voltage generators $G_1$, $G_2$, a single alternating voltage generator may be provided and this single alternating voltage generator may provide for a direct output and an inverse output such that alternating generated voltages $U_{G1}$, $U_{G2}$ may be output with a phase-shift of 180°. For example, such single alternating voltage generator may be coupled to a transformer including for example a primary and a secondary coil wherein an inverse output voltage may be generated at a contact in a middle of the secondary coil, such inverse voltage output being shifted by 180° to a direct voltage output generated at outer contacts of the secondary coil. In such embodiment, the first and second alternating voltages $U_1$, $U_2$ are automatically synchronized with a stationary phase-shift of 180° such that, for example, no specific synchronization of two separate alternating voltage generators $G_1$, $G_2$ is required.

The first alternating voltage $U_1$ is applied to the first end 25*a* of the first group 24*a* of cords 23 of a suspension member 11 whereas the second alternating voltage $U_2$ is applied to a first end 25*b* of the second group 24*b* of cords 23 of the same suspension member 11. Within one group of cords 24*a*, 24*b*, all cords 23 comprised in this group 24*a*, 24*b* may be electrically connected to each other.

Preferably, the cords 23 of one group 24*a*, 24*b* are connected in series. In such series connection, for example all odd numbered cords 1, 3, 5, etc. are electrically connected in series to each other such as to form a kind of long single electrical conductor. Similarly, all even numbered cords 2, 4, 6, etc. may be connected in series. In such implementation, the first alternating voltage $U_1$ may be applied for example to a first end 25*a* of the first group 24*a* of cords 23 being formed by a free end of a cord 23 number 1, an opposite end of this cord number 1 being electrically connected in series to an end of a cord number 3, an opposite end of this cord number 3 again being electrically connected to a free end of a cord number 5 and so on. Accordingly, a second end 27*a* of this first group 24*a* of cords 23 is formed by a free end of a last odd numbered cord 23. Similarly, all even numbered cords 23 may be connected in series such as to electrically connect a first end 25*b* of this second group 24*b* of cords 23 to an opposite second end 27*b* via a single long conductor formed by the series of even numbered cords 23. In such series connection arrangement, both alternating voltages $U_1$, $U_2$ applied to first ends 25*a*, 25*b* of both groups 24*a*, 24*b* of cords 23 are transferred throughout the entire series connections formed in both groups 24*a*, 24*b* by the respective cords 23 comprised therein. Accordingly, when no electric current flows, the first and second alternating voltages $U_1$, $U_2$ also apply to the second ends 27*a*, 27*b* of both groups of cords 24*a*, 24*b*. However, in case any electric current is flowing through the cords 23 as a result of the applied alternating first and second voltages $U_1$, $U_2$, such current has to be transferred through the respective group 24*a*, 24*b* of cords 23 and thus experiences electrical resistances created by the respective cords 23. As a result, voltage drops occur throughout the respective cords 23. Accordingly, by measuring third and fourth voltages $U_3$, $U_4$ at opposite second ends 27*a*, 27*b* of each group 24*a*, 24*b* of cords 23, information about a condition within the groups 24*a*, 24*b* of cords 23 may be derived as it may be for example determined whether any electric current flows through the cords 23 in each of the groups 24*a*, 24*b* and, if this is the case, how such current "behaves".

In order to connect the alternating voltage generator arrangement G to the suspension member and suitably interconnecting all cords 23 in advantageous series connections, a connector arrangement (not shown in FIG. 16 for clarity of visualization) for establishing a series connection of all even numbered cords in the suspension member and a series connection of all odd numbered cords in the suspension member and for establishing an electrical connection for applying the first and second alternating voltages ($U_1$, $U_2$) to first ends of the series connection of even numbered cords and the series connection of odd numbered cords, respectively, may be provided.

As a side note only, it shall be noticed that the first and second groups 24*a*, 24*b* of cords 23 may be arranged and electrically connected in various other ways. For example, while it may be advantageous to include all even numbered cords and all odd numbered cords in one of the groups 24*a*, 24*b* of cords 23, respectively, it may also be possible to include each of the cords 23 of one or more suspension members 9 in other configurations to the two groups 24*a*, 24*b* of cords 23. For example, all cords 1 to n may be comprised in the first group 24*a*, whereas all cords n+1 to x may be comprised in the second group of cords 24*b*. Preferably, both groups 24*a*, 24*b* of cords 23 comprise a same number of cords 23. Furthermore, while it may be beneficial to connect all cords 23 of one group 24*a*, 24*b* in series to each other, also parallel electrical connections of all or some of the cords 23 comprised in one of the groups 24*a*, 24*b* may be possible.

At the second ends 27*a*, 27*b* of both groups 24*a*, 24*b* of cords 23, a first voltage measurement arrangement 31 and/or a second voltage measurement arrangement 33 may be provided as forming part of a determination unit 29. These components 29, 31, 33 are shown in FIG. 16 only in a schematic manner.

The first voltage measurement arrangement 31 may be adapted for determining a summed voltage $U_+$ which correlates to a sum of a third volume $U_3$ and a fourth voltage $U_4$. Therein, the third voltage $U_3$ applies between the second end 27*a* of the first group 24*a* of cords 23 and a common electrical potential such as a ground potential. The fourth voltage $U_4$ applies between a second end 27*b* of the second group 24*b* of cords 23 and the common electrical potential.

The second voltage measurement arrangement 33 is adapted for determining a differential voltage $U_-$ correlating to a difference between the third voltage $U_3$ and the fourth voltage $U_4$. Therein, both the summed voltage $U_+$ and the differential voltage $U_-$ shall "correlate" to the sum and difference, respectively, of $U_3$ and $U_4$ in an unambiguous manner. For example, the summed voltage $U_+$ may be equal to the sum $U_3+U_4$ and the differential voltage $U_-$ may be equal to the difference $U_3-U_4$. Alternatively, the summed voltage $U_+$ and/or the differential voltage $U_-$ may correlate to such sum $U_3+U_4$, $U_3-U_4$, respectively, in other manners such as being for example a multiple thereof. For example, $U_+$ may be equal to $x*(U_3+U_4)$ and/or $U_-$ may be equal to $y*(U_3-U_4)$, x and y being possibly any rationale number, for example x=y=½ or x=y=2, etc.

In principle, it may be sufficient to provide the device 17 with only one of the first and second voltage measurement arrangements 31, 33 as already from such single voltage measurement arrangement determining only the summed voltage $U_+$ or the differential voltage $U_-$, some useful information about a current deterioration state of the suspension member 11 may be derived. However, in order to obtain more useful information about the deterioration state, it may be beneficial to provide the device 17 with both the first voltage measurement arrangement 31 and the second voltage measurement arrangement 33 in order to enable for example distinguishing between various types or degrees of deterioration within the suspension member 11.

In the embodiment shown in FIG. 16, the device 17 is provided with both the first and second voltage measurement arrangements 31, 33. Therein, the two voltage measurement arrangements 31, 33 are implemented by including a first and a second voltage determining unit 35a, 35b. These voltage determining units 35a, 35b and/or other voltage determining units comprised in voltage measurement arrangements of the device 17 may be e.g. electronic devices which are adapted for electronically and preferably automatically measure electric voltages within a circuitry. Therein, the first voltage determining unit 35a is connected on its one side to the second end 27a of the first group 24a of cords 23 whereas the second voltage determining unit 35b is connected with one side to the second end 27b of the second group 24b of cords 23. An opposite side of both voltage determining units 35a, 35b is connected to an electric ground potential. Accordingly, the first and second voltage determining units 35a, 35b are adapted for measuring the third voltage $U_3$ and the fourth voltage $U_4$, respectively. Both voltage determining units 35a, 35b are then connected to the determination unit 29 in which the first voltage measurement arrangement 31 is adapted for determining the summed voltage $U_+$ and the second voltage measurement arrangement 33 is adapted for determining the differential voltage $U_-$.

Additionally to the components of the circuitry explained herein before to be used during actually measuring the summed voltage and the differential voltage, the device 17 shown in FIG. 16 comprises a pull-up voltage source 36. This pull-up voltage source 36 may apply a constant DC voltage to both first ends 25a, 25b of both groups 24a, 24b of cords 23 during an idle mode in which the alternating voltage generator arrangement G is deactivated or couple-off. Such idle mode will be described further below. The constant DC voltage may be substantially equal to the maximum voltage $U_-$ of the alternating generated voltages $U_{G1}$, $U_{G2}$ generated by the alternating voltage generator arrangement G. The pull-up voltage source 36 comprises internal electrical resistances $R_1$, $R_2$.

Furthermore, the device 17 may comprise a third and a fourth voltage determining unit 35c, 35d for measuring the first and second voltages $U_1$, $U_2$, respectively. Depending on the current flowing through the entire circuitry of the device 17, voltage drops at the internal resistances $R_3$, $R_4$ of the alternating voltage generator arrangement G may differ such that the first and second voltages $U_1$, $U_2$ may differ accordingly. Thus, by measuring the first and second voltages $U_1$, $U_2$ with third and a fourth voltage determining unit 35c, 35d, information about the electrical current flowing through the circuitry may be derived. This information then includes information about the deterioration state of the suspension member 11 as the electrical current flowing through the circuitry strongly depends on electrical resistances occurring within the cords 23 of the suspension member 11.

Next, a function principle of the device 17 and a method for detecting a deterioration state in a suspension member arrangement 9 performed thereby shall be described in an exemplary manner for a state where the suspension member 11 is non-deteriorated, i.e. neither the cords 23 nor the cover 21 is deteriorated or even damaged in any manner and therefore all cords 23 have same physical and electrical characteristics. Voltages, which are generated or which are measured during such method will be described with reference to FIG. 17.

In the method for monitoring the deterioration state, the alternating voltage generator arrangement G generates two alternating voltages $U_{G1}$, $U_{G2}$ which alternate in a sinusoidal manner with a frequency of 280 Hz and an amplitude of 6 V around a base direct voltage of 6 V. Such generated voltages $U_{G1}$, $U_{G2}$ result in first and second alternating voltages $U_1$, $U_2$ (not shown in FIG. 17 for clarity reasons) which are applied to first ends 25a, 25b of the first group 24a and the second group 24b of cords 23 of the suspension member 11, respectively. Of course, depending on whether or not an electric current is flowing through the circuitry, the first and second alternating voltages $U_1$, $U_2$ may be slightly lower than the generated voltages $U_{G1}$, $U_{G2}$ due to a voltage drop in the electrical resistances $R_3$, $R_4$.

The first and second voltages $U_1$, $U_2$ are then transmitted through the series connection of odd numbered cords 23 of the first group 24a and the series connection of even numbered cords 23 of the second group 24b, respectively, such that a third and a fourth alternating voltage $U_3$, $U_4$ occur at the opposite second ends 27a, 27b of both groups of cords 24a, 24b.

When there are no shunts and no electrical connection between these two second ends 27a, 27b, no electrical current will flow such that the third and fourth alternating voltages $U_3$, $U_4$ will be the same as the applied first and second alternating voltages $U_1$, $U_2$. In other words, as long as no deterioration occurs in the suspension member 11, the third and fourth alternating voltages $U_3$, $U_4$ will exactly follow the applied first and second alternating voltages $U_1$, $U_2$. Accordingly, upon determining such alternating voltage behaviours for the third and fourth alternating voltages $U_3$, $U_4$, it may be determined that the suspension member 11 is in a normal condition in which no further action is required.

In such non-deteriorated state, due to the 180° phase-shift between the third and fourth alternating voltages $U_3$, $U_4$, a summed voltage $U_+$ corresponding to the sum of the third and fourth alternating voltages $U_3$, $U_4$ is a constant voltage, i.e. a DC voltage being the sum of the base DC voltages of the generated alternating voltages $U_{G1}$, $U_{G2}$ (i.e. in the given example: $U_3+U_4$=6 V+6 V=12 V). Accordingly, in such state, the summed voltage $U_+$ has no alternating voltage component (i.e. $U_{+,AC}$=0). A differential voltage $U_-$ corresponding to a difference of the third and fourth alternating voltages $U_3$, $U_4$ alternates with a same frequency as the generated voltages $U_{G1}$, $U_{G2}$ and with double the amplitude of these generated voltages $U_{G1}$, $U_{G2}$ around a DC voltage of 0 V (i.e. in the given example, $U_-$ alternates between −12 and +12 V).

As will be described in further detail below, in cases where the suspension member 11 is deteriorated or even damaged, such initial conditions for the third and fourth voltage $U_3$, $U_4$ do no longer apply. Particularly, when at least one of the cords 23 in the suspension member 11 is broken or if there is a short-circuit between cords 23 or if there is an electrical connection to ground for at least one of the cords 23, either an electrical connection between the first ends 25a, 25b and the second ends 27a, 27b is partly interrupted (i.e. in the case of a broken cord) or electrical currents will flow (i.e. in the case of short-circuits or connections to ground). Accordingly, in such deteriorated conditions, the third and fourth voltages $U_3$, $U_4$ will no longer follow the generated voltages $U_{G1}$, $U_{G2}$ in the same manner as in the non-deteriorated state and, as a result, the summed voltage $U_+$ and/or the differential voltage $U_-$ will change their behaviour.

Accordingly, any deviation from a state in which the summed voltage $U_+$ comprises no alternating voltage component $U_{+,AC}$ and the differential voltage $U_-$ comprises an alternating voltage being non-zero may be interpreted as indicating a deterioration or even a damage in the monitored suspension member 11.

While, in principle, a simple circuitry of the device 17 in which the second ends 27a, 27b of the first and second groups 24a, 24b of cords 23 are not electrically connected might be sufficient for monitoring the suspension member 11 as it may at least detect whether or not the suspension member 11 is deteriorated or not, it may be advantageous to modify such open circuitry by connecting the second ends 27a, 27b of the two groups 24a, 24b of cords 23 via a connecting electrical resistance $R_5$. Such connecting electrical resistance $R_5$ may have a resistance in a range of several tens or hundreds of Ohms, i.e. a resistance which is significantly higher than resistances typically occurring throughout the series connections of cords 23 in the suspension member 11 (such resistances being typically in a range of some Ohms to a few tenth of Ohms, depending on the length of the suspension member). In the example given in FIG. 16, $R_5$ is assumed to be 100 Ohm.

Due to such electrical connection of the second ends 27a, 27b and the third and fourth voltages $U_3$, $U_4$ occurring at these second ends 27a, 27b, an electrical current may flow through the entire circuitry of the device 17. As a result of such electrical current, voltage drops will occur at all resistances included in such circuitry, thereby directly influencing all voltages $U_x$ (x=1, 2, 3, 4) at the various positions within the circuitry. For example, the first and second voltages $U_1$, $U_2$ will be lower than the generated voltages $U_{G1}$, $U_{G2}$ due to the internal resistances $R_3$, $R_4$. The third and fourth voltages $U_3$, $U_4$ at the second ends 27a, 27b will be lower than the first and second voltages $U_1$, $U_2$ due to electrical resistances within the series connections of cords 23 of the suspension member 11.

Such condition is shown in the diagram of FIG. 17. Therein, the third and fourth voltages $U_3$, $U_4$ still follow the generated voltages $U_{G1}$, $U_{G2}$, i.e. are alternating voltages with a same frequency. However, both their amplitude and their DC voltage components are reduced due to the voltage drops occurring in the circuitry. However, also under these conditions, the summed voltage $U_+$ being the sum of the third and fourth voltages $U_3$, $U_4$ is a constant DC voltage, i.e. its alternating voltage component $U_{+,AC}$ is zero. The differential voltage $U_-$ being the difference between the third and the fourth voltages $U_3$, $U_4$ is again an alternating voltage having the same or inverse phase and the same frequency as the generated voltages $U_{G1}$ and $U_{G2}$, respectively.

Accordingly, also with such closed circuitry with the second ends 27a, 27b of both groups of cords 24a, 24b being connected via the connecting electrical resistance $R_5$, a state in which the summed voltage $U_+$ comprises no alternating voltage component and the differential voltage $U_-$ comprises an alternating voltage component being non-zero may be interpreted as indicating that the suspension member 11 is in a good condition whereas any deviation from such state may be interpreted as indicating a deterioration or even damage in the suspension member 11.

Next, two alternative embodiments or implementations of devices 17 for detecting the deterioration state in a suspension member arrangement 9 will be described with reference to FIGS. 18 and 19. Therein, the devices 17 follow a same operation principle as the device 17 shown in FIG. 16 but are implemented with a slightly differing circuitry. For simplification of visualization, in both FIGS. 18, 19, the series connection of cords 23 of the first and second groups 24a, 24b of cords 23 is only represented as a simple line.

In the embodiment shown in FIG. 18, the alternating voltage generator arrangement G is similar to the one shown for the embodiment of FIG. 16 and applies first and second alternating voltages $U_1$, $U_2$ to first ends 25a, 25b of first and second groups 24a, 24b of cords 23 of the suspension member 11. At opposite second ends 27a, 27b, third and fourth voltages $U_3$, $U_4$ apply. However, the determination unit 29 for determining the summed voltage $U_+$ and the differential voltage $U_-$ is implemented in a different manner than in the embodiment of FIG. 16.

Specifically, the second ends 27a, 27b are electrically connected to each other via two separate connecting electrical resistances $R_6$, $R_7$. A first voltage measurement arrangement 31 comprises a first AC voltage determining unit 37a and a first DC voltage determining unit 37b. Both first voltage determining units 37a, 37b are connected to a centre point 38 between the separate connecting electrical resistances $R_6$, $R_7$, on the one side, and a ground potential, on the other side. Accordingly, these first voltage determining units 37a, 37b may measure an alternating voltage component $U_{+,AC}$ and a direct voltage component $U_{+,DC}$ of a summed voltage $U_+$ being proportional to the sum of the third and fourth voltages $U_3$, $U_4$. Specifically, assuming that $R_6=R_7$, the summed voltage $U_+$ is in this case $U_+=(U_3+U_4)/2$. A second voltage measurement arrangement 33 comprises a second voltage determining unit 37c which is directly connected to each of the second ends 27a, 27b. Accordingly, this second voltage determining unit 37c measures a voltage difference between the second ends 27a, 27b. In other words, the second voltage determining unit 37c measures a differential voltage $U_-$ corresponding to $U_3-U_4$. Specifically, it may be sufficient that this second voltage determining unit 37c only measures an alternating voltage component $U_{-,AC}$ of such differential voltage $U_-$.

FIG. 19 shows an embodiment of the device 17 which largely corresponds to the embodiment shown in FIG. 16. For simplification of visualization, letters "A" to "D" shall represent voltage measurement arrangements for measuring the first to fourth alternating voltages $U_1$, $U_2$, $U_3$, $U_4$ at respective locations at first ends 25a, 25b and second ends 27a, 27b of the groups 24a, 24b of cords 23 comprised in the suspension member 11. Furthermore, the first ends 25a, 25b are capacitively connected to a ground potential via capacitors 39a, 39b. Furthermore, the circuitry of the device 17 comprises switches 41a, 41b via which the alternating voltage generators $G_1$, $G_2$ of the alternating voltage generator arrangement G may be selectively electrically connected to a remainder of the circuitry including the cords 23 of the suspension member 11. When such switches 41a, 41b are in their open states, the entire circuitry is set to an idle mode and is pulled up to a pull-up voltage via the pull-up voltage source 36.

Next, some deterioration states or even damage states in a suspension member 11 and ways for detecting such deterioration states with the device and method proposed herein will be described. For some of these cases, typically occurring voltages will be explained with reference to FIGS. 20 to 22.

i) Broken Cord

A critical state to be determined in a suspension member 11 is a case where at least one of the cords 23 comprised in the suspension member 11 is broken. Such broken cord may reduce the load bearing capacity of the suspension member 11 such that the suspension member 11 might have to be replaced.

In case a single cord 23 is broken or multiple cords comprised in either one of the first and second groups 24a, 24b of cords 23 are broken, an electrical connection between a respective first end 25a, 25b and an associated second end 27a, 27b of one of the groups 24a, 24b of cords is interrupted. Accordingly, the entire circuitry of the device 17 is open, i.e. there is no closed electrical circuit anymore, and no electrical current flows any more through the connecting electrical resistance $R_5$. As a result, both the third and the fourth voltages $U_3$, $U_4$ are same and follow the respective one of the generated voltages $U_{G1}$, $U_{G2}$ connected to the group of cords 24a, 24b that is not broken. Thus, the third voltage $U_3$ and the fourth voltage $U_4$ are in phase (i.e. no phase-shift any more) and have the same phase angle as the connected one of the alternating voltage generators $G_1$, $G_2$.

The occurring voltages are shown in the diagram of FIG. 20. While the first and second voltages $U_1$, $U_2$ follow the generated alternating voltages $U_{G1}$, $U_{G2}$ (not visualized in FIG. 20 for simplification), it is assumed that at least one of the cords 23 comprised in the first group 24a of cords is broken whereas no cord 23 in the second group 24b of cords is broken such that the third and fourth voltages $U_3$, $U_4$ are same and follow the second alternating voltage $U_2$. Accordingly, in such case, the summed voltage $U_+$ will become an alternating voltage, i.e. the summed voltage $U_+$ has an alternating voltage component $U_{+,AC}$ being non-zero. In the example given herein, the summed voltage $U_+$ swings between $2*U_{max}$ and 0 V. Furthermore, the differential voltage $U_-$ will no more result in a signal and becomes substantially constantly 0 V.

ii) Suspension Member not Attached or Both Cord Groups Interrupted

In a next case, it will be assumed that an electrical connection between components of the device 17 and the suspension member 11 is faulty or interrupted such that no voltages may be applied to the cords 23 comprised in the suspension member 11. A same or corresponding situation occurs when cords in not only one but in both groups 24a, 24b of cords are interrupted. In such cases, no electrical current flows through the connecting electrical resistance $R_5$. Instead, this connecting electrical resistance $R_5$ will be floating and both the third and fourth voltages $U_3$, $U_4$ will be measured as being constantly substantially 0 V. The first and second voltages $U_1$, $U_2$ will see no electrical load and may follow the generated voltages $U_{G1}$, $U_{G2}$ with their maximum voltage amplitude $U_{max}$. In such case, as indicated in FIG. 21, the summed voltage $U_+$ as well as the differential voltage $U_-$ will have no non-zero alternating voltage components $U_{+,AC}$, $U_{-,AC}$ and will generally become constantly substantially 0 V.

iii) Single Cord Connected to Ground

When a single cord 23 or only cords of one of the groups 24a, 24b of cords 23 are electrically connected to a ground potential (as indicated by a faulty first connection to ground 41), an electrical current will flow to ground. Accordingly, in such case of a single cord fault, an asymmetrical load to the alternating voltage generator arrangement G occurs. Since still electrical current flows through the connecting electrical resistance $R_5$, the third and fourth voltages $U_3$, $U_4$ generally both have the same phase and follow the alternating voltage generator $G_1$ or $G_2$ attached to the group 24a, 24b of cords 23 not having the ground fault.

FIG. 22 shows voltage conditions for a case in which a ground fault is assumed to occur in the second group 24b of cords 23, i.e. between the second voltage $U_2$ and the fourth voltage $U_4$. In general, the voltage closer to the ground fault will have the smaller amplitude. Therefore, since the third and fourth voltages $U_3$, $U_4$ have different amplitudes but are in phase, both the summed voltage $U_+$ and the differential voltage $U_-$ will be sinusoidal signals, i.e. will have non-zero alternating voltage components $U_{+,AC}$, $U_{-,AC}$. Therein, the summed voltage $U_+$ will have a bigger sinusoidal signal than the differential voltage $U_-$.

iv) Cords in Both Groups Connected to Ground

In case, cords 23 in each of the groups 24a, 24b of cords are simultaneously connected to ground (as indicated by a faulty first connection to ground 41 and faulty second connection to ground 43 in FIG. 16), both the third and fourth voltages $U_3$ and $U_4$ are permanently substantially 0 V. Accordingly, also the summed voltage $U_+$ and the differential voltage $U_-$ are substantially 0 V and no alternating voltage components $U_{+,AC}$, $U_{-,AC}$ can be detected.

Furthermore, in such case, electrical current may be flowing to ground such that electrical load will be put on the two alternating voltage generators $G_1$, $G_2$, thereby resulting in smaller first and second voltages $U_1$, $U_2$.

It may be noted that such a double or multiple ground connection generally only appears when the suspension member 11 runs for example over a grounded pulley.

Furthermore, it shall be noted that electrical connections to ground can either be permanent or may just occur when the elevator car is at certain locations, i.e. when the suspension member arrangement is moved along pulleys of the elevator and when for example a specific damaged location of the suspension member where the cords 23 are no more isolated by the cover 21 electrically comes into contact with the grounded pulley. It may therefore be necessary for specific embodiments of the detection method presented herein to move the suspension member arrangement along pulleys of the elevator during determining the summed voltage $U_+$ and the differential voltage $U_-$ In such cases, a position where at least one electrical connection to ground of one of the cords 23 is present may be determined based on a point in time where a respective deterioration state is determined.

In other words, when the summed voltage $U_+$ and the differential voltage $U_-$ are permanently monitored during displacing the elevator car and, suddenly, a significant change in the summed voltage $U_+$ and/or the differential voltage $U_-$ is detected, such change indicating that a single cord is connected to ground or several cords comprised in both groups of cords are connected to ground, a location where such ground connection occurs may be identified based on a point in time at which such change is detected. Therein, it may be used that, typically, an elevator control always knows precisely where the elevator car is currently situated and therefore it is known where the suspension members 11 of the suspension member arrangement 9 contact for example pulleys within the elevator arrangement. Accordingly, knowing the point in time when a ground connection is detected, the location of such ground connection within the suspension member 11 may be identified. In such identification, several influencing parameters such as a pulley diameter, an angle of wrap, a speed of the elevator and a roping factor may be taken into account.

Furthermore, for obtaining more detailed information about a single or multiple ground connections, various voltages may be measured and all first to fourth voltages $U_1$, $U_2$, $U_3$, $U_4$ may be permanently monitored and compared against their initial values. Both, in case of single ground failures as well as in case of multiple ground failures, these voltage values will be different when compared to the initial values. From the occurring voltage differences between actual values and initial values, additional information about the type, number and/or degree of electrical ground connections may be derived.

v) Shorts Between Adjacent Cords

Another deterioration state to be detected may be a case in which neighbouring cords 23 come into electrical contact with each other. This may occur for example when an isolating cover 21 is locally damaged and portions of one or more cords 23 are locally exposed. Then, either adjacent cords 23 may be getting into contact by mechanically touching each other directly or by both coming for example into contact with a conducting object such as a conductive pulley (which may be isolated from ground) such that the adjacent cords 23 come into indirect electrical contact. For the indirect adjacent connection of cords 23 via a pulley, it is obvious that the detection of the deterioration state should take place when the elevator moves, i.e. when the suspension member arrangement 9 is moved along the pulleys of the elevator.

As a result of such shorts between adjacent cords 23, an electrical current usually flowing through the connecting electrical resistance $R_5$ is bypassed by the fault. As a result, the third and fourth voltage $U_3$, $U_4$ will generally be the same since they measure a connection point voltage to ground and therefore the differential voltage $U_-$ will generally be zero.

Generally, two types of shorts between adjacent cords 23 may be distinguished. In a first situation named herein "symmetrical short" 45 (as visualized as a broken line in FIG. 16), an electrical connection occurs between a first cord comprised in the first group 24a of cords and a second cord comprised in the second group 24b of cords at a location where the lengths of both the first and second cords up to the location of the shunt (or a series connection of cords comprising each of the cords in one of the groups 24a, 24b up to the location of the shunt) are same for both the first and second cords. In other words, in a situation where the first group 24a of cords is formed by all odd numbered cords and the second group of cords 24b is formed by all even numbered cords, the symmetrical situation exists if the number of odd and even cords up to the fault is the same. In such symmetrical situation, the alternating voltage component of the applied voltages generally disappears in the connection point and the connection point will have a DC voltage of generally $U_{max}/2$. Accordingly, in such symmetrical situation, the summed voltage $U_+$ will have no alternating voltage component, i.e. $U_{+,AC}=0$, and will have a direct voltage component generally corresponding to the applied maximum voltage, i.e. $U_{+,DC}=U_{max}$.

In an asymmetrical situation called herein "asymmetrical shunt" 47 (as indicated in FIG. 16), an electrical connection occurs between neighbouring cords at a location where a distance between this location and a first end 25a for the cord 23 comprised in the first group 24a is different from a distance of such location from the first end 25b of the cord 23 comprised in the second group 24b. In other words, in the example mentioned above, the asymmetrical situation exists if the number of odd and even cords to the fault is not the same. In such asymmetrical situation, the asymmetry will create an alternating voltage component in the connection point versus ground. Both the third and fourth voltages $U_3$, $U_4$ will measure this voltage of the connection point and will therefore be in phase having the same phase angle as the one of the generators $G_1$, $G_2$ being closer to the fault. Additionally to such alternating voltage component, the third and fourth voltages $U_3$, $U_4$ will have a DC voltage of generally $U_{max}/2$. Accordingly, the summed voltage $U_+$ will have a direct voltage component $U_{+,DC}$ corresponding to the maximum voltage, i.e. $U_{+,DC}=U_{max}$, and an alternating voltage component $U_{+,AC}$ being non-zero.

vi) Damaged but Non-Interrupted Cords (Corrosion/Rust)

A load bearing capacity of a suspension member 11 may, inter alia, be deteriorated when cords 23 within the suspension member 11 are for example corroded. Rusty locations at the cords 23 may reduce their cross-section thereby reducing their load bearing capacity. It is generally assumed that such corrosion not only decreases mechanical properties of the suspension member 11 but also changes its electrical properties. Particularly, it may be assumed that a diameter of a cord reduced by corrosion generally results in a reduced electrical conductivity through such cord.

When the suspension member 11 is included into the device 17 proposed herein, such reduced electrical conductivity in at least one of the cords 23 may significantly change at least some of the first to fourth voltages $U_1$, $U_2$, $U_3$, $U_4$. Accordingly, these voltages may be measured for example in an initial state of the suspension member arrangement 9 and measured initial reference values may be stored e.g. once a new suspension member arrangement got installed and put into operation. During subsequent operation of the elevator, some or all of these first to fourth voltages $U_1$, $U_2$, $U_3$, $U_4$ may be measured and compared to the initial reference values.

Detected differences may show different patterns. For example, when all values actually measured changed in a same manner when compared to the initial reference values, it may be assumed that a homogeneous damage or deterioration, i.e. for example a homogeneous corrosion, occurred to all of the cords 23. Alternatively, if it is observed that some of the actually measured values have changed with respect to the initial reference values but other measured values have not changed, it may be assumed that just certain cords or connection points are faulty.

For completeness, it shall be indicated that, additionally to a measurement mode in which the device 17 may perform a method for detecting various deterioration states as described herein before, the device 17 may also be set into a so-called "idle mode".

Such idle mode is visualized in FIG. 23. Therein, the alternating voltage generator arrangement G can also be switched off. Alternatively, the alternating voltage generators $G_1$, $G_2$ may be disconnected from the rest of the circuitry via switches similar to those switches 41a, 41b shown in FIG. 19. The device 17 may be set to such idle mode for example in order to save energy when no measurement is required. Alternatively, when a suspension member arrangement 9 comprises more than one suspension member 11, a device 17 may be provided for each of the suspension members 11 and one of such plurality of devices 17 may be set into its idle mode while another one of the devices 17 is currently in its measurement mode. As a further alternative, a single alternating voltage generator arrangement G may be provided and may be alternately electrically connected to each one of the plurality of suspension members 11 for performing the detection method in this one suspension member 11 while other suspension members 11 are set into an idle mode. In such idle mode, it may be interpreted that the alternating voltage generators $G_1$, $G_2$ have a high impedance output (and can therefore be ignored in the schematic diagram of FIG. 23) and, since no electrical current flows due to voltage applied by the voltage generators $G_1$, $G_2$, the pull-up voltage source 36 will lift up all of the first to fourth voltages $U_1$, $U_2$, $U_3$, $U_4$ to generally $U_{max}$.

However, in case of deteriorations occurring in the suspension members 11, such voltages $U_1$, $U_2$, $U_3$, $U_4$ may change. For example, when electrical connections to ground occur at one or more of the cords 23, currents may flow to ground and depending on where the connection to ground occurs, one or more of the first to fourth voltages $U_1$, $U_2$, $U_3$, $U_4$ may change and, particularly, may be less than $U_{max}$.

Summarizing, various deterioration states to be detected with the device 17 and the method described herein may be identified as follows:

a state in which the summed voltage $U_+$ comprises an alternating voltage component (i.e. $U_{+,AC} \neq 0$) and the differential voltage $U_-$ comprises no alternating voltage component (i.e. $U_{-,AC} = 0$) may be interpreted as indicating that at least one of the cords 23 comprised in one of the group of cords 24a, 24b is interrupted and none of the cords 23 comprised in the other group of cords 24b, 24a is interrupted;

a state in which the summed voltage $U_+$ comprises no alternating voltage component (i.e. $U_{+,AC} = 0$) and the differential voltage $U_-$ comprises no alternating voltage component (i.e. $U_{-,AC} = 0$) may be interpreted as indicating at least one of the following deterioration states:
either: at least one of the cords comprised in one of the groups of cords is interrupted and at least one of the cords comprised in the other group of cords is also interrupted, or:
the voltage supplies applying the first alternating voltage $U_1$ and the second alternating voltage $U_2$ are both interrupted;

a state in which the summed voltage $U_+$ comprises an alternating voltage component (i.e. $U_{+,AC} \neq 0$) and the differential voltage comprises an alternating voltage component (i.e. $U_{+,AC} \neq 0$) is interpreted as indicating an electrical connection to ground of at least one of the cords 23 in the suspension member 11;

a state in which the summed voltage $U_+$ comprises no alternating voltage component (i.e. $U_{+,AC} = 0$) but a direct voltage component (i.e. $U_{+,DC} \neq 0$) and the differential voltage comprises no alternating voltage component (i.e. $U_{-,AC} = 0$) is interpreted as indicating that one of the cords 23 comprised in one of the groups 24a, 24b of cords is short-circuited with a cord 23 comprised in the other group 24b, 24a of cords in a symmetrical manner;

a state in which the summed voltage comprises an alternating voltage component (i.e. $U_{+,AC} \neq 0$) and a direct voltage component (i.e. $U_{+,DC} \neq 0$) and the differential voltage comprises no alternating voltage component (i.e. $U_{-,AC} = 0$) is interpreted as indicating that one of the cords 23 comprised in one of the groups 24a, 24b of cords is short-circuited with a cord 23 comprised in the other group 24b, 24a of cords in an asymmetrical manner.

Particularly, it has been found that information about the deterioration state may advantageously be derived based on an analysis of a phase in an alternating voltage component $U_{+,AC}$, $U_{-,AC}$ of at least one of the summed voltage $U_+$ and the differential voltage $U_-$. In other words, when analyzing the summed voltage and/or the differential voltage, also phase angles of the third voltage and the fourth voltage $U_3$, $U_4$ and/or of the first voltage and the second voltage $U_1$, $U_2$ (or a mathematical combination thereof) may be considered for simplifying a diagnostics.

Furthermore, for obtaining further detailed information about a current deterioration state, initial values of the summed voltage $U_+$ and/or the differential voltage $U_-$ may be determined and stored in an initial state of the elevator and subsequent values of the summed voltage $U_+$ and the differential voltage $U_-$ may be determined in a subsequent state of the elevator (i.e. during normal operation thereof). The deterioration state of the suspension member may then be determined during the subsequent state based on a comparison of the initial values of the summed voltage $U_+$ and the differential voltage $U_-$ with the subsequent values of these summed and differential voltages $U_+$, $U_-$, respectively.

Furthermore, for obtaining additional information about the deterioration state, initial values of the applied first and second alternating voltages $U_1$, $U_2$ may be determined and stored in an initial state of the elevator and subsequent values (e.g. during normal operation) of the applied first and second alternating voltages $U_1$, $U_2$ may be determined in a subsequent state of the elevator. Therein, the deterioration state of the suspension member may be determined during the subsequent state taking into account a comparison of the initial values of the applied first and second alternating voltages $U_1$, $U_2$ with the subsequent values of the applied first and second alternating voltages $U_1$, $U_2$, respectively.

A brief overview of various possibilities of error detection or deterioration detection in a measurement mode of the device 17 may be obtained from the following chart:

|  | $U_+$ | | $U_-$ | | Phase angles | | |
| --- | --- | --- | --- | --- | --- | --- | --- |
|  | AC | DC | AC | DC | $U_3$ | $U_4$ | Comment |
| OK | No signal | ~½ $U_{max}$ | Sinusoidal signal | 0 V | $G_1$ | $G_2$ |  |
| Broken cord | Sinusoidal signal $2U_{max}$ peak to peak | $U_{max}$ | No signal | 0 V | $G_{xx}$ side still connected | | No load on $U_1$ and $U_2$ |
| STM not attached or both cord pairs broken | No signal | 0 V | No signal | 0 V | — | — | No load on $U_1$ and $U_2$ |
| Multiple connection to ground (measurement mode) | No signal | 0 V | No signal | 0 V | — | — | Load on $U_1$ and $U_2$ Elevator must move to detect all faults |

-continued

| | $U_+$ | | $U_-$ | | Phase angles | | |
|---|---|---|---|---|---|---|---|
| | AC | DC | AC | DC | $U_3$ | $U_4$ | Comment |
| Single connection to ground (measurement mode) | Sinusoidal signal | $<=\frac{1}{2} U_{max}$ | Sinusoidal signal $<= U_3 + U_4$ | $<=\frac{1}{2} U_{max}$ | $G_{xx}$ side not having ground fault | | Elevator must move to detect all faults |
| Adjacent connection of cords (symmetrical) | No signal | $U_{max}$ | No signal | 0 V | — | — | Elevator must move to detect all faults |
| Adjacent connection of cords (asymmetrical) | Sinusoidal signal | $U_{max}$ | No signal | 0 V | $G_{xx}$ side of the generator being closer to the fault | | Load on $U_1$ and $U_2$ Elevator must move to detect all faults |
| Damaged cords | | | | Deviation from initial values | | | |

FIG. 24 shows a flow-chart indicating method steps and their temporal and/or logical interconnection in a method for determining a deterioration state in a suspension member arrangement of an elevator according to an embodiment of the present invention. While the method steps including analyzing steps and decision steps and the resulting indications about detected various types of deterioration states are self-explaining from the flow-chart, it shall be mentioned that this flow-chart visualizes only one possibility for implementing the method according to the invention. Various further possibilities exist for performing the method steps including the analyzing steps and the decision steps. Particularly, each of the steps may be further specified in order to enable determining more detailed information about a deterioration state. For example, additional phase analysis of alternating voltage components of one or more of the first to fourth alternating voltages and/or the summed voltage and/or the differential voltage may provide such additional information.

Next, some structural and/or functional details of possible embodiments of the device 17 for detecting the deterioration state will be described.

As indicated with reference to the embodiment shown in FIG. 16, it may be sufficient that the device 17 comprises either the first voltage measurement arrangement 31 for determining the summed voltage $U_+$ or the second voltage measurement arrangement 33 for determining the differential voltage $U_-$ In principle, from each of the summed voltage $U_+$ and the differential voltage $U_-$, valuable information about a current deterioration state may be determined. However, it may be advantageous to provide the device 17 with both the first voltage measurement arrangement 31 and the second voltage measurement arrangement 33.

Each or at least one of the first voltage measurement arrangement 31 and the second voltage measurement arrangement 33 may be adapted for measuring at least an alternating voltage component $U_{+,AC}$ of the summed voltage $U_+$ or an alternating voltage component $U_{-,AC}$ of the differential voltage $U_-$ However, additional information may be acquired if additionally to such ability for measuring the alternating voltage component, the first voltage measurement arrangement 31 and/or the second voltage measurement arrangement 33 are also adapted for measuring a direct voltage component $U_{+,DC}$ of the summed voltage and/or $U_{-,DC}$ of the differential voltage $U_-$.

Furthermore, it may be beneficial to provide the first voltage measurement arrangement 31 and/or the second voltage measurement arrangement 33 with a transformation unit which is adapted for transforming a voltage measurement from a time domain into a frequency domain. For example, such transformation unit may be adapted for performing a Fast Fourier Transformation (FFT). Alternatively, the transformation unit may be adapted for performing other transformations which enable transforming a time-dependency of a voltage periodically varying over time into a frequency domain. Accordingly, any change in a frequency of an alternating voltage component may be easily identified in the representation of the alternating voltage component in the frequency domain. Furthermore, it may also be possible to detect any phase-shift in such alternating voltage component. Detected changes in a frequency or a phase-shift of alternating voltage components $U_{+,AC}$, $U_{-,AC}$ of the summed voltage $U_+$ and/or the differential voltage $U_-$ may therefore easily be identified and taken as indicating specific types or degrees of deterioration in a suspension member.

Furthermore, the first voltage measurement arrangement 31 and/or the second voltage measurement arrangement 33 may comprise a frequency filter for transmitting only alternating voltage components with a specific frequency spectrum. For example, only alternating voltage components with a frequency corresponding to a frequency of the first alternating voltage $U_1$ may be transmitted.

For example, such frequency filter may be a band-pass filter. Such band-pass filter may filter-out specific high and/or low frequencies and/or frequency-bands. Accordingly, when analyzing any changes in the alternating voltage components of e.g. the summed voltage $U_+$ or the differential voltage $U_-$, signals representing such alternating voltage components may first be filtered such that only those frequencies are actually analyzed which provide important information about the deterioration state of the suspension member, such frequencies typically corresponding to the frequencies of the generated voltages $U_{G1}$, $U_{G2}$. Other frequency components such as for example high frequency components being unintendedly coupled into the voltage measurement signals may be filtered out. Thus, using such frequency filter, alternating voltage components of a measured voltage may be analyzed in a simplified manner.

The alternating voltage generator arrangement G, possibly with its alternating voltage generators $G_1$, $G_2$, may comprise at least one microcontroller generating an alternating voltage using pulse width modulation (PWM). Such PWM microcontroller may generate digital or, preferably, binary signals which may be used for example for controlling transistors. Possibly, a first PWM microcontroller may generate the signals for generating the first generated alternating voltage $U_{G1}$ whereas a second microcontroller (or alternatively an inverted output port of the same microcontroller) may generate the signals for generating the second alternating generated voltage $U_{G2}$. By suitably turning on and off for example two transistors with a first PWM signal and a second inverted PWM signal, suitable digital PWM signals may then be transmitted through a low-pass filter in order to, finally, generate an analogue generated alternating voltage $U_{G1}$ or $U_{G2}$. The low-pass filters might be implemented as RC filters containing e.g. the two capacitors 39a and 39b and the two resistors R3 and R4 as depicted in FIG. 19.

Preferably, the alternating voltage generator arrangement G, possibly with its alternating voltage generators $G_1$, $G_2$, may be adapted for generating an alternating voltage with a frequency that is neither an integer multiple nor an inverse integer multiple of one of 50 Hz and 60 Hz. In other words, it may be preferable that the voltage generator arrangement generates the alternating voltage with a frequency which is substantially different to the frequency of a typical alternating power supply voltage. Expressed differently, the alternating voltage generators should use a frequency that is different from 50 Hz and 60 Hz and their harmonics. Thereby, measurements of the alternating voltage components may be made robust and immune against any EMC effects which otherwise could disturb the proposed method for detecting the deterioration state in the elevator. Furthermore, particularly when the frequency of the voltage generators significantly differs from any frequency of the power supply voltage, for example a Fast Fourier Transformation or similar algorithm may be used to transform the measured alternating voltage from its time domain into a frequency domain. In such frequency domain, only the frequency matching the alternating voltage generator's frequency may be considered. Furthermore, phase angles of the voltage measurement signal may be detected in order to determine the source generator $G_1$ or $G_2$.

Next, an implementation of the device 17 for an elevator having a suspension member arrangement 9 comprising a multiplicity of suspension members 11 will be described.

Typically, a suspension member arrangement 9 for an elevator comprises at least two, preferably three, four or more suspension members 11 such as multiple separate belts in order to securely suspend the elevator car and/or the counterweight. The device 17 may be adapted for detecting deterioration states in each of such multiple suspension members 11. Therein, in order to save device resources and costs, some components of the device 17 may not be provided for each of the suspension members 11 but, instead, are provided only once and are therefore to be shared for detecting the deterioration state in each of the multiple suspension members 11. For example, the device 17 may comprise a power supply, a microcontroller and its software, alternating voltage generators, analogue/digital converters and/or serial communication interfaces to an elevator controller. Therein, such components may be provided only once and may be shared for all of the suspension members 11.

As shown in principle in FIG. 25, a multiplexer arrangement 51 may be connected for example to a PWM microcontroller 49 forming the first and second alternating voltage generators $G_1$, $G_2$. This multiplexer arrangement 51 may be a digital multiplexer. The multiplexer arrangement 51 may be adapted for connecting the alternating voltage generator arrangement G and/or at least one of the first and second voltage measurement arrangements 31, 33 to each of exemplarily four multiple suspension members 11 in a timely offset sequence. For such purpose, the multiplexer arrangement 51 may establish an electrical connection to each of a multiplicity of drivers 53a, 53b, 53c, 53d in a serial time sequence, i.e. one after the other. Each of the drivers 53a, 53b, 53c, 53d is then connected to an associated low-pass filter 55a, 55b, 55c, 55d which is then finally connected to one of the multiple suspension members 11 in order to apply the first and second alternating voltages $U_1$, $U_2$ to the first ends 25a,b of the first and second groups 24a,b of cords 23 comprised therein.

FIGS. 26 and 27 show timing diagrams for non-continuous detection of deterioration states in a multiplicity of suspension members 11. The diagrams show a time dependence of the first and second alternating voltages $U_1$, $U_2$ applied to groups 24a, 24b of cords 23 in each of three exemplary suspension members.

Therein, as shown in FIG. 26, first and second alternating voltages $U_1$, $U_2$ are applied to a first suspension member 11' during a first period of time $t_1$ using the multiplexer arrangement 51. During such first period $t_1$, the other suspension members 11", 11''' are not connected to the alternating voltage generator arrangement G and are therefore in an idle mode in which the pull-up voltage $U_{max}$ is constantly applied to each of the groups of cords comprised in these suspension members. Accordingly, during the period $t_1$, voltage measurements may be performed indicating a deterioration state in the first suspension member 11'. Then, in a subsequent period of time $t_2$, the multiplexer arrangement 51 switches over to the second suspension member 11". Accordingly, during such second period $t_2$, alternating voltages $U_1$, $U_2$ are applied to the cords 23 in the second suspension member 11" and resulting measured summed voltages and differential voltages may be analyzed for determining the deterioration state in this second suspension member 11". Subsequently, the multiplexer arrangement 51 switches over to the third suspension member 11''' and repeats the measurement procedure for this third suspension member 11". Finally, the multiplexer arrangement 51 may switch back to the first suspension member 11' and start a new sequence of measurement procedures.

As shown in FIG. 27, after having measured and detected deterioration states in all of the suspension members 11', 11", 11''', the detecting device 17 may be set into a sleep mode in which all suspension members 11', 11", 11''' are in an idle mode. Thereby, energy may be saved. After a sleep time $t_S$ of for example several seconds, several minutes or even several hours, a next measurement sequence may be started by sequentially connecting an activated alternating voltage generator arrangement to each of the multiple suspension members 11', 11", 11''' in a timely offset manner.

It shall be noted that all measured or determined values, particularly all voltage values, indicated herein are understood by one skilled in the art as "substantial" values. I.e. when a measured or determined value is said to be a specific numeral value, insignificant deviations of e.g. up to 2% relative or even up to 5% relative may still be included. For example, if it is stated that no DC voltage and/or no AC voltage are measured this may mean that within acceptable tolerances no such voltages are measured but that for example due to noises some minor electric voltages may still occur.

LIST OF REFERENCE SIGNS 1 elevator
2 cabin
5 counter-weight
7 elevator shaft
9 suspension member arrangement
11 suspension member
13 traction machine
15 traction sheave
17 device for detecting deterioration states
18 control device
19 belt
21 matrix material
23 cords
24a first group of cords
24b second group of cords
25a first end of first group of cords
25b first end second group of cords
27a second end of first group of cords
27b second end second group of cords
29 determination unit
31 first voltage measurement arrangement
33 second voltage measurement arrangement
35a first voltage determining unit
35b second voltage determining unit
35c third voltage determining unit
35d fourth voltage determining unit
36 pull-up voltage source
37a first AC voltage determining unit
37b first DC voltage determining unit
37c second voltage determining unit
38 centre point
39a,b capacitors
41 faulty first connection to ground
43 faulty second connection to ground
45 symmetrical short
47 asymmetrical short
49 PWM microcontroller
51 multiplexer arrangement
53 drivers
55 low pass filters
$U_1$ first alternating voltage
$U_2$ second alternating voltage
$U_3$ third alternating voltage
$U_4$ fourth alternating voltage
G alternating voltage generator arrangement
$G_1$ first alternating voltage generator
$G_2$ second alternating voltage generator
$U_{G1}$ first generated voltage
$U_{G2}$ second generated voltage
$U_+$ summed voltage
$U_-$ differential voltage
$U_{+,AC}$ alternating voltage component of the summed voltage $U_+$
$U_{-,AC}$ alternating voltage component of the differential voltage $U_-$
$U_{+,DC}$ direct voltage component of the summed voltage $U_+$
$U_{-,DC}$ direct voltage component of the differential voltage $U_-$
$R_1$, $R_2$, $R_3$, $R_4$ electrical resistances
$R_5$ connecting electrical resistance
$R_6$, $R_7$ separate connecting electrical resistances $t_1$-$t_6$ periods of time during multiplexing
$t_S$ sleep period Approaches defining features of the concept 3 may be defined as follows:

1. A device (17) for detecting a deterioration state in a suspension member arrangement (9) for an elevator (1), the suspension member arrangement (9) comprising at least one suspension member (11) having a first and a second group (24a, 24b) of electrically conductive cords (23); the device comprising:
   an alternating voltage generator arrangement (G, $G_1$, $G_2$) for applying a first alternating voltage $U_1$ to a first end (25a) of the first group of cords of the suspension member and for applying a second alternating voltage $U_2$ to a first end (25b) of the second group of cords of the suspension member;
   wherein the alternating voltage generator arrangement (G, $G_1$, $G_2$) is configured to generating the first and second alternating voltages with same waveforms and a phase difference of 180°;
   at least one of
   (i) a first voltage measurement arrangement (31) for determining a summed voltage $U_+$ correlating to a sum ($U_3$+$U_4$) of a third voltage ($U_3$) between a second end (27a) of the first group of cords and a common electrical potential and a fourth voltage ($U_4$) between a second end (27b) of the second group of cords and the common electrical potential; and
   (ii) a second voltage measurement arrangement (33) for determining a differential voltage $U_-$ correlating to a difference ($U_3$- $U_4$) between the third voltage ($U_3$) and the fourth voltage ($U_4$);
   a determination unit for determining the deterioration state based on at least one of the summed voltage and the differential voltage.

2. The device according to approach 1, further comprising a connecting electrical resistance ($R_5$) electrically connecting the second end of the first group of cords and the second end of the second group of cords.

3. The device according to one of the preceding approaches, comprising both the first and the second voltage measurement arrangement.

4. The device according to approach 3, wherein the determination unit is adapted to determine a deterioration in the suspension member arrangement based on any deviation from a state in which the summed voltage comprises no alternating voltage component $U_{+,AC}$ and the differential voltage comprises a non-zero alternating voltage component $U_{-,AC}$.

5. The device according to one of the preceding approaches, wherein at least one of the first voltage measurement arrangement and the second voltage measurement arrangement is adapted for measuring both an alternating (AC) voltage component and a direct (DC) voltage component.

6. The device according to one of the preceding approaches, wherein at least one of the first voltage measurement arrangement and the second voltage measurement arrangement comprises a transformation unit for transforming a voltage measurement from a time domain to a frequency domain.

7. The device according to one of the preceding approaches, wherein the determination unit is adapted for deriving information about the deterioration state based on an analysis of a phase in an alternating voltage component $U_{+,AC}$, $U_{-,AC}$, of at least one of the summed voltage $U_+$ and the differential voltage $U_-$.

8. The device according to one of the preceding approaches, wherein at least one of the first voltage measurement arrangement and the second voltage measurement arrangement comprises a frequency filter for transmitting only alternating voltage components with a frequency corresponding to a frequency of the first alternating voltage $U_1$.

9. The device according to one of the preceding approaches, wherein the alternating voltage generator arrangement (G, $G_1$, $G_2$) comprises at least one microcontroller (49) generating an alternating voltage using pulse width modulation (PWM).

10. The device according to one of the preceding approaches, wherein the alternating voltage generator arrangement ($G_1$, $G_2$) is adapted for generating an alternating voltage with a frequency that is neither an integer multiple nor an inverse integer multiple of one of 50 Hz and 60 Hz.

11. The device according to one of the preceding approaches, wherein the suspension member arrangement comprises multiple suspension members, the device further comprising a multiplexer arrangement (51) for connecting the alternating voltage generator arrangement ($G_1$, $G_2$) and at least one of the first and second voltage measurement arrangements to the various suspension members in a timely offset sequence.

12. The device according to one of the preceding approaches, further comprising a direct voltage (DC) pull-up voltage source electrically connected to each of the first ends of the first and second group of cords via a highly resistive electrical resistance ($R_1$, $R_2$).

13. The device according to one of the preceding approaches, further comprising a third voltage measurement arrangement for measuring the first alternating voltage ($U_1$) and a fourth voltage measurement arrangement for measuring the second alternating voltage ($U_2$).

14. The device according to one of the preceding approaches, further comprising a connector arrangement for establishing a series connection of all even numbered cords in the suspension member and a series connection of all odd numbered cords in the suspension member and for establishing an electrical connection for applying the first and second alternating voltages ($U_1$, $U_2$) to first ends of the series connection of even numbered cords and the series connection of odd numbered cords, respectively.

CONCEPT IV

Elevator Arrangement with an Electric Isolation in an STM Fixation Arrangement and Method for Modernizing an Existing Elevator Arrangement

FIELD

The present invention according to concept 4 relates to an elevator arrangement. More particularly, the present invention relates to an elevator arrangement in which a suspension traction means is attached to a fixation structure in an elevator shaft using a specific fixation arrangement. Furthermore, the present invention relates to a method for modernizing an existing elevator arrangement.

BACKGROUND

Elevator arrangements generally serve for transporting people or goods in a vertical direction within a building. For such purpose, an elevator car may typically be moved within an elevator shaft within the building. Therein, the elevator car is at least partly carried by a suspension traction means (hereinafter also referred as "STM"). Such STM may comprise for example one or more belts or ropes. The STM, on the one hand, holds and supports the elevator car and, on the other hand, is held or fixed in a load carrying manner at a fixation structure provided within the elevator shaft, the fixation structure being provided e.g. at guide rails installed in the elevator shaft or at a ceiling of the elevator shaft. For example, in one configuration, one end of an STM may be fixed to the fixation structure using a fixation arrangement and the STM then carries the elevator car by being wound around rotatable support media such as pulleys or the like provided at the elevator car. Alternative STM fixation configurations are possible.

As the elevator shall transport persons to substantial heights, safety requirements for such elevator are very strict. For example, regulations may rule that the integrity of the STM has to be monitored. Various approaches for monitoring a state or deterioration condition of an STM have been proposed. For example, sophisticated monitoring approaches have been described, inter alia, in EP 15166033, U.S. Ser. No. 14/814,558, EP 16155357 and EP 16155358 in which electrical characteristics of electrically conductive cords comprised in the STM are monitored continuously or repeatedly. Therein, changes in such electrical characteristics may be interpreted as resulting from changes in the STM which, in a worst case scenario, may deteriorate a load bearing capacity of the STM.

For example, using such monitoring approaches, corrosion at the electrically conductive cords and/or damages at an electrically isolating enclosure enclosing such cords may be detected and interpreted in an intelligent manner. Particularly, in some of such approaches, electrical shorts between neighbouring cords and/or electrical connections to ground may be detected, such shorts or ground connections generally resulting from local damages at the isolating enclosure which, due to such damages, may no more isolate neighbouring cords or isolate between a cord and an electrically grounded other component of the elevator arrangement, respectively.

It is generally intended to equip novel elevator arrangements with such STM monitoring capabilities. When designing such novel elevator arrangements, all elevator components may be specifically adapted for enabling various STM monitoring capabilities.

However, in many cases, it may also be intended or even be required by official regulations to retrofit existing elevator arrangements with such STM monitoring capabilities during modernisation measures. It has been observed that, particularly for such retrofitting, problems may occur which may prevent efficient monitoring of an STM arrangement or which allow only a subset of measurements to be enabled to determine a subset of possible faults within an STM arrangement.

Accordingly, there may be a need for an elevator arrangement being adapted such that a monitoring unit may determine specific types of possible faults within an STM while, at the same time, keeping the components of the elevator arrangement simple, inexpensive and/or easy to install. Particularly, there may be a need for an elevator arrangement in which, inter alia, electrical connections to ground of electrically conductive cords in an STM may be detected, thereby enabling a detection of damages within an isolating enclosure enclosing the cords. Particularly, there may be a need for an elevator arrangement which may be obtained by retrofitting an existing elevator arrangement thereby enabling specific monitoring of characteristics of its STM.

Accordingly, there may be need for a method of modernizing an existing elevator thereby enabling at least some monitoring capabilities concerning possible faults within an STM arrangement.

SUMMARY

Such needs may be met with the subject-matter of the approaches of concept 4 defined hereinafter. Advantageous embodiments are defined in the subsequent specification and approaches of concept 4 defined hereinafter.

According to a first aspect of the present invention according to concept 4, an elevator arrangement is proposed wherein the elevator arrangement comprises an elevator shaft, a suspension traction means, an elevator car and a fixation arrangement. The elevator shaft comprises at least one fixation structure arranged for example at guide rails mounted in the elevator shaft or at a ceiling or a top region of the elevator shaft. The suspension traction means comprises a plurality of electrically conductive cords. The elevator car is at least partly carried by the suspension traction means. The fixation arrangement is adapted for attaching the suspension traction means in a load carrying manner to the fixation structure. Therein, the fixation arrangement is furthermore adapted such as to provide for an electric isolation between the suspension traction means and the fixation structure.

Ideas underlying embodiments of the present invention of concept 4 may be interpreted as being based, inter alia and without restricting the scope of the present invention, on the following observations and recognitions.

As briefly stated in the preceding introductory portion, safety supervision units (SSU) may be used in an elevator arrangement in order to supervise the integrity of STMs by inducing electrical currents within electrically conductive cords of an STM by applying external electrical voltages and monitoring resulting occurring voltages at or within the cords in order to thereby enable a determination of changes in electrical characteristics of such cords. Particularly, such SSUs may detect when an electrical connection of the cords to an electrical ground potential occurs. Such connection to ground typically occurs upon damaging of an electrically isolating enclosure enclosing the cords.

Generally, such damages at the enclosure may represent severe deteriorations of the quality of the STM. For example, such damages of the enclosure frequently result from single wires in a cord being broken and then locally piercing through the enclosure. Already the fact that a wire is broken is generally negative for the load bearing capacity of the STM. Furthermore, for example humidity may enter into an inner portion of the STM via the piercing and may then provoke corrosion.

While it may generally be difficult to detect damages to the enclosure of an STM directly, for example via visual inspection, such damages coincide in many cases with a continuous or temporary electrical connection of the cords of the STM with a ground potential via for example an opening in the damaged enclosure. For example, a bear or exposed portion of a cord may come into contact with an adjacent grounded component of the elevator arrangement such as with a grounded pulley, a grounded traction sheave or similar.

However, it has been observed that, in conventional elevator arrangements, an electrical connection between cords in the STM and a ground potential frequently occurs in specific situations which do not necessarily represent any significant risk for the integrity of the STM. Particularly, it has been observed that an end of an STM is typically fixed to a fixation structure within the elevator shaft using a fixation arrangement and that the fixation arrangement may be fixed to the STM in a way such that an electrical connection between the cords of the STM and the fixation arrangement is established.

For example, in conventional fixation arrangements, a belt-like STM may be held by being clamped or ripped using a clamping member such as a wedge clamp. Therein, a wedge which is typically metallic and therefore electrically conductive, presses the STM against a clamp housing such that the STM is bent into a curvature and clamped between the wedge clamp and the housing. In such clamping configuration, due to high pressures and due to the arrangement of the STM within the wedge clamp, it may be likely that cords of the STM penetrate the enclosure or jacket and conductively connect to the conductive clamp housing. When the fixation arrangement and, particularly, its clamp housing are electrically connected to ground, the cords of the STM are connected to ground in such cases. However, such electrical grounding of the cords occurring at the fixation arrangement is in many cases not critical for the integrity and safety of the STM and does therefore not need to be specifically detected. On the other hand, when such electrical ground connection occurs at the fixation arrangement, no other ground connections at other portions of the STM may be detected any more as, generally, the SSU may not differentiate between various locations at which electrical ground connections occur along the STM.

It is therefore proposed to modify the fixation arrangement of the elevator arrangement in such a way that an electric isolation between the STM and the fixation structure, to which the fixation arrangement is attached, is provided. Due to such electric isolation, no electrical ground connection occurs between the fixation arrangement and the fixation structure and therefore, no electrical ground connection may occur between the cords of the STM comprised in the fixation arrangement and the grounded fixation structure.

According to an embodiment, the fixation arrangement comprises a separate isolation member which is interposed in a load carrying path along which the suspension traction means is mechanically attached via the fixation arrangement to the fixation structure. Therein, the isolation member is adapted for electrically isolating the suspension traction means from the fixation structure.

In other words, the intended electric isolation between the suspension traction means and the fixation structure may be established using a separate isolation member which is interposed somewhere along the load carrying path between the STM and the fixation structure. Thus, while the load carried by the STM may mechanically be transferred via the load carrying path to the fixation structure, no electrical connection is established along this load carrying path due to the intermediate arrangement of the isolation member. For example, the isolation member may be a simple component made from an electrically isolating material such as plastics.

According to an embodiment, the fixation arrangement comprises a clamping member clamping the STM, an upper support member supported at the fixation structure and a longitudinal connection member mechanically connecting the clamping member and the upper support member in a load carrying manner.

In other words, the fixation arrangement may comprise at least three components. Therein, the clamping member may grip and clamp the STM such as to fixedly hold the STM at the fixation arrangement. For example, the clamping member may comprise a wedge clamp and a clamp housing between which the STM may be clamped. The longitudinal connection member may be fixedly connected to the clamping member. For example, the connection member may be a threaded rod which may be threaded into a thread or screw nut provided at the clamping member. On an opposite end, the upper support member may be provided at the longitudinal connection member. This upper support member may be attached to or, more generally, supported at the fixation structure provided in the elevator shaft. Such fixation arrangement has proven to be of high reliability while at the same time enabling strong load bearing capacities as well as relatively simple assembly and maintenance.

In such embodiment, the fixation arrangement may further comprise an upper isolation member being interposed between the upper support member and a load carrying structure at the fixation structure. The upper isolation member may be adapted for electrically isolating the upper support member and/or the longitudinal connection member from the fixation structure.

In other words, at a top portion of the fixation arrangement, the upper support member of the fixation arrangement may be mechanically supported at the fixation structure but, in order to prevent any electrical connection between the upper support member and the fixation structure, an upper isolation member is interposed between those two components.

Alternatively or in addition, the fixation arrangement may further comprise a lower support member supporting the clamping member and a lower isolation member interposed between the lower support member and a load carrying structure at the clamping member. Therein, the lower isolation member may be adapted for electrically isolating the lower support member from the clamping member and/or the longitudinal connection member.

Thus, similarly to the preceding embodiment, an electrical connection between the clamping member and the lower support member supporting the clamping member may be prevented using the lower isolation member.

Thus, the load carrying path between the STM clamped by the clamping member, on the one side, and the fixation structure supporting the upper support member of the fixation arrangement may be "interrupted" in terms of electrical conductivity by the interposed upper isolation member or the interposed lower isolation member or both.

In such embodiments, at least one of the upper isolation member and the lower isolation member may comprise a washer consisting of an electrically isolating material such as plastics. The washer may be a very simple construction component which, on the one hand, may be heavily mechanically loaded and which, on the other hand, may easily provide for an electrical isolation between neighbouring components within the load carrying path provided by the fixation arrangement.

According to a further specific embodiment, the fixation structure comprises an opening through which the longitudinal connection member extends. The upper support member is then attached to the longitudinal connection member upside of this opening. Therein, an upper isolation member comprises an electrically isolating sleeve enclosing the longitudinal connection member in a region where the longitudinal connection member extends through the opening of the fixation structure.

In other words, the fixation structure within the elevator shaft may be established with a component such as a load carrying plate through which a hole providing an opening is formed. Through this opening, the longitudinal connection member of the fixation arrangement may extend such that an upper portion of the connection member projects over an upper surface of the fixation structure. The upper support member is then attached to the connection member upside of the fixation structure, i.e. upside of the opening. Accordingly, while the connection member is drawn in a downward direction due to the load carried at the fixation arrangement, the fixation arrangement's upper support member is mechanically supported by an upper surface of the fixation structure. In such configuration, it is relatively easy to interpose an upper isolation member between the upper support member and the upper surface of the fixation structure. For example, this portion of the upper isolation member may look like a plastic washer.

However, additionally, there may be a risk that the longitudinal connection member comes into contact with a surface of the fixation structure within the opening. Generally, a lateral distance between the cylindrical outer surface of the connection member and an inner surface of the opening is only in a range of a few millimetres, e.g. 1 to 2 mm, such that upon any deflection or bending of the connection member, a mechanical contact and therefore also an electrical contact between the connection member and the inner opening walls of the fixation structure may be established.

In order to prevent such electrical connection, a sleeve enclosing the longitudinal connection member in a region where this connection member extends through the opening of the fixation structure may be provided. Such sleeve may avoid any electrical contact between the connection member and the fixation structure in the region where the longitudinal connection member extends through the opening of the fixation structure.

Similarly and alternatively or additionally, the clamping member may comprise an opening through which the longitudinal connection member extends. Therein, the lower support member may be attached to the longitudinal connection member downside of the opening and a lower isolation member may comprise a sleeve enclosing the longitudinal connection member in a region where the longitudinal connection member extends through the opening of the clamping member.

In such embodiments, the sleeve may consist of an electrically isolating material such as plastics. Such plastic sleeve may be easily produced, may be inexpensive and/or may be simply mounted to the fixation arrangement.

Particularly, the upper isolation member and/or the lower isolation member may comprise a washer having the sleeve extending therefrom in an axial direction.

Expressed in a different manner, the upper and/or lower isolation member may comprise a disk-like portion similar to a washer and a cylindrical tube-like portion forming the sleeve. Therein, the washer-like portion may be arranged substantially vertical and between an underlying component such as e.g. the fixation structure and an overlying component such as e.g. the upper support member of the fixation arrangement whereas the sleeve-like portion encloses the longitudinal connection member at least in an area where it extends through the opening in the fixation structure thereby avoiding any lateral electrical contact between the longitudinal connection member and the fixation structure within the opening.

Preferably, the washer and the sleeve form an integral component. In other words, the washer and the sleeve are formed by one and the same component, preferably a plastic component. Such plastic component may for example be moulded or casted.

In order to enable monitoring of an integrity or, more general, a state of the STM, the elevator arrangement may further comprise a monitoring unit which is electrically connected to the cords of the STM and which is adapted for applying electrical voltages to the cords and for monitoring a current state of the STM based on measuring characteristics of an electrical voltage in the cords resulting from the applied electrical voltages.

While such monitoring units have already been developed and applied mainly in novel elevator installations, it is intended to provide its monitoring capability also to existing elevator arrangements. Therein, benefit may be taken from the inventive feature described herein according to which the fixation arrangement in the elevator arrangement is provided with an electric isolation between the suspension traction means and the fixation structure. Accordingly, such monitoring unit may provide at least for a subset of measurements to enable determining a subset of possible faults within the STM.

In a preferred embodiment, the suspension traction means comprise at least one belt having the electrically conductive cords comprised within an electrically isolating enclosure (sometimes also referred to as "jacket"). As indicated in the preceding sections, in such belt, an integrity or state of the cords may be supervised and, particularly, damages in the isolating enclosure may be detected.

According to a second aspect of the present invention of concept 4, a method for modernizing an existing elevator arrangement is proposed. Therein, the existing elevator arrangement comprises an elevator shaft including at least one fixation structure, suspension traction means comprising a plurality of electrically conductive cords, an elevator car which is at least partly carried by the suspension traction means and a fixation arrangement for attaching the suspension traction means in a load carrying manner to the fixation structure. The method comprises at least a step of modifying the fixation arrangement such as to provide for an electric isolation between the suspension traction means and the fixation structure.

In other words, it is proposed to, upon modernizing an existing elevator arrangement, specifically modify the fixation arrangement of the elevator arrangement in a way such that it does no more provide for an electrically conductive path between the suspension traction means and the electrically grounded fixation structure. Instead, such preceding existing electrically conductive path may be interrupted by for example interposing an isolation member such as for example an electrically isolating washer for example between an upper support member supported at the fixation structure and connected to for example a clamping member clamping the suspension traction member, on the one side, and a load carrying structure of the fixation structure, on the other side.

Particularly, according to an embodiment, a monitoring unit may be provided for the already existing elevator arrangement during modernisation thereof. The monitoring unit may be electrically connected to the cords of the suspension traction means and may be adapted for applying electrical voltages to the cords and for monitoring a current state of the suspension traction means based on measuring characteristics of an electrical voltage in the cords resulting from the applied electrical voltages.

Accordingly, upon modernising an existing elevator arrangement not comprising any monitoring capabilities for determining deteriorations within for example belts forming the suspension traction media or at least not comprising modern monitoring capabilities for determining such deteriorations based on measuring electrical characteristics in the suspension traction media, several modernisation steps may be applied.

As a first modernization step, a modern monitoring unit may be included in the existing elevator arrangement. Such monitoring unit may be adapted to, for example, apply electrical voltages to the cords comprised in the STM. For example, several phases of alternating voltages (AC) may be applied to different cords comprised in one or more belts, the phases possibly being shifted with respect to each other. In such scenario, electrical characteristics of the cords may be determined by measuring for example electrical voltages resulting within the cords upon interference of the various voltage phases applied thereto. Such measured electrical characteristics may then be taken as indicating physical characteristics of the STM and its cords and may therefore be used for determining for example deteriorations in the cords. Such or similar monitoring techniques and monitoring devices have been presented for example by the applicant of the present application in several preceding patent applications such as EP15166033.9, U.S. 62/199,375, U.S. Ser. No. 14/814,558, EP16155357.3 and EP16155358.1, the content of which is herein incorporated by reference.

Such modern monitoring units typically enable a wide variety of monitoring capabilities. For example, electrical connections to ground may be determined and may be interpreted as resulting from deteriorations in the suspension traction medium such as local piercings or exposures in its jacket enclosing the cords.

However, as already briefly indicated further above, portions of cords of for example an STM belt being clamped in the fixation arrangement may come into electrical contact to the fixation arrangement. While this, in general, is not harmful and does not present a critical deterioration for the STM, it may result in a condition in which these cords are electrically connected to ground and/or to one another via the fixation arrangement as in conventional elevator arrangements, this fixation arrangement is typically connected to ground by being attached to the fixation structure in the elevator shaft, which fixation structure itself in many elevator configurations being electrically grounded.

While such electrical grounding of the STM's cords via the fixation arrangement or short-circuit of the cords to themselves is generally harmless, it may nevertheless prevent detecting other electrical groundings of the STM's cords, which might occur upon more serious deteriorations of the STM. E.g, while short-circuiting of the cords to one another or to ground via the fixation arrangement does not negatively influence the integrity of the STM and its load carrying capacity of suspending elevator components, it would prevent detecting additional ground connections, e.g. when a single STM cord penetrates the jacket and connects to a grounded elevator component. In other words, such defects or faults would not be detectable as there already exists a ground connection of the cords via the fixation arrangement.

Accordingly, as a second modernization step, it may be advantages to, upon modernising an existing elevator arrangement and providing it with a modern monitoring unit, also provide for an electrical isolation between the fixation arrangement holding the STM, on the one side, and the fixation structure in the elevator shaft, on the other side. Thereby, also monitoring capabilities of the monitoring unit for detecting electrical ground connections may effectively be used for detecting potentially harmful deteriorations of the STM, particularly for detecting damages at the STM's jacket.

It shall be noted that possible features and advantages of embodiments of the invention of concept 4 are described herein partly with respect to an elevator arrangement in general and partly with respect specifically to its fixation arrangement. Furthermore, possible features and advantages of embodiments of the invention are also described herein partly with respect to a method for modernising an existing elevator arrangement. One skilled in the art will recognize that the features may be suitably transferred from one embodiment to another and features may be modified, adapted, combined and/or replaced, etc. in order to come to further embodiments of the invention.

In the following, advantageous embodiments of the invention will be described with reference to the enclosed drawings of concept 4. However, neither the drawings nor the description shall be interpreted as limiting the invention.

DESCRIPTION OF THE DRAWINGS

Figure 28:
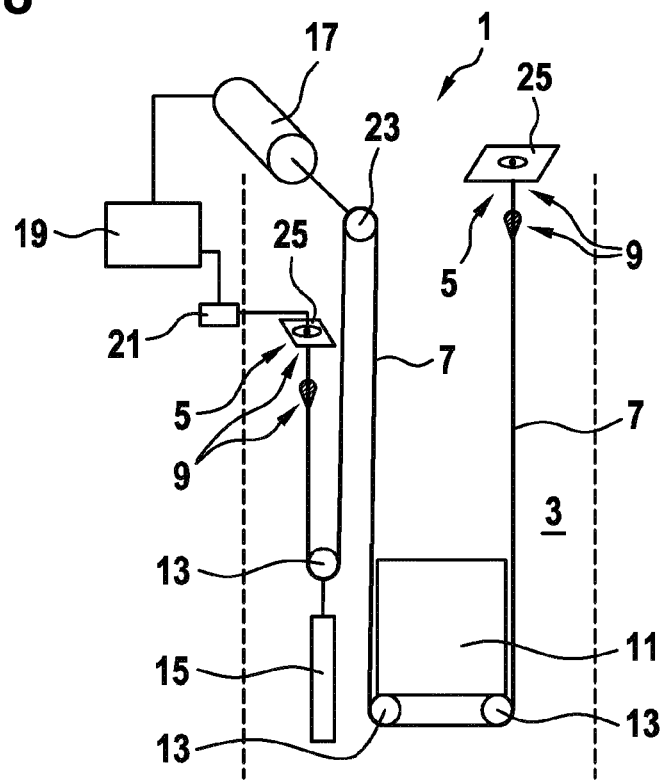

FIG. 28 represents components of an elevator arrangement.

Figure 29:
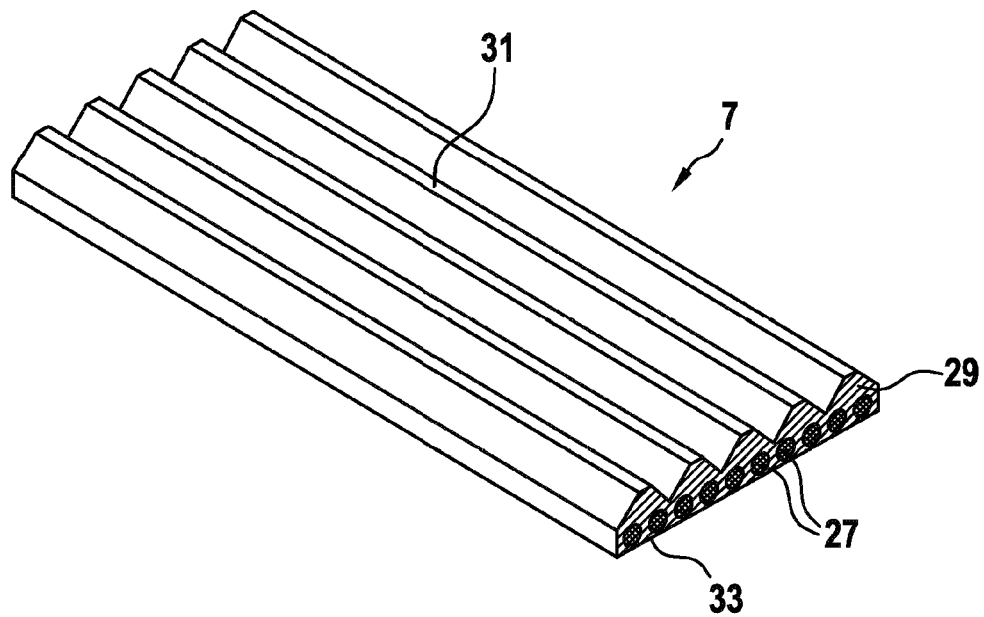

FIG. 29 shows a perspective representation of a belt-like suspension traction means.

Figure 30:
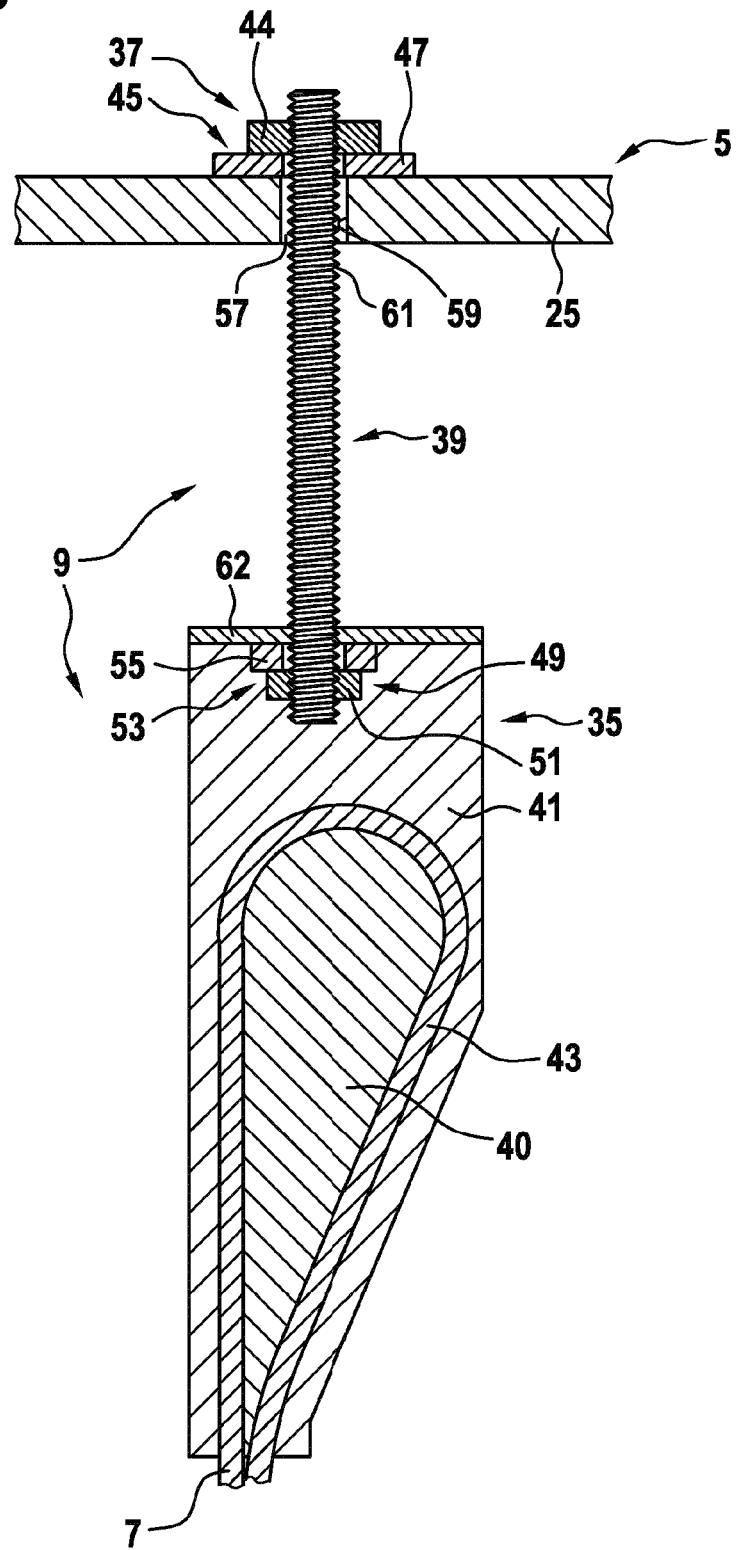

FIG. 30 shows a fixation arrangement for an elevator arrangement according to an embodiment of the present invention.

Figure 31:
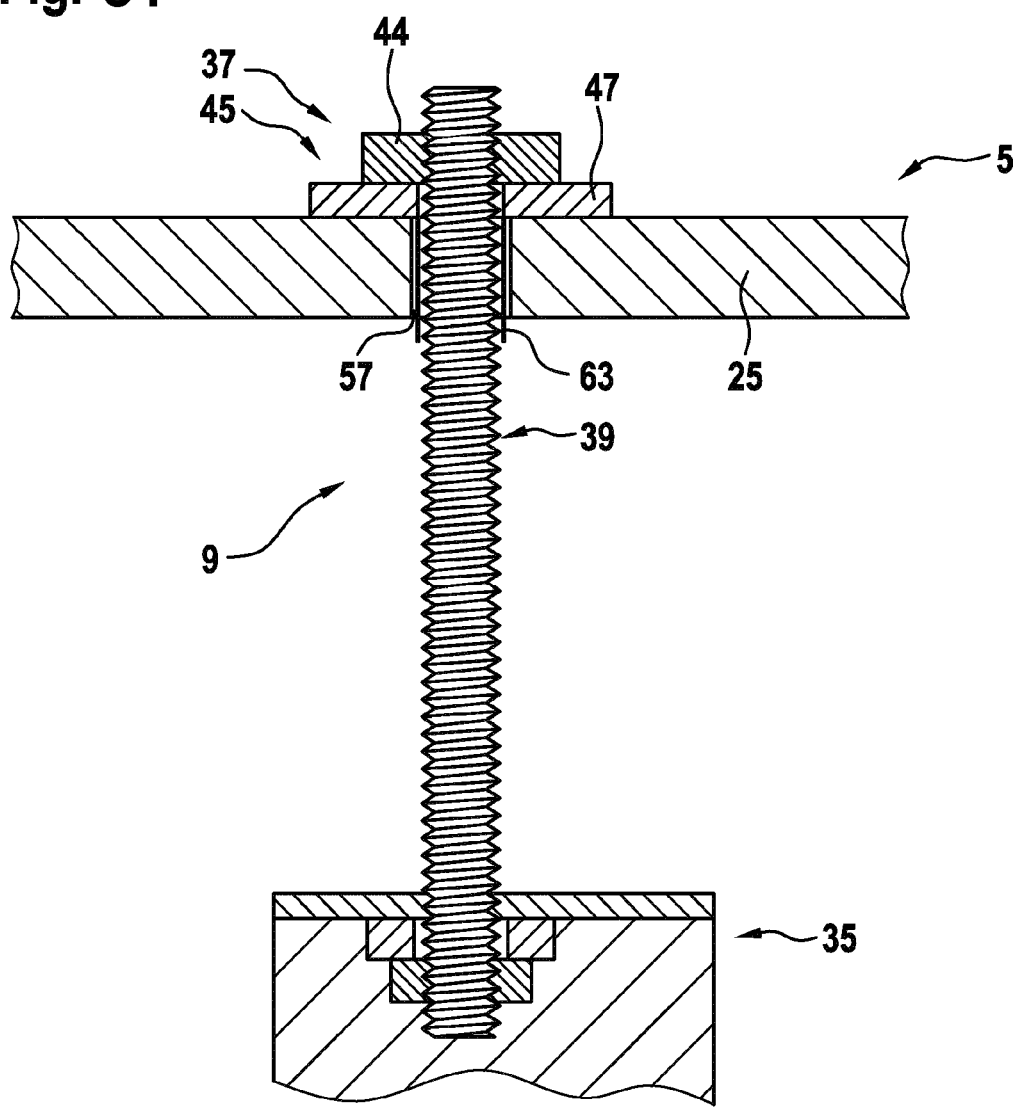

FIG. 31 shows a fixation arrangement for an elevator arrangement according to another embodiment of the present invention.

The figures are only schematic and not to scale. Same reference signs refer to same or similar features.

DETAILED DESCRIPTION

FIG. 28 shows an elevator arrangement 1 which may be embodied in accordance with the present invention. The elevator arrangement 1 comprises an elevator shaft 3 in which two fixation structures 5 are provided. The fixation structures 5 are only indicated schematically and may comprise a load carrying structure 25 such as a plate arranged and held for example at a ceiling of the elevator shaft 3 or are attached to the upper end of at least one guide rail, i.e. sitting on top of the at least one guide rail. A suspension traction means 7 formed for example by several belts or ropes is attached to the fixation structures 5 via fixation arrangements 9, respectively. The STM 7 is arranged and adapted for carrying the load of an elevator car 11 and of a counterweight 15, respectively. For such purpose, the STM 7 extends downwards from respective fixation arrangements 9 towards the elevator car 11 and the counterweight 15, respectively, and is wound around pulleys 13 arranged at these movable elevator components. The STM 7 is then directed upwards again towards a traction sheave 23. The traction sheave may be driven into rotation by a drive engine 17, the operation of which is controlled by an elevator control 19.

An integrity or state of the STM 7 may be monitored by a monitoring unit 21 which is electrically connected to conductive cords comprised within the STM 7 and which may monitor characteristics of an electric current induced in these electrically conductive cords.

FIG. 29 shows an example of a portion of a belt-like STM 7. The STM 7 comprises multiple cords 27 made for example from metallic cables, braids, strands or fibres. The cords 27 are enclosed within an enclosure 29 or jacket. The enclosure is typically provided with an electrically isolating material such as a polymer material such that it may, on the one hand, protect the inner cords 27 against for example environmental influences and, on the other hand, electrically isolate the cords 27 from each other and from external components. In the example shown, the belt-like STM 7 comprises a profile 31 at its front-side contact surface where it contacts for example a traction surface of the traction sheave 23 whereas a rear side 33 of the STM 7 is planar.

FIG. 30 shows details of a fixation arrangement 9 for an elevator arrangement 1 according to an embodiment of the present invention. The fixation arrangement 9 comprises a clamping member 35, a longitudinal connection member 39 and an upper support member 37. The clamping member 35 comprises a wedge 40 comprised in a clamp housing 41. Therein, the belt-like STM 7 may be formed into a loop 43 around the wedge 40 such that it is wedged or pitched between the wedge 40 and the housing 41 due to the load applied to the STM 7 in the downward-direction drawing the wedge 40 into the tapering housing 41.

On an upper portion of the housing 41 of the clamping member 35, a lower support member 49 is provided for mechanically supporting the clamping member 35. Such lower support member 49 may be for example a screw nut 51 which is fixedly held at the housing 41. Alternatively, the threaded rod forming the longitudinal connection member 39 may be fixed directly within the clamp housing 41, e.g. using a threaded connection.

The longitudinal connection member 39 may be for example a threaded rod which may be screwed into the screw nut 51 or into a thread integrally provided in the clamp housing 41. On its opposite end, the connection member 40 may be attached to the upper support member 37. For example, this upper support member 37 may be another screw nut 44 to which the threaded rod forming the connection member 39 is threaded. Therein, the upper support member 37 is arranged upside of an opening 57 through the fixation structure 5. The opening 57 may be a hole in a plate forming the load carrying structure 25 of the fixation structure 5.

Upon being clamped within the clamping member 35, the isolating enclosure 29 of the belt-like STM 7 may be locally damaged such that cords 27 comprised therein may come into mechanical and electrical contact with portions of the clamping member 35. Typically, the clamping member 35 has to be mechanically stable and is therefore made from a load bearing material such as metal. Accordingly, exposed cords 27 may come into contact with electrically conductive portions of the clamping member 35.

In order to provide for an electric isolation between the STM 7, on the one hand, and the fixation structure 5, which is typically electrically grounded, on the other hand, the fixation arrangement 9 comprises one or more isolation members 45, 53 interposed in a load carrying path along which the STM 7 is mechanically attached to the fixation structure 5 via the fixation arrangement 9.

Solutions exist where the wedge of a wedge clamp is embodied as a non-conductive material. However, a change of the wedge from a conductive to a non-conductive wedge regularly requires the STM to be replaced as well. Accordingly, in a modernization, the exchange of the conductive to a non-conductive wedge is not practicable.

In the example shown in FIG. 30, such isolation members 45, 53 may be made with at least one of an electrically isolating washer 47 and an electrically isolating washer 55. Therein, an upper isolating member 45 may be interposed between the upper support member 37, i.e. the screw nut 44 threaded onto the longitudinal connection member 39, on the one side, and an upper surface of the load carrying structure 25 of the fixation structure 5, on the other side.

Alternatively or additionally, such intended electrical isolation within the load carrying path may be established at a side of the clamping member 35. There, an electrically isolating washer 55 may form a lower isolation member 53 interposed between the lower support member 49 formed by the screw nut 51, on the one side, and a load carrying structure 62 of the clamping member 35, on the other side.

The upper isolation member 45 and/or the lower isolation member 53, i.e. the washer 47 and/or the washer 55, may be adapted such that, on the one hand, they are sufficiently mechanically stable in order to transmit the substantive mechanical loads acting onto the STM 7 via the fixation arrangement 9 towards the fixation structure 5. On the other hand, these upper and/or lower isolation members are adapted for providing a sufficient electric isolation such that no electrically conductive connection may be established towards the electrically grounded fixation structure 5.

In the embodiment shown in FIG. 30, the upper and/or lower isolation members 45, 53 are provided with simple washers, 47, 55. However, as the longitudinal connection member 39 extends through the opening 57 in the fixation structure 5 and this opening 57 being only slightly larger than the cross-section of the connection member 39, there might be a risk of lateral walls 61 of the connection member 39 coming into contact with inner walls 59 of the opening 57 in the fixation structure 5.

Therefore, according to an embodiment as shown in FIG. 31, it is proposed to provide for example the upper isolation member 45 with an additional sleeve 63. This sleeve 63 encloses the longitudinal connection member 39 in a region where it extends through the opening 57 of the fixation structure 5. For example, the sleeve 63 may have a cylindrical geometry and a threaded rod forming the connection member 39 may extend through a hollow inner portion of such sleeve 63.

Preferably, the sleeve 63 is integral with the washer 47 such that the upper isolation member 45 is formed by a single component comprising the horizontally extending washer 47 and the vertically extending sleeve 63. Using such upper isolation member 45, any electrical connection between the longitudinal extension member 39, on the one hand, and the grounded fixation structure 5, on the other hand, may be prevented even in cases where the connection member 39 may be pressed in a direction towards the inner walls 59 of the opening 57 in the fixation structure 5.

Alternatively or additionally, a sleeve may also be provided at a washer 55 forming the lower isolation member 53 (this alternative not being shown in the figures).

Due to the electric isolation or decoupling of the fixation arrangement 9 from the grounded fixation structure 5, the monitoring unit 21 may monitor the STM 7 for damage-related electrical ground connections even in cases where the cords 27 comprised in the STM 7 are electrically connected to portions of the fixation arrangement 9. Accordingly, subsets of faults of the STM 7 may be detected by adding the monitoring unit 21 for example in systems after original installation, in particular with already short-circuited cords 27 in the fixation arrangement 9. Thus, at least a reduced option of STM monitoring may be offered to customers of existing elevator installations as a relatively simple add-on.

LIST OF REFERENCE SIGNS 1 elevator arrangement
2 elevator shaft
5 fixation structure
7 suspension traction means
9 fixation arrangement
11 elevator car
13 pulley
15 counterweight
17 drive engine
19 elevator control
21 monitoring unit
23 traction sheave
25 load carrying structure
27 cords
29 enclosure
31 profiled front side of STM
33 rear side of STM
35 clamping member
37 upper support member
39 longitudinal connection member
40 wedge
41 housing
43 loop
44 screw nut
45 upper isolation member
47 washer
49 lower support member
51 screw nut
53 lower isolation member
55 washer
57 opening
59 inner walls of the opening in the fixation structure
61 lateral walls of the connection member
62 load carrying structure
63 sleeve Approaches defining features of the concept 4 may be defined as follows:

1. Elevator arrangement (1), comprising:
    an elevator shaft (3) including at least one fixation structure (5);
    suspension traction means (7) comprising a plurality of electrically conductive cords (27);
    an elevator car (11) which is at least partly carried by the suspension traction means (7);
    a fixation arrangement (9) for attaching the suspension traction means (7) in a load carrying manner to the fixation structure (5);
  wherein the fixation arrangement (9) is adapted such as to provide for an electric isolation between the suspension traction means (7) and the fixation structure (5).

2. Elevator arrangement of approach 1, wherein the fixation arrangement (9) comprises an isolation member (45, 53) interposed in a load carrying path along which the suspension traction means (7) is mechanically attached via the fixation arrangement (9) to the fixation structure (5), the isolation member (45, 53) being adapted for electrically isolating the suspension traction means (7) from the fixation structure (5).

3. Elevator arrangement of one of approaches 1 and 2, wherein the fixation arrangement (9) comprises:
    a clamping member (35) clamping the suspension traction member (7),
    an upper support member (37) supported at the fixation structure (5) and
    a longitudinal connection member (39) mechanically connecting the clamping member (35) and the upper support member (37) in a load carrying manner.

4. Elevator arrangement of approach 3, wherein the fixation arrangement (9) further comprises an upper isolation member (45) interposed between the upper support member (37) and a load carrying structure (25) at the fixation structure (5), the upper isolation member (45) being adapted for electrically isolating the upper support member (37) and/or the longitudinal connection member (39) from the fixation structure (5).

5. Elevator arrangement of approach 3 or 4, wherein the fixation arrangement (9) further comprises a lower support member (49) supporting the clamping member (35) and a lower isolation member (53) interposed between the lower support member (49) and a load carrying structure (62) at the clamping member (35), the lower isolation member (53) being adapted for electrically isolating the lower support member (49) from the clamping member (35) and/or the longitudinal connection member (39).

6. Elevator arrangement of one of approaches 3 to 5, wherein at least one of the upper isolation member (45) and the lower isolation member (53) comprises a washer (47, 55) consisting of an electrically isolating material.

7. Elevator arrangement of one of approaches 3 to 6, wherein the fixation structure (5) comprises an opening (57) through which the longitudinal connection member (39) extends, the upper support member (37) being attached to the longitudinal connection member (39) upside of the opening (57), wherein an upper isolation member (45) comprises an electrically isolating sleeve (63) enclosing the longitudinal connection member (39) in a region where the longitudinal connection member (39) extends through the opening (57) of the fixation structure (5).

8. Elevator arrangement of one of approaches 3 to 7, wherein the clamping member (35) comprises an opening through which the longitudinal connection member (39) extends, the lower support member (49) being attached to the longitudinal connection member (39) downside of the opening, wherein a lower isolation member (53) comprises an electrically isolating sleeve enclosing the longitudinal connection member (39) in a region where the longitudinal connection member (39) extends through the opening of the clamping member (35).

9. Elevator arrangement of one of approaches 7 and 8, wherein at least one of the upper isolation member (45) and the lower isolation member (53) comprises a washer (47, 55) having the sleeve (63) extending in an axial direction therefrom.

10. Elevator arrangement of approach 9, wherein the washer (47, 55) and the sleeve (63) form an integral component.

11. Elevator arrangement of one of approaches 1 to 10, further comprising a monitoring unit (21) which is electrically connected to the cords (27) of the suspension traction means (7) and which is adapted for applying electrical voltages to the cords (27) and for monitoring a current state of the suspension traction means (7) based on measuring characteristics of an electrical voltage in the cords (27) resulting from the applied electrical voltages.

12. Elevator arrangement of one of approaches 1 to 11, wherein the suspension traction means (7) comprise at least one belt having the electrically conductive cords (27) comprised within an electrically isolating enclosure (29).

13. Elevator arrangement of approach 1, wherein the fixation arrangement (9) comprises an isolation member (54, 53) interposed in a load carrying path along which the suspension traction means (7) is mechanically attached via the fixation arrangement (9) to the fixation structure (5), the isolation member (45, 53) being adapted for electrically isolating the suspension traction means (7) from the fixation structure (5), wherein the fixation arrangement (9) comprises:

a clamping member (35) clamping the suspension traction member (7),
an upper support member (37) supported at the fixation structure (5) and
a longitudinal connection member (39) mechanically connecting the clamping member (35) and the upper support member (37) in a load carrying manner, wherein the fixation arrangement (9) further comprises an upper isolation member (45) interposed between the upper support member (37) and a load carrying structure (25) at the fixation structure (5), the upper isolation member (45) being adapted for electrically isolating the upper support member (37) from the fixation structure (5), wherein the fixation structure (5) comprises an opening (57) through which the longitudinal connection member (39) extends, the upper support member (37) being attached to the longitudinal connection member (39) upside of the opening (57), wherein the upper isolation member (45) comprises a sleeve (63) enclosing the longitudinal connection member (39) in a region where the longitudinal connection member (39) extends through the opening (57) of the fixation structure (5), wherein the upper isolation member (45) comprises a washer (47) having the sleeve (63) extending in an axial direction therefrom.

14. Method for modernizing an existing elevator arrangement, the existing elevator arrangement comprising:
an elevator shaft (3) including at least one fixation structure (5);
suspension traction means (7) comprising a plurality of electrically conductive cords (27);
an elevator car (11) which is at least partly carried by the suspension traction means (7);
a fixation arrangement (9) for attaching the suspension traction means (7) in a load carrying manner to the fixation structure (5);
wherein the method comprises:
modifying the fixation arrangement (9) such as to provide for an electric isolation between the suspension traction means (7) and the fixation structure (5).

15. Method of approach 14, further comprising:
providing a monitoring unit (21) for the elevator arrangement, which monitoring unit (21) being electrically connected to the cords (27) of the suspension traction means (7) and being adapted for applying electrical voltages to the cords (27) and for monitoring a current state of the suspension traction means (7) based on measuring characteristics of an electrical voltage in the cords (27) resulting from the applied electrical voltages.

CONCEPT V

Method and Device for Determining a Deterioration State in a Suspension Member for an Elevator

FIELD

The present invention according to concept 5 relates to a method and to a device for determining a deterioration state, particularly a deterioration state of a load bearing capacity, in a suspension member arrangement for an elevator.

BACKGROUND

A technical background relating to the concept 5 of determining deterioration state of a suspension member and some references to prior art approaches are similar to those described in the introductory portions of the descriptions of concepts 1 to 3.

In these specific approaches, while electrical characteristics of suspension members and the cords comprised therein are determined, it is not necessary to specifically measure any electrical resistances in the cords or any magnitude of electrical currents through the cords but, instead, it may be enabled to obtain information about the electrical characteristics of the suspension member by correlating for example various electrical measurements and interpreting results from such relative correlation. In other words, in these approaches it may not be necessary to have any detailed knowledge about absolute resistance values or current values but it may be sufficient to correlate various electrical measurements in order to obtain valuable information about electrical characteristics in the suspension member which allow determining information about the deterioration state of such suspension member.

In another alternative approach, a deterioration state of a suspension member is not detected by measuring any physical parameters of the suspension member itself but, instead, it is assumed that the suspension member deteriorates over time mainly due to wear occurring as a result of bending the suspension member. Such approach is for example described in WO 2010/007112 A1, the disclosure of which shall be incorporated herein by reference.

There may be a need for an alternative method and device for determining a deterioration state in a suspension member arrangement for an elevator. Particularly, there may be a need for such method and device which enable fulfilling high safety requirements, simple implementation and/or low cost.

SUMMARY

Such needs may be met with the subject-matter of the approaches of concept 5 described hereinafter. Beneficial embodiments are defined in the approaches of concept 5 described hereinafter and in the following specification.

A first aspect of the present invention according to concept 5 relates to a method for determining a deterioration state in a suspension member arrangement for an elevator. The suspension member arrangement comprises at least one suspension member comprising a plurality of electrically conductive cords. The method comprises at least the following steps:

counting a number of bending cycles applied to the suspension member;
determining an electrical characteristic of the suspension member;
performing
(a) determining a critical deterioration state upon monitoring both:
the counted number of bending cycles applied to the suspension member and
the determined electrical characteristic of the suspension member;
and/or
(b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state; and initiating a defined procedure upon the determining of at least one of the critical deterioration state and the unexpected deterioration state.

Without restricting the scope of the invention of concept 5 in any way, ideas underlying embodiments of the invention may be understood as being based, inter alia, on the following recognitions and observations:

On the one hand, in conventional approaches for detecting a deterioration state of a load bearing capacity in a suspension member arrangement such as some of those approaches indicated in the above introductory portion, electrical characteristics of cords included in a suspension member have been taken as indicators for changes in the deterioration state of the suspension member. In some of the prior art approaches, electrical resistances or other electrical characteristics within the cords have been measured and it has been assumed that an increase of such electrical resistances correlates to a deterioration of the load bearing capacity of the suspension member.

However, it has been found that it may be very difficult or even impossible to define sufficiently precise quantitative indicators for a critical or unexpected deterioration state of a suspension member based only on measuring electrical characteristics in the suspension member. For example, wear, fatigue phenomena and/or corrosion may slowly deteriorate the suspension member and particularly its load bearing capacity. It has been found that particularly deteriorations of the suspension member due to such slowly acting effects may be very difficult to be detected. While it is assumed that such effects may alter for example electrical resistances through the cords of the suspension member, it is hardly possible to determine any unambiguous indicators such as for example maximum electrical resistance values which, when being exceeded, would necessarily indicate excessive deterioration of the suspension member.

On the other hand, alternative approaches for determining the deterioration state of the suspension member only based on counting specific deteriorating events such as counting bendings of the suspension member may also be assumed as being insufficient for unambiguously indicating excessive deterioration of the suspension member. This is particularly true as such approaches mainly rely on wear and deterioration experiments performed under specific conditions.

For example, using a new suspension member directly after its fabrication, experiments have been performed in which the suspension member was put under substantial mechanical stress by repeated bending thereof and it was then tested after which number of bendings the suspension member loses for example 20% or 40% of its initial load bearing capacity, such loss being assumed as an excessive deterioration. Based on such experiments, it is then assumed that the suspension member may be bent at least a specific number of times before being excessively deteriorated such that it needs to be for example replaced.

However, as these experiments are generally performed under specific conditions in which it is assumed, on the one hand, that the suspension member in its initial state is not deteriorated and in which is furthermore assumed, on the other hand, that deteriorations within the suspension member mainly occur due to repeated bending thereof, such approaches for determining deteriorations may generally ignore other influences which also may deteriorate the quality of the suspension member.

For example, incorrect handling of the suspension member during e.g. transport from a fabrication site to an installation site and/or during installation of the suspension member at the installation site may harm the integrity of the suspension member. For example, a belt serving as a suspension member may be damaged during transportation or installation such that its polymer jacket enclosing its cords is damaged. Due to such damage, the cords may for example be exposed, i.e. be no more protected by the jacket, such that e.g. local corrosion of the exposed cords may significantly deteriorate the quality of the belt.

In other words, it has been found that both conventional approaches, i.e. the measuring of electrical characteristics as well as the counting of bendings of the suspension member, when taken as a single measure may not reliably indicate excessive deterioration of the suspension member.

It is therefore proposed herein to combine these conventional approaches in order to provide for a more reliable method for determining a deterioration state in a suspension member arrangement. Therein, the number of bending cycles applied to the suspension member is counted as one measure and, additionally as another measure, electrical characteristics of the suspension member are determined.

A critical deterioration state may then be determined for example when either the counted number of bending cycles exceeds a specific allowable maximum number of bending cycles or the measured electrical characteristics deviate from reference characteristics by more than an allowable maximum deviation.

Alternatively or additionally, an unexpected deterioration state may be determined by, on the one hand, deriving a current actual deterioration state of the suspension member based on the determined electrical characteristic(s) and, on the other hand, assuming a currently expected deterioration state based on the counted number of bending cycles and, finally, comparing the current actual deterioration state with the currently expected deterioration state. In other word it is verified whether or not the currently measured electrical characteristics of the suspension member indicate an actual deterioration state with conforms to an expected deterioration state as it may be assumed due to the counted number of bendings (i.e. the "operational age") of the suspension member.

Upon the determining the critical deterioration state and/or the unexpected deterioration state, an adequate defined procedure may be initiated such as e.g. stopping operation of the elevator, adequately modifying its operation, and/or informing a third party regarding the critical deterioration state and/or the unexpected deterioration state.

In other words, two generally independent indicators are monitored for finally determining whether the suspension member is excessively and/or unexpectedly deteriorated or not in order to then enable initiating suitable measures such as stopping an operation of the elevator and/or replacing the suspension member and/or providing relevant information to the operator or to servicing/maintenance staff of the elevator.

In such combined approach, it may be assumed, on the one hand, that a deterioration of the suspension member is mainly affected by repeated bending thereof. Thus, by counting the bending cycles and comparing e.g. with an allowable maximum number of bending cycles which has previously be determined based on for example intensive experimentation, a well-defined criterion for distinguishing between acceptable deteriorations and excessive deteriorations of the suspension member may be provided.

However, in the combined approach proposed herein, it is also taken into account that such assumption is generally only true as long as the suspension member is correctly handled and operated and is not, for example, damaged by other effects than the repeated bending thereof. Therefore, in order to also enable accounting for such additional deteriorating effects, electrical characteristics of the suspension member are also determined or measured and are additionally taken into account as an additional indicator for an excessive deterioration of the suspension member. As described in further detail below, such electrical characteristics may provide for reliable indicators indicating various types of damages to the suspension member all of which may immediately reduce for example a load bearing capacity of the suspension member or at least reduce a life cycle of the suspension member.

In other words, in the combined approach proposed herein, no or only an acceptable deterioration of the suspension member is generally assumed as long as the number of bending cycles applied to the suspension member does not exceed the allowable maximum number. However, this is only true as long as the electrical characteristics of the suspension member measured generally simultaneously with counting the bending cycles indicate that no specific damages or specific deteriorations occurred at the suspension member. If, however, such specific damages or a specific deteriorations are detected based on the electrical measurements, they may be taken as indicating excessive or unexpected deteriorations of the suspension member or, alternatively, they may be taken as at least influencing the deterioration state of the suspension member such that, for example, the allowable maximum number of bending cycles may be adapted or corrected to a lower value.

Accordingly, using the combined approach proposed herein, a reliability in determining an excessive deterioration state in a suspension member may be significantly improved in comparison to applying each single approach alone. Furthermore, synergy effects may occur upon combining the two prior art approaches thereby possibly further increasing an operation safety of the elevator and/or allowing economical benefits.

According to an embodiment of the present invention, the allowable maximum deviation about which the currently determined electrical characteristics are allowed to deviate from reference characteristics is determined taking into account the counted number of bending cycles applied to the suspension member.

In other words, the allowable maximum deviation about which the currently measured electrical characteristics may deviate from reference characteristics before being interpreted as indicating a critical deterioration state may not necessarily be a fixed number or parameter. Instead, such allowable maximum deviation may be determined taking into account how often the suspension member has already been bent, i.e. taking into account characteristics of the suspension member relating to its operational "age".

For example, measuring specific electrical characteristics for a relatively novel suspension member which has not yet significantly deteriorated due to repeated bending thereof may be interpreted as not yet indicating any critical deterioration state whereas measuring the same specific electrical characteristics for an old suspension member which has already been bent many times and which is therefore already significantly deteriorated and close to its end of life cycle may be interpreted as indicating an actually critical deterioration state for this old suspension member.

Accordingly, the two criteria for determining the critical deterioration state of the suspension member, i.e. the counted number of bending cycles and the currently measured electrical characteristics, do not necessarily have to be independently interpreted from each other but, to the contrary, may inter-correlate. Specifically, the counted number of bendings of the suspension member may be taken into account when deciding whether or not a specific measured electrical characteristics shall be interpreted as indicating a critical deterioration state or not.

This may advantageously result in an extended usability of the suspension member as, for example, the decision whether or not a critical deterioration state is present due to which, for example, the suspension member has to be replaced may be made on the basis of more sophisticated indications. For example, slight deviations in the measured electrical characteristics of the suspension member at the beginning of its life-cycle will not necessarily result in obligating any replacement of the suspension member whereas at a later stage in the life-cycle the same electrical characteristics may be interpreted as indicating critical deteriorations necessitating immediate replacement of the suspension member.

Alternatively, according to an embodiment of the present invention, the allowable maximum deviation is fixedly predetermined.

In other words, the allowable maximum deviation about which currently measured electrical characteristics may deviate from reference characteristics may be fixedly set. For example, such allowable maximum deviation may be derived from preceding experimentations. For example, tests or experiments may show that specific damages or critical deteriorations of the suspension member typically come along with a change in electrical characteristics such that when currently measured electrical characteristics of the suspension member alter by such specific deviation this may interpreted as indicating that critical deterioration state.

Assuming fixedly predetermined allowable maximum deviations may be implemented in a simple manner such as for example storing corresponding deviation values in a memory comprised in a device adapted for performing the monitoring method proposed herein.

According to an embodiment of the present invention, the allowable maximum number of bending cycles is determined taking into account the currently determined electrical characteristics of the suspension member.

In other words, similarly to the embodiment explained further above, the two determination criteria may be interpreted as influencing each other. In the present case, the allowable maximum number about which the suspension member may be bent before assuming its end of life due to excessive deterioration thereof may not be a fix number but, instead, may itself depend on currently measured electrical characteristics of the suspension member.

For example, when the measured electrical characteristics indicate that the suspension member is in a very good state although it is already rather old and has been bent many times, this information may be used to increase the allowable maximum number of bendings such that the suspension member is allowed to have a longer operational life than a suspension member for which the measured electrical characteristics already indicate some significant, but not yet critical, deteriorations.

Accordingly, the life-cycle of the suspension member may be adapted better to its actual deterioration conditions and suspension members may therefore potentially be used for a longer period of time without increasing a risk for failures.

Alternatively, according to an embodiment of the present invention, the allowable maximum number of bendings is fixedly predetermined.

Such fixedly predetermined maximum number may be derived for example from preceding experiments or tests. The fixed number may be easily stored for example in a device's memory for subsequent repeated comparing with the currently counted number of bending cycles.

According to an embodiment of the present invention, the reference characteristics to which the currently determined electrical characteristics may be compared are determined based upon measuring electrical characteristics of the suspension member in a non-deteriorated condition.

In other words, when determining whether the measured electrical characteristics indicate a critical deterioration state of the suspension member, currently measured electrical characteristics shall be compared to reference electrical characteristics which have been measured in a state in which the suspension member was not deteriorated, i.e. for example directly after fabricating and testing the suspension member. Accordingly, by comparing currently measured electrical characteristics with original electrical characteristics of the suspension member it may be determined whether or not these electrical characteristics have significantly altered and deviate from the original electrical characteristics by more than an allowable deviation. By specifically comparing the currently measured electrical characteristics with non-deteriorated characteristics, it may be determined for example whether the suspension member has been significantly damaged e.g. during transportation, storage and/or installation thereof.

As used herein, the term bending cycles may be understood for example as referring to a process of bending at least a portion of the suspension member in a direction transverse to its longitudinal direction. For example, the suspension member is bent when running along a traction sheave or a pulley. One bending cycle may be interpreted as resulting from bending at least a portion the suspension member once into a bending direction and then bending it back. Each back and forth bending generally significantly stresses the suspension member and induces wear effects.

According to an embodiment of the present invention, the suspension member is subdivided into several sections and a number of section bending cycles applied to each section of the suspension member is counted for each of the sections. The number of bending cycles applied to the suspension member is then set to correspond to the maximum of all numbers of section bending cycles counted for each of the sections of the suspension member.

In other words, bending cycles of the suspension member are preferably not simply counted independent of a location where the suspension member is bent. To the contrary, the suspension member is assumed to be subdivided into a multiplicity of sections and it is then determined at which of the sections the suspension member has been bent. The bending cycles are counted for each of the sections separately. For example, some sections of the suspension member are bent more frequently during typical operation of the elevator than other sections. This may be due to e.g. the fact that an elevator cabin is moved more frequently to specific floors such as a ground floor than to other locations.

The number of bending cycles taken as indicating whether or not a critical deterioration state has been reached is then not necessarily equal to the number of bendings applied to the suspension member in its entirety but shall correspond to the number of bendings applied to the section of the suspension member which has been bent most frequently.

Accordingly, as the number of bendings applied to each one of the various sections of the suspension member is typically significantly lower than the overall number of bendings applied to the entire suspension member, the life-cycle of the suspension member may be significantly extended while still providing for very high operational safety as the critical deterioration state of the suspension member may be determined as resulting from its "weakest section". I.e. the critical deterioration state of the suspension member is determined based on the counted number of bending cycles applied to the section which has been bent most frequently.

A similar approach has been described by the applicant of the present application in previous patent applications and/or patents WO 2010/007112 A1 and EP 2 303 749 B1 which shall be incorporated herein in their entirety by reference. It shall be specifically noted that protection is or may be sought also for such features described in these previous applications and/or patents and that such features may contribute to achieving the technical aim of embodiments of the present invention and may thus be comprised in the solution of the technical problem underlying the invention which is the subject of the present application. Particularly, such features may implicitly clearly belong to the description of the invention contained in the present application as filed, and thus to the content of the application as filed. Such features are precisely defined and identifiable within the total technical information within the reference documents.

In a significantly simplified approach, the number of bending cycles applied to the suspension member may be set equal to a number of trips performed by the elevator in one motion direction before reversing the motion direction. It is then assumed that during each trip the suspension member is bent at least in some of its sections due to e.g. being guided along a traction sheave or pulley. The same sections may only be bent again if the motion direction of the elevator is reversed at a later point in time and the sections are guided again along the traction sheave of pulley. In other words, in such simplified approach, the number of bending cycles may be taken as being related to a number of times of reversal of the motion direction of the elevator during its operation.

Such approach may be particularly easy to implement as many elevators comprise a trip counter such that the number of bendings of the suspension member may easily be assumed to correspond to the number of trips counted by the trip counter. However, such approach does not take into account that generally during each trip only some, but not all, of the sections of the suspension member will be bent. Accordingly, such simplified approach will generally result in assuming a critical deterioration state earlier than with the more sophisticated approach describe before.

According to an embodiment of the present invention, the measuring of the electrical characteristics of the suspension member comprises at least one of:
  electrical measurements indicating that at least one cord in the suspension member is broken;
  electrical measurements indicating that an electrical connection between a voltage supply for applying the electrical voltage to the at least one of the cords and the at least one of the cords is interrupted;
  electrical measurements indicating that at least one cord in the suspension member is electrically connected to ground;
  electrical measurements indicating that at least two cords in the suspension member are shorted;
  electrical measurements indicating that an electrical conductivity through at least one of the cords of the suspension member changed over time.

In other words, the step of measuring electrical characteristics of the suspension member may comprise one or more of different types of electrical measurements, each type specifically relating to a specific type of deterioration or damage possibly occurring within a suspension member.

For example, electrical measurements may indicate that at least one of the cords comprised in the suspension member is broken. In such case, an electrical connection through the broken cord is generally interrupted which may be easily detected e.g. by applying an electrical test voltage to the cord at one end thereof and detecting a resulting voltage for example at the opposite end of the suspension member. One or more broken cords in a suspension member typically represent a severe deterioration of the load bearing capacity of the suspension member.

As a further example, electrical measurements may be used for testing whether or not the voltage supply for applying the electrical voltage to the at least one cord is still correctly connected to the respective cord or whether there is an electrical interruption. While such interruption may not necessarily indicate a critical deterioration of the load bearing capacity of the suspension member, it may still represent a critical deterioration state for the elevator as due to such interruption no meaningful measurements of electrical characteristics may be performed at the suspension member. Therefore, detecting such non-connected voltage supply or electrical interruption may be necessary for securing the safety of the elevator.

As a third example, electrical measurements may indicate that at least one of the cords comprised in the suspension member is electrically connected to ground. Such ground connection may typically occur as a result of damages to the jacket enclosing the cords. Due to such damages, one or more cords may be locally exposed and may therefore come into contact for example with electrically grounded sheaves or pulleys or other components within an elevator arrangement. Accordingly, upon detecting any electrical grounding of one or more cords, it may be assumed that for example the jacket of the suspension member is damaged, such damage possibly immediately or over a longer term resulting in a deterioration of the suspension member.

As a fourth example, electrical measurements may indicate that at least two cords in the suspension member are electrically connected to each other, i.e. are shorted. Such electrical shorting may occur typically upon the isolating portions of the jacket between neighboring cords being damaged. Accordingly, detecting such electrical shortings may be taken as indicating damages of the jacket which may potentially result in a deterioration of the suspension member.

As a final example, electrical measurements may indicate that an electrical conductivity through at least one of the cords comprised in the suspension member changed over time, i.e. does no more correspond to the electrical conductivity through the cords in their initial state. Such changes in electrical connectivity may result from changes in other physical characteristics of the cords such as general or local corrosion of the cords. Accordingly, changes in the electrical conductivity may indirectly indicate changes in these other physical characteristics which may then correlate to a critical deterioration state, particularly with a reduced load bearing capacity, of the suspension member.

According to an embodiment of the present invention, the determining of electrical characteristics comprises at least one of:
  determining an electrical resistivity through the suspension member,
  determining an electrical conductivity through the suspension member, determining an inductivity through the suspension member, determining electrical characteristics using magnetic measurements applied to the suspension member, and determining electrical characteristics using phase measurements applied to the suspension member.

For example, prior art approaches such as those mentioned in the introductory portion teach that a deterioration state of a suspension member may be at least qualitatively or even quantitatively determined based upon measuring electrical resistances through cords of the suspension member. Accordingly, by for example measuring such electrical resistances, it may be determined whether a critical deterioration state occurred at the suspension member e.g. due to continuous wear such that e.g. the suspension member should be replaced even before an allowable number of bending cycles has been reached. Alternatively, by for example measuring such electrical resistances, it may be verified whether an expected deterioration state of the suspension member which is assumed only based on the operation age of the suspension member, i.e. the number of bending cycles applied thereto, corresponds to the actual deterioration state as derived from the electrical characteristics, i.e. in this case the measured electrical resistance.

According to an embodiment of the present invention, upon measuring the electrical characteristics, an electric indicator current $I_n$ correlating to a net sum of all phases of a multi-phase alternating current is measured, wherein at least one of the phases of the multi-phase alternating current is applied to one of the cords of the suspension member.

According to a more specific embodiment of the present invention, the measuring of electrical characteristics of the suspension member comprises:

providing a multi-phase alternating current circuitry including multiple electrically conductive legs;

applying at least one phase of a multi-phase alternating current to at least one of the cords of the suspension member by being electrically connected to one of the legs of the multi-phase alternating current circuitry;

applying at least one other phase of the multi-phase alternating current to at least one of another at least one cord of the suspension member and at least one separate resistor being electrically connected to at least one other leg of the multi-phase alternating current circuitry, wherein a peak current in each phase is shifted by a phase angle with respect to a peak current in another phase;

measuring an electric indicator current $I_n$ being at least one of:

a net sum of all phases of the multi-phase alternating current and an electric bypass current through a neutral wire being connected in parallel to the multi-phase alternating current circuitry;

determining the measured electrical characteristics of the suspension member based on the measured indicator electric current.

This embodiment closely relates to the invention of concept 1 and details and further specific embodiments thereof are describes in detail there.

According to an embodiment of the present invention, the suspension member has a first and a second group of electrically conductive cords. Therein, the measuring of electrical characteristics comprises:

applying a first alternating voltage $U_1$ to a first end of the first group of cords of the suspension member;

applying a second alternating voltage $U_2$ to a first end of the second group of cords of the suspension member;

wherein the first and second alternating voltages have same waveforms and a phase difference of 180°;

determining at least one of (i) a summed voltage $U_+$ correlating to a sum $(U_3+U_4)$ of a third voltage $U_3$ between a second end of the first group of cords and a common electrical potential and a fourth voltage $U_4$ between a second end of the second group of cords and the common electrical potential;

(ii) a differential voltage $U_-$ correlating to a difference between the third voltage $U_3$ and the fourth voltage $U_4$;

determining the electrical characteristics of the suspension member based on at least one of the summed voltage $U_+$ and the differential voltage $U_-$.

Preferably, the second end of the first group of cords and the second end of the second group of cords are electrically connected via a connecting electrical resistance ($R_S$). Preferably, the deterioration state is determined based on both the summed voltage $U_+$ and the differential voltage $U_-$.

Preferably, any deviation from a state in which the summed voltage $U_+$ comprises no alternating voltage component $U_{+,AC}$ and the differential voltage $U_-$ comprises a alternating voltage component $U_{-,AC}$ is interpreted as indicating a deterioration in the suspension member arrangement.

This embodiment closely relates to the invention of concepts 2 and 3 and details and further specific embodiments thereof are describes in detail there.

According to a second aspect of the present invention of concept 5, a monitoring arrangement for determining a deterioration state of e.g. a load bearing capacity in a suspension member arrangement for an elevator is proposed. The suspension member comprises a plurality of electrically conductive cords. The monitoring arrangement is configured to perform a method according to an embodiment of the above described first aspect of the invention of concept 5.

Particularly, according to an embodiment of the present invention, the monitoring arrangement may comprise:

a counter device which is configured for counting a number of bending cycles applied to the suspension member based on information obtained from an elevator control device for controlling operation of the elevator;

an electrical measuring device which is electrically connected to at least one of the cords in the suspension member and which is configured for measuring an electrical characteristic of the suspension member upon applying an electrical voltage to the at least one of the cords;

a determination device which is configured for determining at least one of (a) a critical deterioration state of the suspension member (23) upon monitoring both: the counted number of bending cycles applied to the suspension member (11), and the determined electrical characteristic of the suspension member (11);

and (b) an unexpected deterioration state of the suspension member (23) based on deriving a current actual deterioration state of the suspension member based on the determined electrical characteristic and assuming a currently expected deterioration state based on the counted number of bending cycles and comparing the current actual deterioration state with the currently expected deterioration state.

For example, the determination device may be configured for determining a critical deterioration state of the suspension member upon each of:
- an information indicating that the counted number of bending cycles applied to the suspension member as counted by the counter device exceeds an allowable maximum number, and
- an information indicating that the measured electrical characteristics of the suspension member as measured by the electrical measuring device deviates from a reference characteristics by more than an allowable maximum deviation.

In other words, the deterioration state of a suspension member in an elevator may be continuously or repeatedly monitored using a specific monitoring device. This device is, on the one hand, adapted for counting a number of bending cycles applied to the suspension member. Such counting may be performed using a specific counter device. On the other hand, the device is adapted for measuring electrical characteristics of the suspension member. The device may then, using for example its determination device, decide on whether or not a critical or unexpected deterioration state of the suspension member is actually present.

Such decision may be based for example on each of the information indicating that the number of counted bending cycles exceeds an allowable maximum number and the information indicating that the measured electrical characteristics of the suspension member deviates from reference characteristics by more than an allowable maximum deviation.

Alternatively, the determination device may for example verify whether an expected deterioration state of the suspension member which is assumed taking into account mainly the operational age of the suspension member (i.e. the number of bending cycles applied thereto) and the actual deterioration state of the suspension member as derived from its determined electrical characteristics correctly correspond to each other or not.

Each of the counter device, the electrical measuring device and the determination device may be connected to an elevator control controlling operation of the elevator and may receive data or information from such elevator control or may transmit its own data or information to the elevator control. Such data exchange connection may be established such using hardwiring or may be wireless.

Accordingly, for example the counter device may receive data or information from the elevator control relating to trips performed in the elevator such that the counter device may derive its required information for counting the number of bending cycles applied to the suspension member from such elevator control information. Similarly, the electrical measuring device may be connected to the elevator control such that it may for example take into account information or data from the elevator control when performing its own electrical measurements. The determination device may also be connected to the elevator control such that, for example, when a critical deterioration state of the suspension member is detected, such information may be transmitted to the elevator control such that the elevator control may then for example stop operation of the elevator, limit operation of the elevator, output an alarm or other information to users or operators of the elevator and/or initiate any other suitable countermeasures.

According to a third aspect of the present invention of concept 5, an elevator is proposed. The elevator comprises the device according to an embodiment of the above described second aspect of the invention of concept 5.

It shall be noted that possible features and advantages of embodiments of the invention are described herein partly with respect to a method for determining a deterioration state in a suspension member arrangement and partly with respect to a monitoring arrangement which is adapted for performing or controlling such method in an elevator. Some features are also described with reference to an elevator comprising such monitoring arrangement. One skilled in the art will recognize that the features may be suitably transferred from one embodiment to another, i.e. from the method to the device or vice versa, and features may be modified, adapted, combined and/or replaced, etc. in order to come to further embodiments of the invention.

In the following, advantageous embodiments of the invention of concept 5 will be described with reference to the enclosed drawings of concept 5. However, neither the drawings nor the description shall be interpreted as limiting the invention.

DESCRIPTION OF THE DRAWINGS

Figure 32:
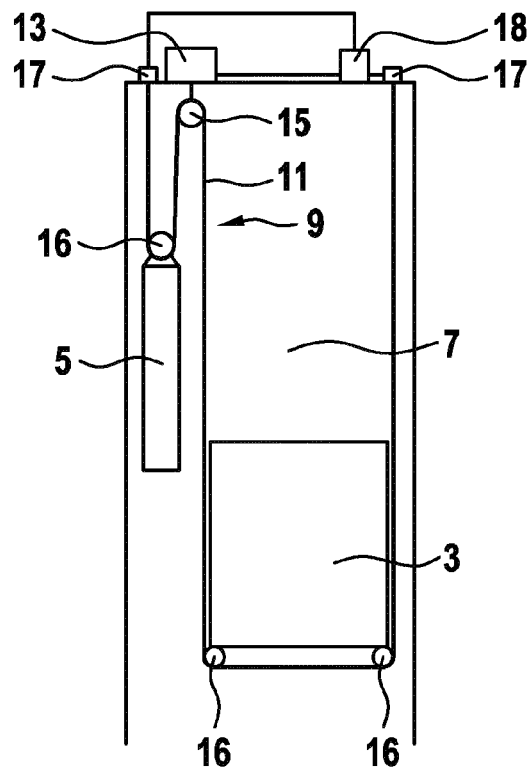

FIG. 32 shows an elevator in which a method according to an embodiment of the invention may be applied.

Figure 33:
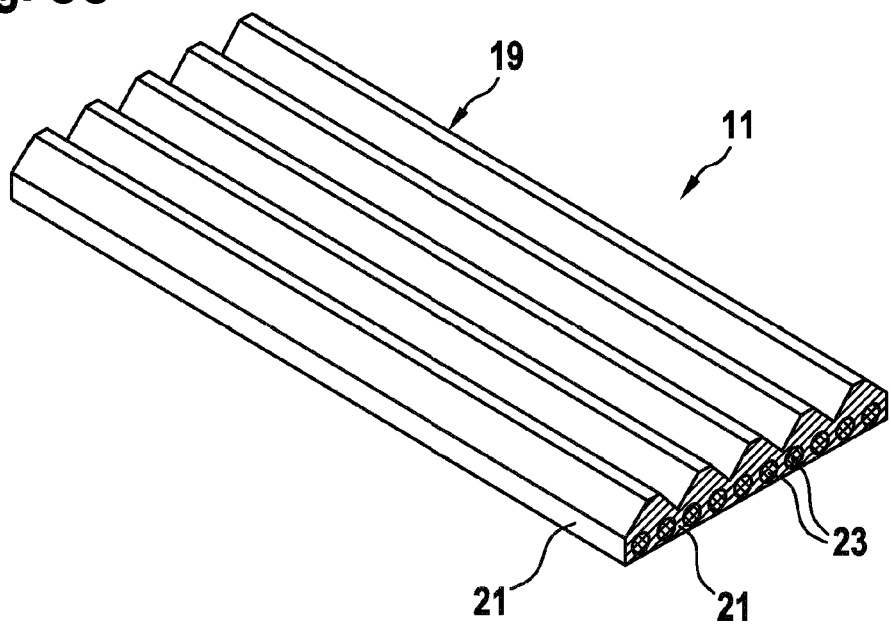

FIG. 33 shows an exemplary suspension member.

Figure 34:
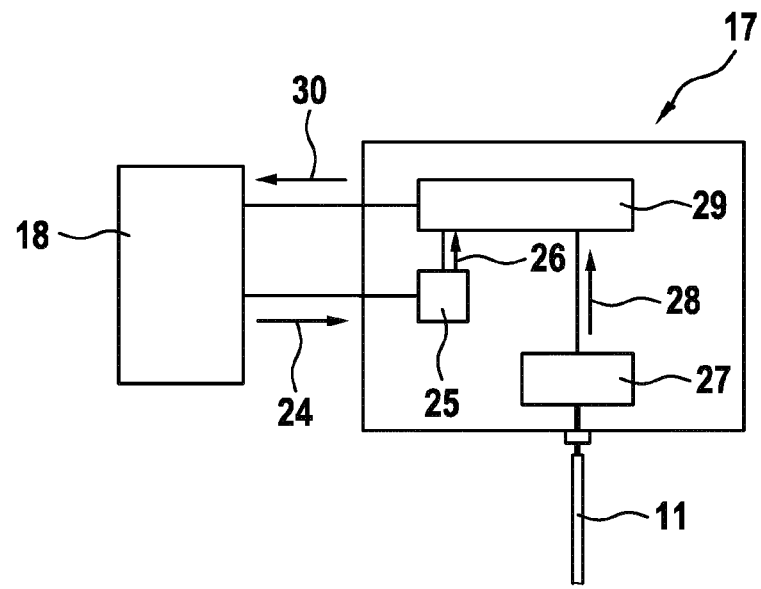

FIG. 34 shows an exemplary embodiment of a monitoring arrangement according to an embodiment of the present invention.

Figure 35:
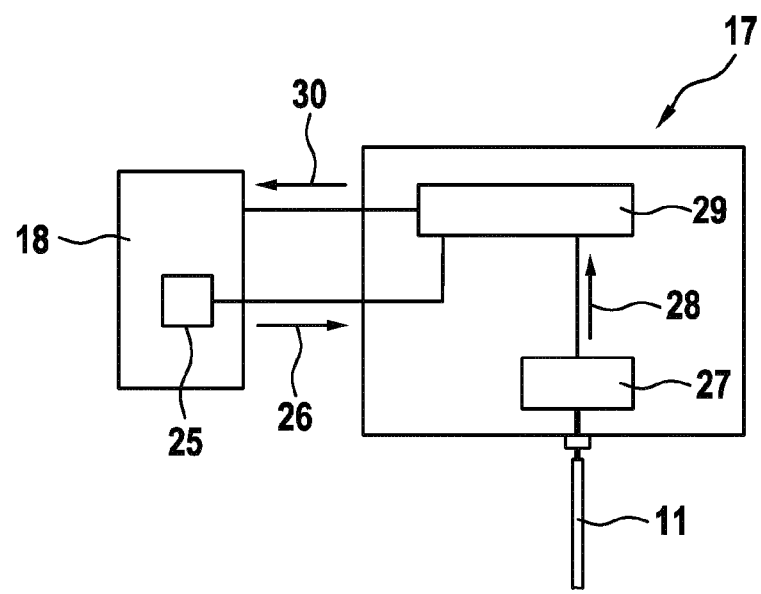

FIG. 35 shows an alternative exemplary embodiment of a monitoring arrangement according to an embodiment of the present invention.

Figure 36:
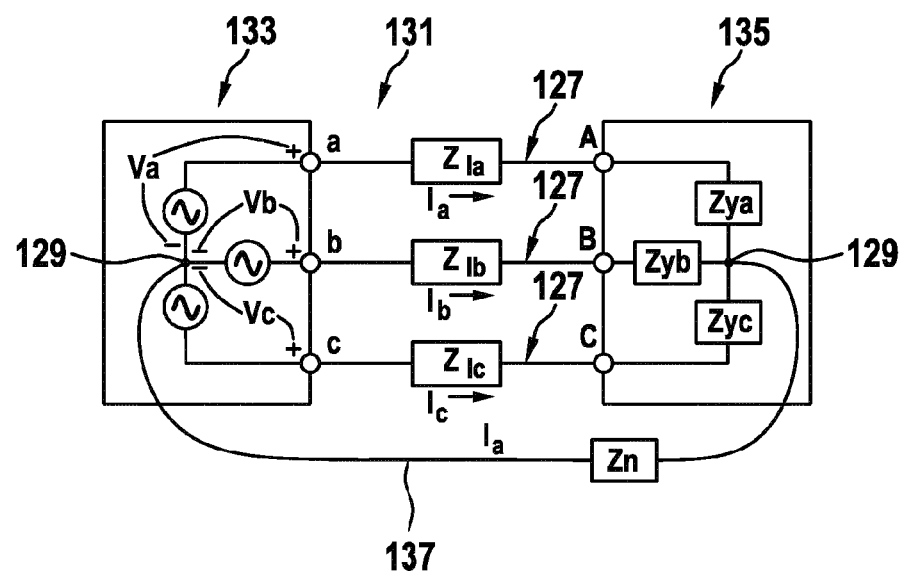

FIG. 36 shows an example of an electrical measuring device for measuring electrical characteristics in a suspension member for a monitoring arrangement according to an embodiment of the present invention.

Figure 37:
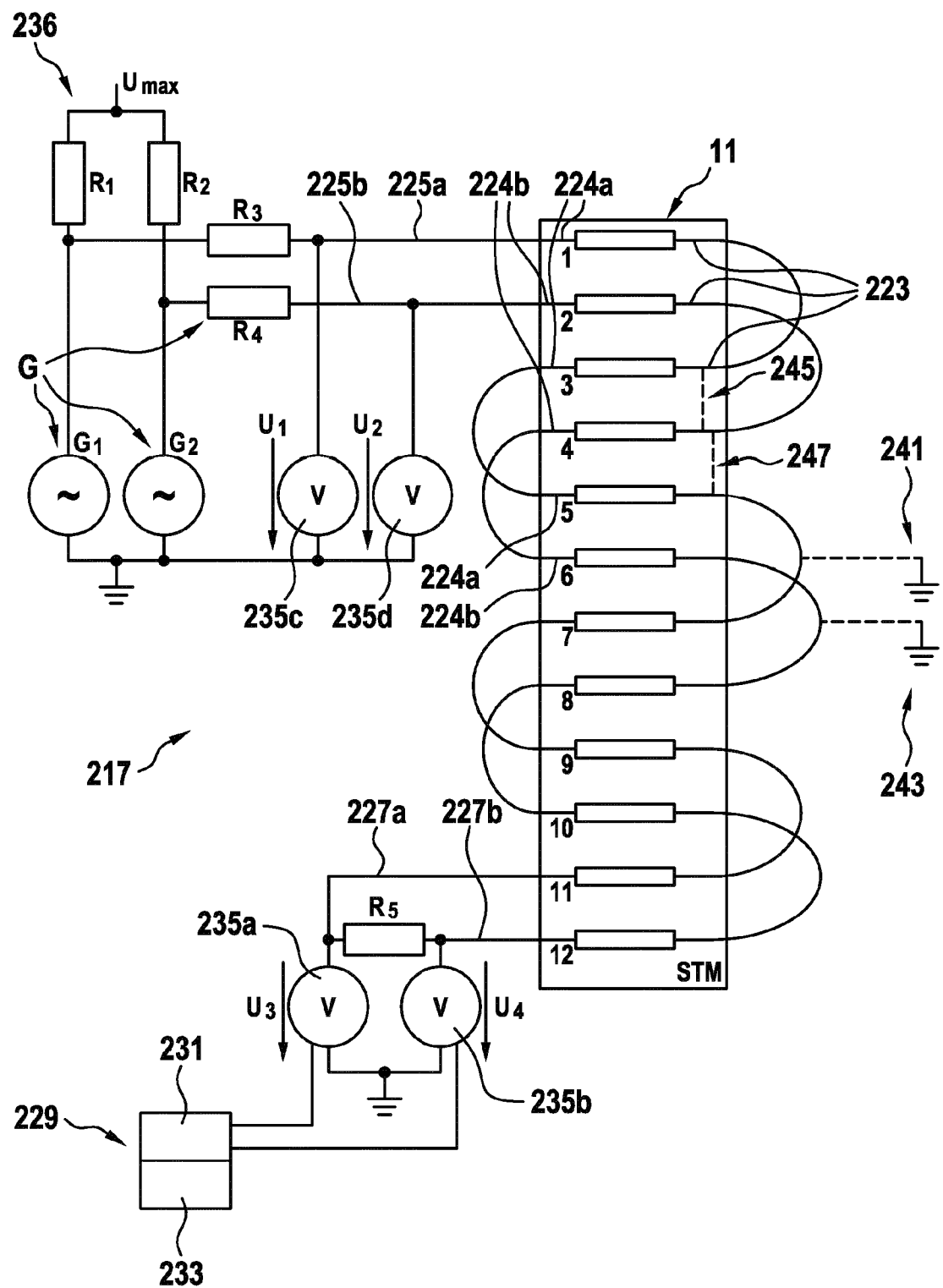

FIG. 37 shows another example of an electrical measuring device for measuring electrical characteristics in a suspension member for a monitoring arrangement according to an embodiment of the present invention.

Figure 38:
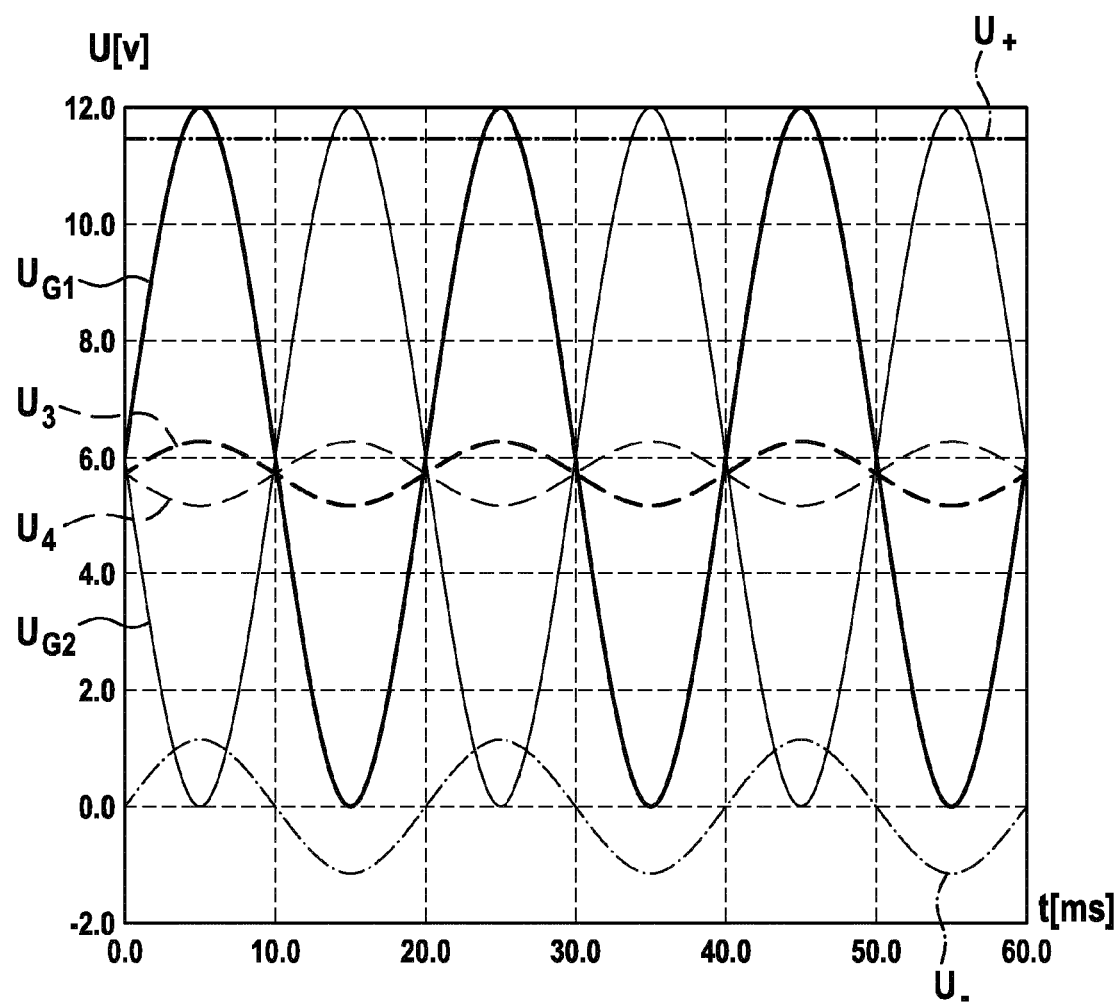

FIG. 38 visualizes electrical parameters to be induced or measured during measuring electrical characteristics of a suspension member with an electrical measuring device as shown in FIG. 37.

The figures are only schematic representations and are not to scale. Same reference signs refer to same or similar features throughout the figures.

DETAILED DESCRIPTION

FIG. 32 shows an elevator 1 in which a method according to embodiments of the present invention may be implemented.

The elevator 1 comprises a cabin 3 and a counterweight 5 which may be displaced vertically within an elevator shaft 7. The cabin 3 and the counterweight 5 are suspended by a suspension member arrangement 9. This suspension member arrangement 9 comprises one or more suspension members 11, sometimes also referred to a suspension traction media (STM). Such suspension members 11 may be for example ropes, belts, etc. In the arrangement shown in FIG. 32, end portions of the suspension members 11 are fixed to a supporting structure of the elevator 1 at a top of the elevator shaft 7. The suspension members 11 may be displaced using an elevator traction machine 13 driving a traction sheave 15. The cabin 3 and the counterweight 5 may be held by the suspension members 11 by winding the suspension members 11 around pulleys 16. An operation of the elevator traction machine 13 may be controlled by a control device 18. For example at opposite end portions of the suspension member arrangement 9 components of a monitoring device 17 for determining a deterioration state in the suspension member arrangement 9 may be provided.

It may be noted that the elevator 1 and particularly its suspension member(s) 11 and its monitoring device 17 for determining the deterioration may be configured and arranged in various other ways than those shown in FIG. 32.

The suspension members 11 to be driven for example by the traction machine 13 may utilize metal cords or ropes to support a suspended load such as the cabin 3 and/or the counterweight 5 that is moved by the traction machine 13.

FIG. 33 shows an example of a suspension member 11 which is embodied with a belt 19. The belt 19 comprises a plurality of cords 23 which are arranged parallel to and spaced from each other. The cords 23 are enclosed in a matrix material 21 forming, inter alia, a coating or jacket. Such coating may mechanically couple neighbouring cords 23. The coating may have a textured or profiled surface including longitudinal guiding grooves. The cords 23 may typically consist of or comprise wires made from a metal such as steel. The matrix material 21 may consist of or comprises a plastic or elastomeric material. Accordingly, the cords 23 are typically electrically conductive such that an electric voltage may be applied to and/or an electric current may be fed through the cords without significant losses. Furthermore, the cords 23 are preferably electrically isolated from each other via the interposed electrically insulating matrix material 21 such that, as long as an integrity of the coating is not deteriorated, an electrical current or voltage between neighbouring cords cannot be transmitted, i.e. no significant shunt current can flow from one cord 23 to another.

FIGS. 34 and 35 show an exemplary embodiment of a monitoring arrangement including a control device 18 and a monitoring device 17 for determining the deterioration state in the suspension member 11 of the elevator 1. The monitoring arrangement (17+18) comprises a counter device 25, an electrical measuring device 27 and a determination device 29. These devices 25, 27, 29 may be implemented as separate units. Alternatively, these devices 25, 27, 29 may be integrated into one single unit. Also, the control device 18 and the monitoring device 17 may be embodied as separate devices, or may me embodied as a single device, e.g. all incorporated in an elevator control unit for controlling the overall functionality or operation of the elevator. In one embodiment, the control device 18 may be substantially identical to the elevator control unit, while in others, the control device 18 may be a part or subsystem of the elevator control unit. In further embodiments, the control device 18 may be separate from the elevator control unit. The individual parts may be distributed between the control device 18 and the monitoring device 17. Devices 25-29 may be embodied as distinct devices or units in hardware, while an embodiment as a computer program, thus as software within a computing unit, e.g. of an elevator control unit or within the control device 18 or the monitoring device 17 may be conceivable as well.

E.g. in FIG. 34, substantially all of the above indicated devices 25-29 are, at least logically, associated with the monitoring device 17. In FIG. 35, e.g. the counter device 25 may be, at least logically associated with the control device 18. Further, also the determination device 29.

In the exemplary embodiment of FIG. 3, the counter device 25 is connected to the elevator control device 18 such as to receive data or information from the control device 18 as visualised with the arrow 24. Such data or information may indicate for example whether or not the elevator is currently operated, i.e. whether or not the elevator traction machine 13 currently displaces the suspension member 11. Furthermore, the control device 18 may provide data or information correlating to a current position of the cabin 3 and/or the counterweight 5. Upon receiving such information, the counter device 25 may derive information allowing counting a number of bending cycles applied to the suspension member 11. For example, each time the suspension member 11 is displaced during a trip of the elevator 1 or each time a motion direction of the elevator is reversed, the number of bending cycles applied to the suspension member 11 is incremented. In other words, one alternative to increment the number of bending cycles may be embodied as a trip counter, even if successive trips are in the same direction of elevator/cabin motion, while another alternative is to only count, thus increment a bending cycle counter, if the direction of motion changes. This may be applied when counting bending cycles for the whole suspension member 11 or also during the sectional approach.

Preferably, the counter device 25 does not simply act like a trip counter. To the contrary, by for example taking into account the provided information about the current position of the cabin 3 and the counterweight 5, additional information may be derived indicating locations at which the suspension member 11 is currently being bent. Accordingly, the counter device 25 may be enabled to not simply count bending cycles for the suspension member 11 in its entirety but, instead, may count section bending cycles applied to each section of a multiplicity of sections forming the entire suspension member 11. For example, one section of the suspension member may correspond to a portion of the suspension member extending between two neighbouring floors of a building. Principles, further details and possible advantages of such preferred counter device 25 and the method for counting bending cycles performed thereby are disclosed in the applicant's earlier patent applications WO 2010/007112 A1 and EP 2 303 749 B1 which shall be incorporated herein in their entirety by reference.

The counted number of bending cycles applied to the suspension member 11 is provided from the counter device 25 to the determination device 29, as indicated with the arrow 26.

The electrical measuring device 27 is electrically connected to the suspension member 11. For example, the electrical measuring device 27 comprises a voltage source for generating an electric voltage V and applying such electric voltage V to one or several cords 23 of the suspension member 11. Preferably, the voltage source is adapted for generating two or more phases of an alternating voltage, these phases being shifted relative to each other and each phase being applied to one or a group of cords 23 or, alternatively, to a separate resistor. As further detailed below, the electrical measuring device 27 may measure electrical characteristics of the suspension member by applying the electrical voltage to at least one of the cords 23 and by then monitoring electrical parameters in the cords 23.

The electrical measuring device 27 may then provide the information about the electrical characteristics of the suspension member 11 to the determination device 29 as indicated with the arrow 28.

The determination device 29 may use the information/data from the counter device 25 and the electrical measuring device 27 for determining whether a critical deterioration state is present in the suspension member 11.

The presence of such critical deterioration state is assumed in case the counted number of bending cycles provided by the counter device 25 exceeds an allowable maximum number. For example, such allowable maximum number of bending cycles may be predetermined as a result of experiments performed with an exemplary non-deteriorated suspension member under normal operation conditions. In such experiments, it is repeatedly tested after having bent the suspension member multiple times whether or not the suspension member still has a sufficient load bearing capacity of more than 60% or more than 80% of its initial value. Typically, an allowable maximum number of bending cycles is determined from such experiments to be in a range of 15 million to 20 million bending cycles but may also be higher or lower, dependent e.g. from specific operating conditions and/or characteristics of a specific type of suspension member 11. Accordingly, at the latest after such allowable maximum number of bending cycles has been counted for the present suspension member 11, the determination device 29 will assume that the repeated bendings will have deteriorated the suspension member 11 to a degree such that a critical deterioration state has been reached and, typically, the suspension member 11 should be replaced.

As a second decisive parameter, the determination device 29 takes into account the electrical characteristics measured and provided by the electrical measuring device 27. As long as these electrical characteristics do not deviate excessively from reference characteristics, it is assumed that the suspension member 11 is operated under normal operation conditions, i.e. not for example damaged or corroded beyond a normal state. As long as this is true, the determination device 29 will base its decision whether or not the suspension member 11 can be further operated only on the determination of whether or not the suspension member 11 has been bent more than the allowable number of bending cycles. However, as soon as this is not true, i.e. electrical characteristics are measured in the suspension member 11 which deviate from the reference characteristics by more than the allowable maximum deviation, it may be assumed that significant deterioration or damage occurred to the suspension member 11 which cannot only be attributed to repeated bendings thereof. Based on the specific type of deviation from the reference characteristics, the determination device 29 may then decide whether this deviation indicates a critical deterioration state upon which operation of the elevator 1 should be directly stopped or whether other countermeasures should be initiated.

FIG. 35 shows an alternative embodiment of a monitoring arrangement 17 for determining the deterioration state in the suspension member 11 of the elevator 1. Therein, while still forming part of the monitoring arrangement 17, the counter 25 is no more included in a same housing as the determination device 29 and the electrical measuring device 27 but forms part of the elevator control device 18. Typically, in such control device 18, a number of elevator trips or a number of motion reversals upon such trips is counted and such information may be provided to the determination device 29 as indicated with the arrow 26.

Further e.g., the control device 18 may equal the elevator control unit. Such elevator control unit may (already) comprise a counter device 25 for counting trips, bending cycles and/or sectional bending cycles. Here, monitoring device 17 may only provide a signal/information as indicated with the arrow 30 to the elevator control being indicative of the determined electrical characteristic as such or being indicative of a current actual deterioration state of the suspension member. Said information may be provided to the control device 18/the elevator control unit, which in turn evaluates the signal/information, respectively, and conducts the method of the invention within the control device 18/the elevator control unit. As such, it is also feasible that the determination unit 29 is, at least logically, associated with/arranged within the control device 18/the elevator control unit. The determination unit 29 may even be a computing part within the control device 18/the elevator control unit, e.g. being embodied in the control program of the control device 18/the elevator control unit. In such an embodiment, the signal/information as indicated with the arrow 26 may not be present at all or may be a simple indication to the monitoring device 17 that a determination of an electrical characteristic shall be performed.

In FIGS. 36 and 37, possible principles and features to be implemented in examples of an electrical measuring device 27 are shown. The principles and features shown in FIG. 36 are described in detail further above with respect to concept 1. The principles and features shown in FIG. 37 are described in detail further above with respect to concepts 2 and 3. The figures correspond to figures of these concepts 1, 2 and 3 but reference signs have been modified by adding an antecedent "1" in FIG. 36 (i.e. "31" becomes "131") and adding an antecedent "2" in FIG. 37, respectively.

Finally, it should be noted that terms such as "comprising" do not exclude other elements or steps and that terms such as "a" or "an" do not exclude a plurality. Also elements described in association with different embodiments may be combined. It should also be noted that reference signs in the claims should not be construed as limiting the scope of the claims.

LIST OF REFERENCE SIGNS

1 elevator
2 cabin
5 counter-weight
7 elevator shaft
9 suspension member arrangement
11 suspension member
13 traction machine
15 traction sheave
16 pulleys
17 device for determining deterioration
18 elevator control
19 belt
21 matrix material
23 cords
24 information flow to counter device
25 counter device
26 information flow to determination device
27 electrical measuring device
28 information flow to determination device
29 determination device
30 information flow to elevator control
127 leg
129 common point
131 multi-phase alternating current circuitry
133 source side
135 load side
137 neutral wire
a, b, c lines of legs
Ya, Yb, Yc alternative voltages
$I_a$, $I_b$, $I_c$ alternating currents
Zya, Zyb, Zyc resistances in legs
$I_n$ bypass current
Zn resistance in neutral wire
223 cords
224a first group of cords 224b second group of cords
225a first end of first group of cords
225b first end second group of cords
227a second end of first group of cords
227b second end second group of cords
229 determination unit
231 first voltage measurement arrangement
233 second voltage measurement arrangement
235a first voltage determining unit
235b second voltage determining unit
235c third voltage determining unit
235d fourth voltage determining unit
236 pull-up voltage source
237a first AC voltage determining unit
237b first DC voltage determining unit
237c second voltage determining unit
238 centre point
239a,b capacitors
241 faulty first connection to ground
243 faulty second connection to ground
245 symmetrical short
247 asymmetrical short Approaches defining features of the concept 5 may be defined as follows:

1. A method for determining a deterioration state in a suspension member arrangement (9) for an elevator (1), the suspension member arrangement (9) comprising at least one suspension member (11) comprising a plurality of electrically conductive cords (23), the method comprising:
    counting a number of bending cycles applied to the suspension member (11);
    determining an electrical characteristic of the suspension member (11);
    performing at least one of
    (a) determining a critical deterioration state upon monitoring both:
    the counted number of bending cycles applied to the suspension member (11), and
    the determined electrical characteristic of the suspension member (11);
    and
    (b) determining an unexpected deterioration state based on deriving a current actual deterioration state of the suspension member based on the determined electrical characteristic and assuming a currently expected deterioration state based on the counted number of bending cycles and comparing the current actual deterioration state with the currently expected deterioration state; and
    initiating a defined procedure upon the determining at least one of the critical deterioration state and the unexpected deterioration state.

2. The method of approach 1, wherein, in option (a), the critical deterioration state is determined upon occurring of at least one of:
    the counted number of bending cycles applied to the suspension member (11) exceeding an allowable maximum number, and
    the determined electrical characteristic of the suspension member (11) deviating from a reference characteristic by more than an allowable maximum deviation.

3. The method of approach 2, wherein the allowable maximum deviation is at least one of
    determined taking into account the counted number of bending cycles applied to the suspension member (11), and
    fixedly predetermined.

4. The method of one approaches 2 and 3, wherein the allowable maximum number is at least one of
    determined taking into account the determined electrical characteristic of the suspension member (11), and
    fixedly predetermined.

5. The method of one of the preceding approaches, wherein the reference characteristic is determined based upon measuring electrical characteristic of the suspension member (11) in a non-deteriorated condition.

6. The method of one of the preceding approaches, wherein the suspension member is subdivided into several sections and wherein a number of section bending cycles applied to each section of the suspension member (11) is counted for each of the sections and wherein the number of bending cycles applied to the suspension member (11) is set to correspond to the maximum of all numbers of section bending cycles counted for each of the sections of the suspension member (11).

7. The method of one of the preceding approaches, wherein the determining of the electrical characteristic of the suspension member (11) comprises at least one of:
    electrical measurements indicating that at least one cord (23) in the suspension member (11) is broken;
    electrical measurements indicating that an electrical connection between a voltage supply for applying the electrical voltage to the at least one of the cords (23) and the at least one of the cords is interrupted;
    electrical measurements indicating that at least one cord (23) in the suspension member (11) is electrically connected to ground;
    electrical measurements indicating that at least two cords (23) in the suspension member (11) are shorted;
    electrical measurements indicating that an electrical conductivity through at least one of the cords (23) of the suspension member (11) changed over time.

8. The method of one of the preceding approaches, wherein the determining of the electrical characteristic comprises at least one of
    determining an electrical resistivity through the suspension member,
    determining an electrical conductivity through the suspension member,
    determining an inductivity through the suspension member,
    determining the electrical characteristic using magnetic measurements applied to the suspension member, and
    determining the electrical characteristic using phase measurements applied to the suspension member.

9. The method of one of the preceding approaches, wherein, upon determining the electrical characteristic, an electric indicator current ($I_n$) correlating to a net sum of all phases of a multi-phase alternating current is measured, wherein at least one of the phases of the multi-phase alternating current is applied to one of the cords (23) of the suspension member (11).

10. The method of one of the preceding approaches, wherein the measuring of the electrical characteristic of the suspension member (11) comprises:
    providing a multi-phase alternating current circuitry (131) including multiple electrically conductive legs (127);
    applying at least one phase of a multi-phase alternating current to at least one of the cords (23) of the suspension member (11) by being electrically connected to one of the legs (127) of the multi-phase alternating current circuitry (131);
    applying at least one other phase of the multi-phase alternating current to at least one of another at least one cord (23) of the suspension member (11) and at least one separate resistor being electrically connected to at least one other leg (127) of the multi-phase alternating current circuitry (131), wherein a peak current in each phase is shifted by a phase angle with respect to a peak current in another phase;
measuring an electric indicator current ($I_n$) being at least one of:
a net sum of all phases of the multi-phase alternating current and
an electric bypass current through a neutral wire (137) being connected in parallel to the multi-phase alternating current circuitry (131);
determining the measured electrical characteristic of the suspension member (11) based on the measured indicator electric current.

11. The method according to one of approaches 9 and 10, wherein the indicator current ($I_n$) is measured using a measuring arrangement comprising a measuring device for contactless measuring of an electrical current in a conductor arrangement, the measuring device being for example one of a current transformer and a Hall effect current sensor.

12. The method of one of the preceding approaches, wherein the suspension member (11) has a first and a second group (124a, 124b) of electrically conductive cords (23); wherein the measuring of the electrical characteristic comprises:
applying a first alternating voltage $U_1$ to a first end (125a) of the first group of cords of the suspension member;
applying a second alternating voltage $U_2$ to a first end (125b) of the second group of cords of the suspension member;
wherein the first and second alternating voltages have same waveforms and a phase difference of 180°;
wherein, preferably, the second end of the first group of cords and the second end of the second group of cords are electrically connected via a connecting electrical resistance ($R_5$);
determining at least one of
(i) a summed voltage $U_+$ correlating to a sum ($U_3+U_4$) of a third voltage $U_3$ between a second end (127a) of the first group of cords and a common electrical potential and a fourth voltage $U_4$ between a second end (127b) of the second group of cords and the common electrical potential;
(ii) a differential voltage $U_-$ correlating to a difference ($U_3-U_4$) between the third voltage $U_3$ and the fourth voltage $U_4$;
determining the electrical characteristic of the suspension member (11) based on at least one of the summed voltage $U_+$ and the differential voltage $U_-$, preferably based on both the summed voltage $U_+$ and the differential voltage $U_-$,
wherein, preferably, any deviation from a state in which the summed voltage $U_+$ comprises no alternating voltage component $U_{+,AC}$ and the differential voltage $U_-$ comprises a alternating voltage component $U_{-,AC}$ is interpreted as indicating an electrical characteristic relating to a critical deterioration state in the suspension member.

13. A monitoring arrangement (17) for determining a deterioration state in a suspension member arrangement (9) for an elevator (1), the suspension member arrangement (9) comprising at least one suspension member (11) comprising a plurality of electrically conductive cords (23), wherein the monitoring arrangement is configured to perform the method according to one of the preceding approaches.

14. The monitoring arrangement according to approach 13, comprising:
a counter device (25) which is configured for counting a number of bending cycles applied to the suspension member (11) based on information obtained from an elevator control device (18) for controlling operation of the elevator (1);
an electrical measuring device (27) which is electrically connected to at least one of the cords (23) in the suspension member (11) and which is configured for measuring the electrical characteristic of the suspension member (11) upon applying an electrical voltage to the at least one of the cords (23);
a determination device (29) which is configured for determining at least one of (a) a critical deterioration state of the suspension member (23) upon monitoring both: the counted number of bending cycles applied to the suspension member (11), and
the determined electrical characteristic of the suspension member (11);
and
(b) an unexpected deterioration state of the suspension member (23) based on deriving a current actual deterioration state of the suspension member based on the determined electrical characteristic and assuming a currently expected deterioration state based on the counted number of bending cycles and comparing the current actual deterioration state with the currently expected deterioration state.

15. An elevator (1) comprising a monitoring arrangement (17) according to one of approach 13 and 14.

The invention claimed is:

1. A method for detecting a deterioration state of a load bearing capacity in a suspension member arrangement for an elevator, the suspension member arrangement comprising at least one suspension member having a first group and a second group of electrically conductive cords, the method comprising the steps of:
applying a first alternating voltage to a first end of the first group of cords;
applying a second alternating voltage to a first end of the second group of cords, wherein the first and second alternating voltages have same waveforms and a phase difference of 180°;
determining at least one of (i) a summed voltage correlating to a sum of a third voltage between a second end of the first group of cords and a common electrical potential and a fourth voltage between a second end of the second group of cords and the common electrical potential, and (ii) a differential voltage correlating to a difference between the third voltage and the fourth voltage; and
determining the deterioration state of a load bearing capacity in a suspension member based on at least one of the summed voltage and the differential voltage.

2. The method according to claim 1 wherein the second end of the first group of cords and the second end of the second group of cords are electrically connected via a connecting electrical resistance.

3. The method according to claim 1 wherein any deviation from a state in which the summed voltage has no alternating voltage component and the differential voltage has an alternating voltage component is interpreted as indicating a deterioration in the suspension member arrangement.

4. The method according to claim 1 wherein a state in which the summed voltage has an alternating voltage component and the differential voltage has no alternating voltage component is interpreted as indicating that at least one of the cords in one of the groups of cords is interrupted and none of the cords in another of the groups of cords is interrupted.

5. The method according to claim 1 wherein a state in which the summed voltage has no alternating voltage component and the differential voltage has no alternating voltage component is interpreted as indicating at least one of deterioration states of:
- at least one of the cords in one of the groups of cords is interrupted and at least one of the cords in another of the groups of cords is interrupted; and
- the voltages of the first alternating voltage and of the second alternating voltage are both interrupted.

6. The method according to claim 1 wherein a state in which the summed voltage has an alternating voltage component and the differential voltage has an alternating voltage component is interpreted as indicating an electrical connection to ground of at least one of the cords in the suspension member.

7. The method according to claim 1 wherein a state in which the summed voltage has no alternating voltage component and includes a direct voltage component and the differential voltage has no alternating voltage component is interpreted as indicating that one of the cords in one of the groups of cords is short circuited with a cord in another of the groups of cords in a symmetrical manner.

8. The method according to claim 1 wherein a state in which the summed voltage has an alternating voltage component and a direct voltage component and the differential voltage has no alternating voltage component is interpreted as indicating that one of the cords in one of the groups of cords is short circuited with a cord in another of the groups of cords in an asymmetrical manner.

9. The method according to claim 1 including determining a position where a state of at least one of a connection to ground of one of the cords and a state of a short circuit between cords of the groups of cords is present based on a point in time when the respective state is determined.

10. The method according to claim 1 wherein initial values of the summed voltage and the differential voltage are determined and stored in an initial state of the elevator and wherein subsequent values of the summed voltage and the differential voltage are determined in a subsequent state of the elevator and wherein the deterioration state of the suspension member is determined during the subsequent state based on a comparison of the initial values of the summed voltage and the differential voltage with the subsequent values of the summed voltage and the differential voltage, respectively.

11. A device for detecting a deterioration state of a load bearing capacity in a suspension member arrangement for an elevator, the suspension member arrangement having at least one suspension member having a first group and a second group of electrically conductive cords, the device comprising:
- an alternating voltage generator arrangement for applying a first alternating voltage to a first end of the first group of cords for applying a second alternating voltage to a first end of the second group of cords, wherein the alternating voltage generator arrangement is configured to generating the first and second alternating voltages with same waveforms and a phase difference of 180°;
- at least one of (i) a first voltage measurement arrangement for determining a summed voltage correlating to a sum of a third voltage between a second end of the first group of cords and a common electrical potential and a fourth voltage between a second end of the second group of cords and the common electrical potential, and (ii) a second voltage measurement arrangement for determining a differential voltage correlating to a difference between the third voltage and the fourth voltage; and
- a determination unit for determining the deterioration state of a load bearing capacity in a suspension member based on at least one of the summed voltage and the differential voltage.

12. The device according to claim 11 wherein the determination unit is adapted to determine a deterioration in the suspension member arrangement based on any deviation from a state in which the summed voltage has no alternating voltage component and the differential voltage has a non-zero alternating voltage component.

13. The device according to claim 11 wherein at least one of the first voltage measurement arrangement and the second voltage measurement arrangement includes a transformation unit for transforming a voltage measurement from a time domain to a frequency domain.

14. The device according to claim 11 including a third voltage measurement arrangement for measuring the first alternating voltage and a fourth voltage measurement arrangement for measuring the second alternating voltage.

* * * * *